(12) United States Patent
Yamazaki et al.

(10) Patent No.: US 8,377,764 B2
(45) Date of Patent: Feb. 19, 2013

(54) MANUFACTURING METHOD FOR LIGHT EMITTING DEVICE

(75) Inventors: Shunpei Yamazaki, Tokyo (JP); Hideaki Kuwabara, Kanagawa (JP); Masakazu Murakami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/459,122

(22) Filed: Apr. 28, 2012

(65) Prior Publication Data

US 2012/0214263 A1 Aug. 23, 2012

Related U.S. Application Data

(60) Continuation of application No. 13/108,128, filed on May 16, 2011, now Pat. No. 8,168,483, which is a continuation of application No. 11/876,968, filed on Oct. 23, 2007, now Pat. No. 7,943,443, which is a division of application No. 10/664,642, filed on Sep. 19, 2003, now abandoned.

(30) Foreign Application Priority Data

Sep. 20, 2002 (JP) ................................. 2002-276216

(51) Int. Cl.
*H01L 21/84* (2006.01)
(52) U.S. Cl. ................. 438/155; 257/E21.411
(58) Field of Classification Search .................. 438/155; 257/E21.411
See application file for complete search history.

(56) References Cited

U.S. PATENT DOCUMENTS

| | | | |
|---|---|---|---|
| 2,351,536 | A | 6/1944 | Osterberg et al. |
| 2,435,997 | A | 2/1948 | Bennett |
| 3,312,190 | A | 4/1967 | Bradshaw |
| 3,543,717 | A | 12/1970 | Adachi |
| 3,636,305 | A | 1/1972 | Passmore |

(Continued)

FOREIGN PATENT DOCUMENTS

| | | |
|---|---|---|
| DE | 28 34 806 A1 | 2/1980 |
| DE | 44 22 697 C1 | 1/1996 |

(Continued)

OTHER PUBLICATIONS

Tang, C.W. et al, "Organic Electroluminescent Diodes," Appl. Phys. Lett., vol. 51, No. 12, Sep. 21, 1987, pp. 913-915.

(Continued)

*Primary Examiner* — Steven J Fulk
(74) *Attorney, Agent, or Firm* — Husch Blackwell LLP

(57) ABSTRACT

The present invention provides a vapor deposition method and a vapor deposition system of film formation systems by which EL materials can be used more efficiently and EL materials having superior uniformity with high throughput rate are formed. According to the present invention, inside a film formation chamber, an evaporation source holder in a rectangular shape in which a plurality of containers sealing evaporation material is moved at a certain pitch to a substrate and the evaporation material is vapor deposited on the substrate. Further, a longitudinal direction of an evaporation source holder in a rectangular shape may be oblique to one side of a substrate, while the evaporation source holder is being moved. Furthermore, it is preferable that a movement direction of an evaporation source holder during vapor deposition be different from a scanning direction of a laser beam while a TFT is formed.

15 Claims, 22 Drawing Sheets

U.S. PATENT DOCUMENTS

| | | |
|---|---|---|
| 3,756,193 A | 9/1973 | Carmichael et al. |
| 3,931,490 A | 1/1976 | Grothe et al. |
| 3,931,789 A | 1/1976 | Kakei et al. |
| 3,971,334 A | 7/1976 | Pundsack |
| 4,023,523 A | 5/1977 | Ing |
| 4,187,801 A | 2/1980 | Monk |
| 4,225,805 A | 9/1980 | Smithgall et al. |
| 4,233,937 A | 11/1980 | Steube |
| 4,405,487 A | 9/1983 | Harrah et al. |
| 4,446,357 A | 5/1984 | Barshter |
| 4,543,467 A | 9/1985 | Eisele et al. |
| 4,592,306 A | 6/1986 | Gallego |
| 4,602,192 A | 7/1986 | Nomura et al. |
| 4,627,989 A | 12/1986 | Feuerstein et al. |
| 4,672,265 A | 6/1987 | Eguchi et al. |
| 4,769,292 A | 9/1988 | Tang et al. |
| 4,885,211 A | 12/1989 | Tang et al. |
| 4,897,290 A | 1/1990 | Terasaka et al. |
| 4,951,601 A | 8/1990 | Maydan et al. |
| 5,190,590 A | 3/1993 | Suzuki et al. |
| 5,258,325 A | 11/1993 | Spitzer et al. |
| 5,259,881 A | 11/1993 | Edwards et al. |
| 5,310,410 A | 5/1994 | Begin et al. |
| 5,429,884 A | 7/1995 | Namiki et al. |
| 5,512,320 A | 4/1996 | Turner et al. |
| 5,534,314 A | 7/1996 | Wadley et al. |
| 5,550,066 A | 8/1996 | Tang et al. |
| 5,643,685 A | 7/1997 | Torikoshi |
| 5,670,792 A | 9/1997 | Utsugi et al. |
| 5,701,055 A | 12/1997 | Nagayama et al. |
| 5,817,366 A | 10/1998 | Arai et al. |
| 5,844,363 A | 12/1998 | Gu et al. |
| 5,902,688 A | 5/1999 | Antoniadis et al. |
| 5,904,961 A | 5/1999 | Tang et al. |
| 5,906,857 A | 5/1999 | McKee et al. |
| 5,921,836 A | 7/1999 | Nanto et al. |
| 5,935,395 A | 8/1999 | Ouellet et al. |
| 5,943,600 A | 8/1999 | Ngan et al. |
| 5,945,967 A | 8/1999 | Rallison et al. |
| 5,972,183 A | 10/1999 | Krueger et al. |
| 6,001,413 A | 12/1999 | Matsuura et al. |
| 6,011,904 A | 1/2000 | Mattord |
| 6,023,308 A | 2/2000 | Takemura |
| 6,049,167 A | 4/2000 | Onitsuka et al. |
| 6,124,215 A | 9/2000 | Zheng |
| 6,132,280 A | 10/2000 | Tanabe et al. |
| 6,132,805 A | 10/2000 | Moslehi |
| 6,149,392 A | 11/2000 | Conte |
| 6,179,923 B1 | 1/2001 | Yamamoto et al. |
| 6,237,529 B1 | 5/2001 | Spahn |
| 6,244,212 B1 | 6/2001 | Takacs et al. |
| 6,246,387 B1 | 6/2001 | Yamazaki |
| 6,280,861 B1 | 8/2001 | Hosokawa et al. |
| 6,294,892 B1 | 9/2001 | Utsugi et al. |
| 6,296,894 B1 | 10/2001 | Tanabe et al. |
| 6,299,746 B1 | 10/2001 | Conte et al. |
| 6,319,321 B1 | 11/2001 | Hiraga et al. |
| 6,326,726 B1 | 12/2001 | Mizutani et al. |
| 6,333,065 B1 | 12/2001 | Arai et al. |
| 6,337,105 B1 | 1/2002 | Kunieda et al. |
| 6,340,501 B1 | 1/2002 | Kamiyama et al. |
| 6,380,081 B1 | 4/2002 | Lee |
| 6,403,392 B1 | 6/2002 | Burrows et al. |
| 6,429,100 B2 | 8/2002 | Yoneda |
| 6,432,561 B1 | 8/2002 | Yamazaki |
| 6,469,439 B2 | 10/2002 | Himeshima et al. |
| 6,482,752 B1 | 11/2002 | Yamazaki et al. |
| 6,482,852 B2 | 11/2002 | Shakespeare et al. |
| 6,495,198 B2 | 12/2002 | Peng |
| 6,496,171 B2 | 12/2002 | Yamazaki |
| 6,528,108 B1 | 3/2003 | Kawamura |
| 6,537,607 B1 | 3/2003 | Swanson |
| 6,592,933 B2 | 7/2003 | Himeshima et al. |
| 6,633,121 B2 | 10/2003 | Eida et al. |
| 6,641,674 B2 | 11/2003 | Peng |
| 6,649,210 B2 | 11/2003 | Tokailin et al. |
| 6,660,332 B2 | 12/2003 | Kawase et al. |
| 6,660,409 B1 | 12/2003 | Komatsu et al. |
| 6,696,096 B2 | 2/2004 | Tsubaki et al. |
| 6,776,847 B2 | 8/2004 | Yamazaki et al. |
| 6,776,880 B1 | 8/2004 | Yamazaki |
| 6,827,622 B2 | 12/2004 | Yamada et al. |
| 6,830,626 B1 | 12/2004 | Smith |
| 6,893,709 B2 | 5/2005 | Kitazume |
| 2001/0006827 A1* | 7/2001 | Yamazaki et al. ............. 438/30 |
| 2001/0009154 A1 | 7/2001 | Nguyen et al. |
| 2001/0022272 A1 | 9/2001 | Plester et al. |
| 2001/0024185 A1 | 9/2001 | Yamazaki |
| 2001/0038367 A1 | 11/2001 | Inukai |
| 2002/0001888 A1 | 1/2002 | Yoneda |
| 2002/0009538 A1* | 1/2002 | Arai ............................... 427/66 |
| 2002/0011205 A1 | 1/2002 | Yamazaki et al. |
| 2002/0030443 A1 | 3/2002 | Konuma et al. |
| 2002/0067400 A1 | 6/2002 | Kawase et al. |
| 2002/0076847 A1 | 6/2002 | Yamada et al. |
| 2002/0081372 A1 | 6/2002 | Peng |
| 2002/0084032 A1 | 7/2002 | Jeng et al. |
| 2002/0155632 A1 | 10/2002 | Yamazaki et al. |
| 2002/0179013 A1* | 12/2002 | Kido et al. .................... 118/718 |
| 2002/0187265 A1 | 12/2002 | Mori et al. |
| 2002/0192499 A1 | 12/2002 | Tokailin et al. |
| 2002/0197418 A1 | 12/2002 | Mizukami et al. |
| 2002/0197760 A1 | 12/2002 | Yamazaki et al. |
| 2003/0015140 A1 | 1/2003 | Van Slyke et al. |
| 2003/0017259 A1 | 1/2003 | Yamada et al. |
| 2003/0024479 A1 | 2/2003 | Kashiwaya et al. |
| 2003/0101937 A1 | 6/2003 | Van Slyke et al. |
| 2003/0124764 A1 | 7/2003 | Yamazaki et al. |
| 2003/0162314 A1 | 8/2003 | Yamazaki et al. |
| 2003/0180457 A1 | 9/2003 | Murakami et al. |
| 2003/0194484 A1 | 10/2003 | Yamazaki et al. |
| 2003/0219530 A1 | 11/2003 | Yamazaki et al. |
| 2003/0221620 A1 | 12/2003 | Yamazaki |
| 2004/0031442 A1 | 2/2004 | Yamazaki et al. |
| 2004/0035360 A1 | 2/2004 | Yamazaki et al. |
| 2004/0035366 A1 | 2/2004 | Keum et al. |
| 2004/0040504 A1 | 3/2004 | Yamazaki et al. |
| 2004/0061118 A1 | 4/2004 | Yamazaki et al. |
| 2004/0096694 A1 | 5/2004 | Tokailin et al. |
| 2004/0139914 A1 | 7/2004 | Yamazaki et al. |
| 2004/0139984 A1 | 7/2004 | Yamazaki et al. |
| 2005/0005850 A1 | 1/2005 | Yamazaki |
| 2005/0106322 A1 | 5/2005 | Yamazaki et al. |

FOREIGN PATENT DOCUMENTS

| | | |
|---|---|---|
| EP | 0 810 639 A2 | 12/1997 |
| EP | 0 865 229 A2 | 9/1998 |
| EP | 0 955 791 A1 | 11/1999 |
| EP | 1 113 087 A2 | 7/2001 |
| EP | 1 207 557 A2 | 5/2002 |
| EP | 1 254 969 A1 | 11/2002 |
| JP | 54-127877 | 10/1979 |
| JP | 57-123973 | 8/1982 |
| JP | 58-177463 | 10/1983 |
| JP | 60-32361 | 3/1985 |
| JP | 60-121616 | 6/1985 |
| JP | 63-79959 | 4/1988 |
| JP | 63-81323 | 4/1988 |
| JP | 2001-357973 | 4/1988 |
| JP | 63-186763 | 11/1988 |
| JP | 63-313123 | 12/1988 |
| JP | 64-42392 | 2/1989 |
| JP | 2-173261 | 7/1990 |
| JP | 4-116169 | 4/1992 |
| JP | 5-304197 | 11/1993 |
| JP | 6-88233 | 3/1994 |
| JP | 6-235061 | 8/1994 |
| JP | 6-299353 | 10/1994 |
| JP | 6-306181 | 11/1994 |
| JP | 7-192866 | 7/1995 |
| JP | 7-252671 | 10/1995 |
| JP | 8-111285 | 4/1996 |
| JP | 9-16960 | 1/1997 |
| JP | 9-209127 | 8/1997 |
| JP | 9-256142 | 9/1997 |
| JP | 9-321310 | 12/1997 |
| JP | 10-41069 | 2/1998 |

| | | |
|---|---|---|
| JP | 10-168559 | 6/1998 |
| JP | 10-195639 | 7/1998 |
| JP | 10-214682 | 8/1998 |
| JP | 10-255973 | 9/1998 |
| JP | 10-335062 | 12/1998 |
| JP | 11-214700 | 8/1999 |
| JP | 11-229123 | 8/1999 |
| JP | 2000-150150 | 5/2000 |
| JP | 2000-164353 | 6/2000 |
| JP | 2000-223269 | 8/2000 |
| JP | 2000-348859 | 12/2000 |
| JP | 2001-93667 | 4/2001 |
| JP | 2001-152336 | 6/2001 |
| JP | 2001-237073 | 8/2001 |
| JP | 2001-247959 | 9/2001 |
| JP | 2001-357973 | 12/2001 |
| JP | 2002-25765 | 1/2002 |
| JP | 2002-60926 | 2/2002 |
| JP | 2002-69619 | 3/2002 |
| JP | 2002-76027 | 3/2002 |
| JP | 2002-158090 | 5/2002 |
| JP | 2002-175878 | 6/2002 |
| JP | 2002-208480 | 7/2002 |
| JP | 2002-221616 | 8/2002 |
| JP | 2003-2778 | 1/2003 |
| JP | 2003-7464 | 1/2003 |
| JP | 2003-17258 | 1/2003 |
| JP | 2003-34591 | 2/2003 |
| JP | 2003-45649 | 2/2003 |
| JP | 2003-45650 | 2/2003 |
| JP | 2003-95787 | 4/2003 |
| JP | 2003-115379 | 4/2003 |
| JP | 2003-293120 | 10/2003 |
| JP | 2004-35964 | 2/2004 |
| JP | 2004-99942 | 4/2004 |
| WO | WO 84/01124 A1 | 3/1984 |
| WO | WO 98/54375 A1 | 12/1998 |
| WO | WO 01/31081 A1 | 5/2001 |
| WO | WO 01/79581 A1 | 10/2001 |

OTHER PUBLICATIONS

Van Slyke, S.A. et al, "Blue Organic Light Emitting Devices," Proceedings of the Electroluminescence Workshop, 1996, pp. 195-200.

Definition of "Elongated," *Merriam Webster's Collegiate Dictionary*, 10th edition, 1998, p. 375.

Fukuda, Y. et al, "An Organic LED Display Exhibiting Pure RGB Colors," Synthetic Metals, vol. 111-112, 2000, pp. 1-6.

Van Slyke, S. et al, "27.2: Linear Source Deposition of Organic Layers for Full-Color OLED," SID 02 Digest, 2002, pp. 886-889.

International Search Report re application No. PCT/JP03/11983, dated Dec. 24, 2003.

Van Slyke, S. et al., "27.2: Linear Source Deposition of Organic Layers for Full-Color OLED," SID 02 Digest, 2002, vol. 33, pp. 886-889.

\* cited by examiner opening opening

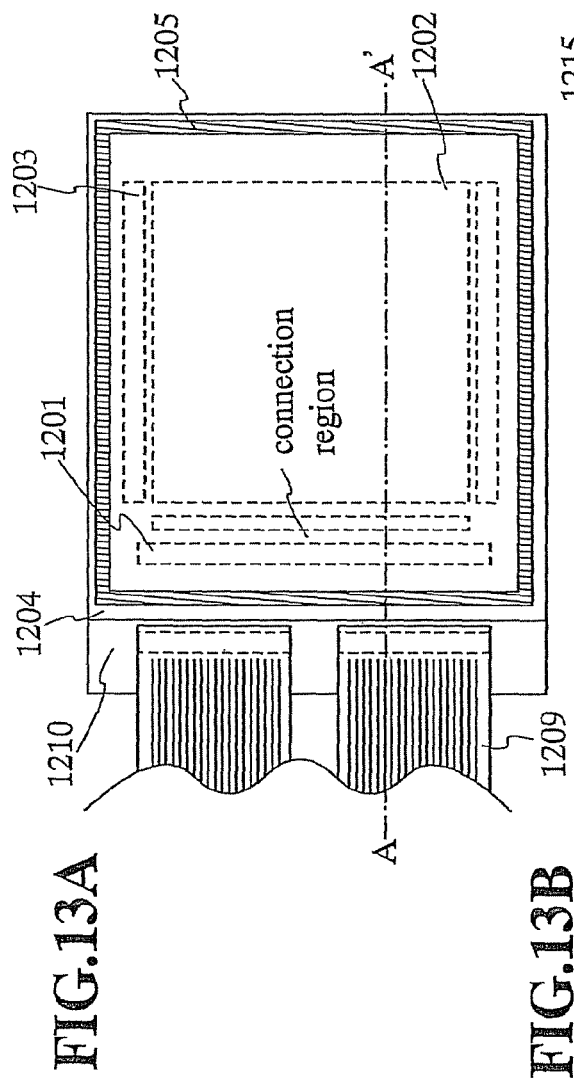
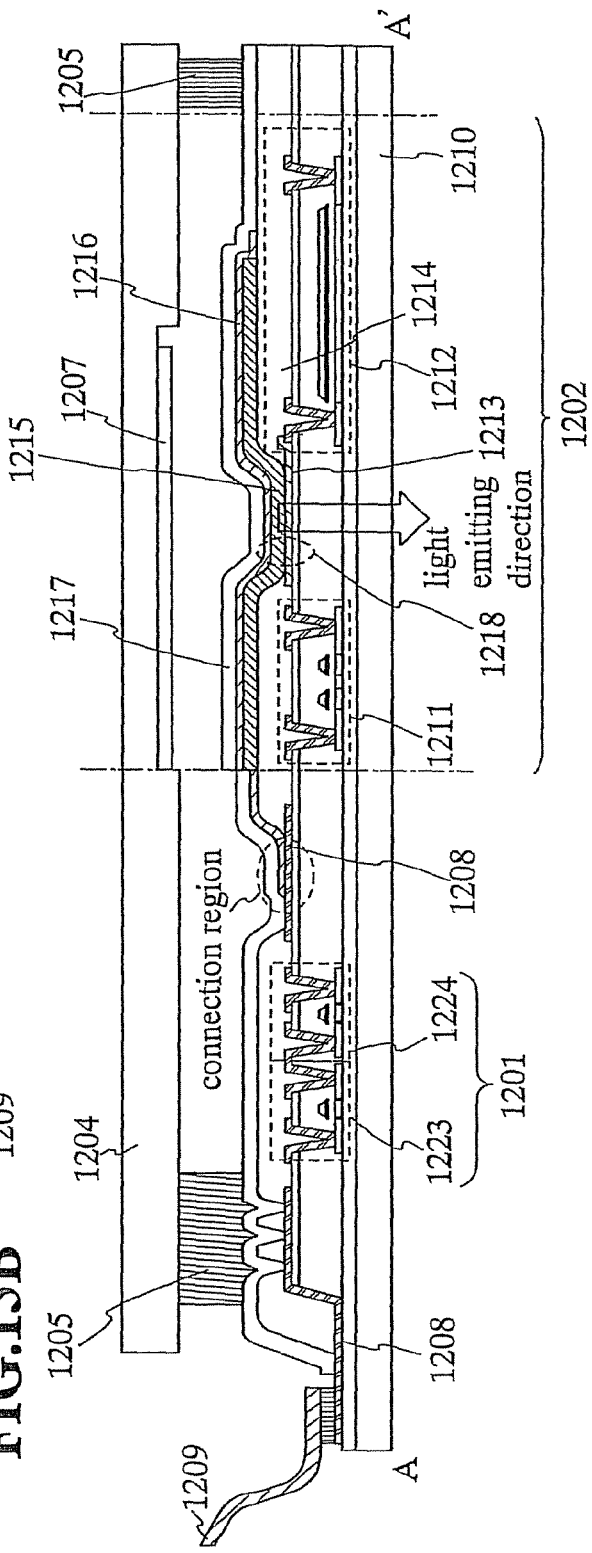
FIG.13A
FIG.13B

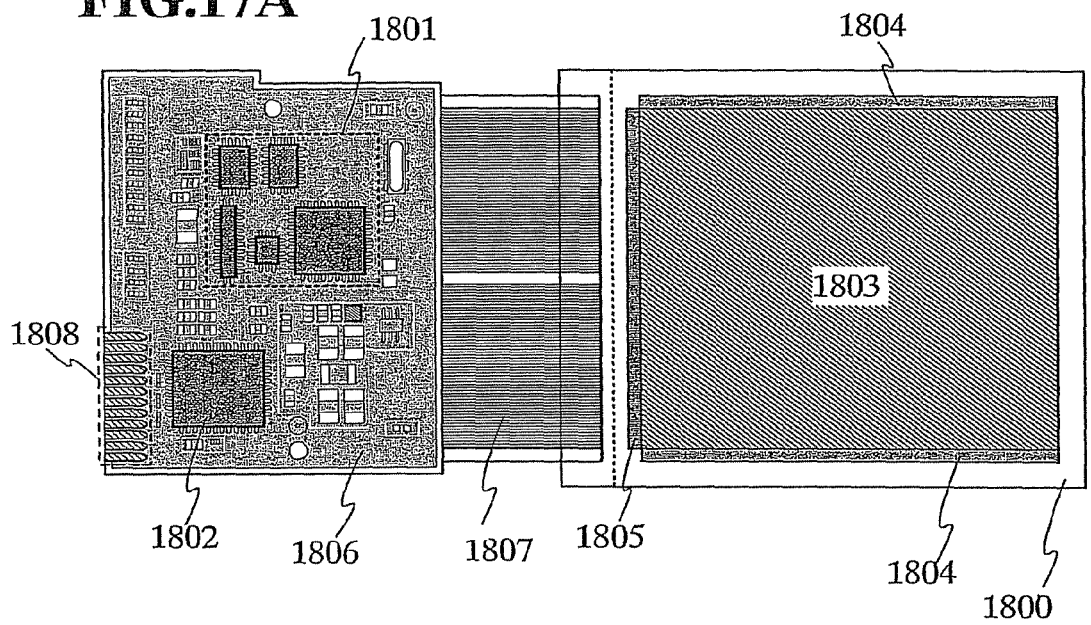

MANUFACTURING METHOD FOR LIGHT EMITTING DEVICE

This application is a continuation of U.S. application Ser. No. 13/108,128, filed on May 16, 2011 now U.S. Pat. No. 8,168,483 which is a continuation of U.S. application Ser. No. 11/876,968, filed on Oct. 23, 2007 (now U.S. Pat. No. 7,943,443 issued May 17, 2011) which is a divisional of U.S. application Ser. No. 10/664,642, filed on Sep. 19, 2003 (now abandoned).

BACKGROUND OF THE INVENTION

1. Field of the Invention

The present invention relates to a fabrication system having a film formation system for depositing materials which can be deposited by vapor deposition (hereinafter, an evaporation material), a light emitting device which has a film containing an organic compound as a light emitting layer and for which the fabrication system is used, and a manufacturing method thereof. Specifically, the present invention relates to a film formation method (a vapor deposition method) for forming a film by vaporizing an evaporation material from a plurality of evaporation sources provided to be opposite to a substrate and a fabrication system.

2. Description of the Related Art

In recent years, research related to a light emitting apparatus having an EL device as a self-luminous light emitting device has been activated. The light emitting apparatus is referred to as an organic EL display or an organic light emitting diode. Since these light emitting apparatuses have characteristics such as rapid response speed that is suitable for a moving picture display, low voltage, low power consumption driving, they attracts an attention for next generation displays including new generation's mobile phones and portable information terminals (PDA).

An EL device has a layer containing an organic compound as a light emitting layer. The EL device has a structure in which a layer containing an organic compound (hereinafter, referred to as an EL layer) is sandwiched between an anode and a cathode. Electro luminescence is generated in the EL layer by applying an electronic field to the anode and the cathode. Luminescence obtained from the EL device includes luminescence generated in returning to a base state from singlet excited state (fluorescence) and luminescence generated in returning to a base state from triplet excited state (phosphorescence).

The EL layer has a laminated structure typified "a hole transporting layer, a light emitting layer and an electron transporting layer." EL materials for forming an EL layer are classified broadly into low-molecular (monomer) materials and high-molecular (polymer) materials. The low-molecular materials are deposited using a vapor deposition system.

A conventional vapor deposition system has a substrate holder where a substrate is set, a crucible encapsulating an EL material, in other words, an evaporation material, a shutter to prevent the EL material to be sublimed from rising, and a heater for heating the EL material in a crucible. Then, the EL material heated by the heater is sublimed and deposited on a rolling substrate. At this time, in order to deposit uniformly, the distance between the substrate and the crucible needs to be 1 m or more.

According to a conventional vapor deposition system and a conventional vapor deposition method, when an EL layer is formed by vapor deposition, almost all the sublimated EL material is adhered to an inner wall, a shutter or an adherence preventive shield (a protective plate for preventing an evaporation material from adhering to an inner wall of a film formation chamber) at inside of the film formation chamber of the vapor deposition system. Therefore, in forming the EL layer, an efficiency of utilizing the expensive EL materials is extremely low i.e. about 1% or less and manufacturing cost of a light emitting apparatus becomes very high.

Further, according to a conventional vapor deposition system, in order to provide a uniform film, it is necessary to separate a substrate from an evaporation source at an interval equal to 1 m or more. Therefore, the vapor deposition system per se grows in size, a period required for exhausting each film formation chamber of the vapor deposition system is prolonged and therefore, film formation speed is slowed down and throughput is lowered. Also, in using a large area substrate, it may be a problem that the film thickness between a center portion and a marginal portion of a substrate is uneven. Further, the vapor deposition system has a structure for rotating a substrate and therefore, there is a limit in the vapor deposition system aiming at a large area substrate.

In view of the above-described problems, the present inventors have proposed a vapor deposition system (Reference 1. Japanese Patent Laid-Open No. 2001-247959 and Reference 2. Japanese Patent Laid-Open No. 2002-60926).

SUMMARY OF THE INVENTION

Hence, the present invention provides a vapor deposition system of fabrication systems that promotes an efficiency of utilizing an EL material to reduce manufacturing costs and is excellent in uniformity or throughput of forming an EL layer and a vapor deposition method. Further, the present invention provides a light emitting apparatus fabricated by the vapor deposition system and the vapor deposition method according to the present invention and a manufacturing method of the light emitting apparatus.

Further, the invention provides a fabrication system for vapor-depositing an EL material efficiently on a large area substrate having a size of, for example, 320 mm×400 mm, 370 mm×470 mm, 550 mm×650 mm, 600 mm×720 mm, 680 mm×880 mm, 1000 mm×1200 mm, 1100 mm×1250 mm or 1150 mm×1300 mm. Also, the present invention provides a vapor deposition system that makes a whole surface of a large area substrate uniform with even thickness.

In view of the foregoing, it is an object of the present invention to provide a vapor deposition system wherein a substrate and an evaporation source are moved relatively. In particular, it is an object of the present invention to provide a vapor deposition system wherein an evaporation source holder in which a container (crucible) that is filled with an evaporation material in a sealed manner is set moves at a certain pitch with respect to the substrate in a film formation chamber. In this specification, a fabrication system that includes a vapor deposition system having a moving evaporation source holder is referred to as a moving cell cluster method.

In the present invention, the top face form of one evaporation source holder is rectangular and four or more crucibles, preferably, six or eight crucibles are installed side by side in the longitudinal direction of the evaporation source holder. It is noted that the term "rectangular" includes more elongated rectangular, elongated ellipse or linear form. The length of the longitudinal direction of the evaporation source holder is set as necessary within 300 mm to 1300 mm depending on a substrate to be used and crucibles are installed at even intervals. In addition, when the length of the longitudinal direction of the evaporation source holder is shorter than one side of the substrate to be used, scanning is performed several times to form a film on the substrate. Further, the evaporation source holder can be moved repeatedly in the one path to laminate one type of thin film several times.

Four or more crucibles of which evaporation centers are each crossed are installed and heated simultaneously, and thus evaporation materials are collide to each other for fine grains. At the time, the point at which the evaporation centers are crossed exists in the interspace between a mask (a substrate) and a container.

One organic material or one type of organic material is not always required to be held in an evaporation source holder, but plural types of an organic compound can be held therein.

Further, in addition to one type of material provided as a light emitting organic compound in an evaporation source holder, a different organic compound capable of serving as a dopant (dopant material) may also be provided together. It is preferable that an organic compound layer be formed by vapor deposition of a host material and a light emitting material (dopant material) having lower excitation energy than that of the host material. It is also preferable that the excitation energy of the dopant be lower than those of a hole transporting region and an electron transporting layer. The dopant can thus be made to effectively emit light while diffusion of the molecular excitons of the dopant is prevented. Further, the carrier recombination efficiency can also be increased, provided that the dopant is a carrier trapping material. Furthermore, a case in which a material is added into a mixed region as a dopant which is capable of converting triplet excitation energy into luminescence also falls under the scope of the present invention.

Further, a region where evaporation materials are mixed (mixed region) on an interface between each film of an EL layer having a laminated structure can be formed by filling different materials in plural crucibles and depositing them simultaneously. A concentration gradient may also be provided in the mixed region.

In addition, in case a plurality of organic compound materials are provided in one evaporation source holder, it is preferable that evaporation directions of the organic compound materials be tilted so that the organic compound materials can be crossed at the position of substrate and be mixed. Evaporation directions may be set by tilting a container (crucible) using a tilt regulating screw.

In an evaporation source holder, there is provided a mechanism (typically two-axis stage) in which the evaporation source holder can move in an X-direction or a Y-direction with keeping a horizontal position in a film formation chamber. Here, an evaporation source holder is moved on a two-dimensional surface in the X-direction and the Y-direction. A moving pitch of an evaporation source holder may be appropriately adjusted to the size of an opening portion of a mask. A film thickness monitor is moved together with the evaporation source holder. The film thickness is uniformed by regulating a movement speed of the evaporation source holder according to the value measured by the film thickness monitor. The angle between the longitudinal direction and the movement direction of the evaporation source holder is 90 degrees.

In the vapor deposition system according to the present invention, an interval distance d between the substrate and the evaporation source holder during vapor deposition is typically narrowed to equal to or less than 30 cm, preferably equal to or less than 20 cm, more preferably from 5 cm to 15 cm. The utilization efficiency of evaporation materials as well as throughput is thus markedly improved.

A deposition mask is likely to be heated since the interval distance d between the substrate and the evaporation source holder is narrowed typically to not more than 30 cm. Therefore, it is preferable that the deposition mask is made from a metal material having low coefficient of thermal expansion, for example, high-melting point metals such as tungsten, tantalum, chrome, nickel, molybdenum, or an alloy containing these elements such as stainless, Inconel, or Hastelloy. For example, a low thermal expansion alloy containing nickel 42% and iron 58% can also be used. For cooling the heated deposition mask, a mechanism for circulating a cooling medium, for example, cooling water, cooling gas, or the like, can be provided for the deposition mask. According to the present invention, since a deposition mask is moved, it is possible that inferior deposition caused by deformation of masks due to heat can be minimized if the movement speed of the deposition mask is high.

There is provided a substrate holding means (frame) for supporting a substrate so that, when multiface cutting (forming a plurality of panels from one sheet of substrate) by using a large area substrate, portions for constituting scribe lines later are brought into contact therewith. That is, the substrate and a mask are set on the substrate holding means and vapor deposition is carried out to regions which is not brought into contact with the substrate holding means and which is not covered with the mask by sublimating evaporation material from the evaporation source holder provided on a lower side of the substrate holding means. Thereby, bending of the large area substrate and the mask because of their own weights can be restrained to be equal to or less than 1 mm. When the mask or a inner wall of a chamber is cleaned, the substrate holding means is made from conductive materials and a plasma is generated by a high frequency power source connected with the substrate holding means to remove evaporation materials which are adhered to the mask or the inner wall of the chamber.

It is preferable that deposits attached to a mask be vaporized to be exhausted to outside of a film formation chamber for cleaning the deposits attached to the mask by generating plasma in the film formation chamber by a plasma generating means as shown in FIG. 4A. Therefore a film formation chamber has a gas introducing means for introducing one or plural types of gas selected from the group consisting of Ar, H, F, $NF_3$, or O, and an exhausting means for exhausting vaporized deposits. In addition, electrodes are provided for a mask separately, and a high frequency power source is connected to either thereof. Accordingly, the mask is preferable to be made from a conductive material. A film formation chamber can be cleaned without exposing the film formation chamber to air when maintenance is conducted by adopting above described structure. It is preferable that both a plasma cleaning means for cleaning only a mask simply and a plasma cleaning means for cleaning strongly whole chamber are equipped with the film formation chamber.

In the above-described described vapor deposition system, an evaporation source holders comprises a container 801 (typically a crucible), a heater that is set outside of the container via a soaking member, a heat insulating layer that is set outside of the heater, an outer casing that is storing these (exterior frame 802), a cooling pipe that is rounded around the outside or inside of the outer casing (pipe for cooling water 810), an evaporation shutter that opens and closes an opening portion of the outer casing including an opening portion of a crucible, and a film thickness sensor, as shown in FIG. 9 as an example. Silicone resin 803 may be filled in a space between the container 801 and the exterior frame 802 in order to prevent the space. Further, there is provided a filter 801, because a certain quantity of evaporation material cannot pass through meshes of the filter provided in the container due to the size thereof. By providing the filter inside the container 801, such evaporation material can be made to come back inside the container, and be sublimed again therein. Therefore, this makes it possible to control film formation speed, to obtain uniform film thickness, and to vapor deposit uniformly without surface irregularity because the size of the evaporation material that is vapor deposited is the same. Of course, when it is possible to vapor deposit uniformly without the filter, the filter is not required. The structure of the container is not limited to the structure shown in FIG. 9. In addition, the container is formed of a material such as heat-resisting metal (Ti), sintered boron nitride (BN), a sintered compound of boron nitride (BN) and aluminum nitride (AlN), quartz, or graphite so as to be capable of withstanding high temperature, high pressure, and low pressure.

Further, a plurality of evaporation source holders may be provided in one film formation chamber. A fabrication system according to the present invention comprising a load chamber, a transport chamber connected with the load chamber, plural film formation chambers connected with the transport chamber, and an installation chamber connected with the film formation chambers;

in which each of the plural film formation chambers is connected with a vacuum exhaust treatment chamber for allowing an inside of each of the film formation chambers to be in a vacuum state, comprise an alignment means (a CCD camera and a stopper) for allowing positions of a mask and a substrate to be in registry with each other, a substrate holding means, a plurality of rectangular evaporation source holders and a means for moving the evaporation source holders;

in which the evaporation source holders have containers, being arranged in a longitudinal direction, in each of which an evaporation material is sealed, a means for heating the containers; and in which the installation chamber, being connected with a vacuum exhaust treatment chamber for allowing an inside of the installation chamber to be in a vacuum state, and comprises a means for heating the containers, and a means for transporting the container into the evaporation source holders in the film formation chamber.

In the above-described structure, the substrate holding means is overlapped with a region which becomes a terminal portion, a cutting region, or an end portion of the substrate with a mask being sandwiched therebetween.

In the above-described structure, the substrate holding means and the mask are bonded or welded with each other In the above-described structure, means for moving the evaporation source holders has a mechanism which moves the evaporation source holders in an X-direction at a given pitch and, further, a Y-direction at another given pitch.

In the above-described structure, a plurality of containers are disposed at equal intervals in the rectangular evaporation source holders.

The container itself may be elongated depending on the form of the rectangular evaporation source holder instead of arranging the plural containers.

Multiple crucibles can be arranged in two lines whereas crucibles are arranged in one line (1×7) as shown in FIG. 1. The timing for stating to move the plural evaporation source holders may be either the time after stopping the previous evaporation source holder or the time before stopping the previous evaporation source holder. For example, different types of materials can be continuously deposited on a substrate to improve productivity in one chamber according to the following procedure; in case of using four evaporation source holders, crucibles filled with a hole transporting organic material are set in a first evaporation source holder, crucibles filled with a light emitting organic material are out in a second evaporation source holder, crucibles filled with an electron transporting organic material are set in a third evaporation source holder, and crucibles filled with a cathode buffer material are set in a fourth evaporation source holder. In the case of starting the next evaporation source holder movement before the solidification of a deposited film, a region where evaporation materials are mixed (a mixed region) can be formed on an interface between each film of an EL layer having a laminated structure.

A substrate and an evaporation source holder are caused relative movement to each other, and thus it is not necessary to increase the distance between the substrate and the evaporation source holder, and miniaturization of the system can thus be achieved. Further, the vapor deposition system is miniaturized, therefore the adhesion of sublimated evaporation materials on interior walls in the film formation chambers or on adherence preventive shields can be reduced. The evaporation materials can thus be utilized without waste. In addition, it is not necessary to rotate a substrate by the vapor deposition method according to the present invention, therefore a vapor deposition system capable of handling large area substrates can be provided. Further, it is also possible to form vapor deposited films uniformly, since the evaporation source holders are moved in an X-direction and in a Y-direction with respect to the substrate. Since a deposition mask is moved according to the present invention, it is possible that inferior deposition caused by deformation of masks due to heat can be minimized.

As shown in FIGS. 5A and 5B, the longitudinal direction of an evaporation source holder is set obliquely to a side of a substrate (an X-direction or a Y-direction) and then the evaporation source holder is moved in the-X-direction or the Y-direction. A fabrication system according to the present invention comprising a load chamber, a transport chamber connected with the load chamber, a plurality of film formation chambers connected with the transport chamber, and an installation chamber connected with the film formation chamber;

in which each of the plurality of film formation chambers, being connected with a vacuum exhaust treatment chamber for allowing an inside of each of the film formation chambers to be in a vacuum state, comprises an alignment means for setting positions of a mask and a substrate, a rectangular evaporation source holder, and a means for moving the evaporation source holder;

in which the evaporation source holder has containers, being disposed in a longitudinal direction, in each of which an evaporation material is sealed, and means for heating the containers; and in which the means for moving the evaporation source holder moves the rectangular evaporation source holder with a longitudinal direction thereof being set obliquely to a side of the substrate in an X-direction or a Y-direction of the substrate.

In the above-described structure, the angle between the longitudinal direction and the movement direction of the evaporation source holder is a certain angle Z ($0°<Z°<90°$).

Further, the substrate is set obliquely to the longitudinal direction of the rectangular evaporation source holder and the rectangular evaporation source holder is moved in the X-direction or the Y-direction. A fabrication system according the present invention comprising a load chamber, a transport chamber connected with the load chamber, a plurality of film formation chambers connected with the transport chamber, and an installation chamber connected with the film formation chambers;

in which each of the plurality of film formation chambers, being connected with a vacuum exhaust treatment chamber for allowing an inside of each of the film formation chambers to be in a vacuum state, comprises an alignment means for allowing positions of a mask and a substrate to be in registry with each other, a rectangular evaporation source holder, and a means for moving the evaporation source holder;

in which the evaporation source holder has containers, being arranged in a longitudinal direction, in each of which an evaporation material is sealed, and a means for heating the containers; and in which a side of the substrate is set obliquely to a direction in which the rectangular evaporation source holder is moved.

In the above-described structure, the mask and the evaporation source holder are set obliquely to the longitudinal direction of the evaporation source holder as well as the substrate. In addition, the angle between the longitudinal direction and the movement direction of the evaporation source holder is 90 degrees.

In the step of manufacturing an active matrix type light emitting apparatus, it is preferable that scanning direction of a laser beam used in fabricating TFT is different from movement direction of the evaporation source holder. A structure of the present invention with respect to manufacturing method of a light emitting apparatus is as follows: A manufacturing method for a light emitting apparatus in which a material containing an organic compound is vaporized from an evaporation source arranged facing a substrate provided with a TFT thereon, a film containing the organic compound is formed on a first electrode provided on the substrate and, then, a second electrode is formed on the film containing the organic compound, comprising the steps of:

forming a semiconductor film on a substrate having an insulating surface;

irradiating a laser beam on the semiconductor film in a scanning manner;

forming a TFT in which the semiconductor film is allowed to be an active layer;

forming a first electrode connected with the TFT;

forming a film containing an organic compound on the first electrode while a rectangular evaporation source holder is moved in a direction different from a scanning direction of the laser beam; and forming a second electrode on the film containing the organic compound.

Further, it is preferable that the direction perpendicular to scanning direction of the laser beam be different from movement direction of the evaporation source holder. A structure of the present invention is as follows; a manufacturing method for a light emitting apparatus in which a material containing an organic compound is vapor deposited from an evaporation source arranged facing a substrate provided with a TFT and a first electrode thereon, a film containing the organic compound is formed on the first electrode and, then, a second electrode is formed on the film containing the organic compound, comprising the steps of:

forming a semiconductor film on a substrate having an insulating surface;

irradiating a laser beam on the semiconductor film in a scanning manner;

forming a TFT in which the semiconductor film is allowed to be an active layer;

forming a first electrode connected with the TFT;

forming a film containing an organic compound on the first electrode while a rectangular evaporation source holder is moved in a direction different from a direction perpendicular to a scanning direction of the laser beam; and forming a second electrode on a film containing the organic compound.

In the above-described structure, the laser beam is a laser beam emitted from one type of laser or a plurality of types of lasers selected from among;

a continuously oscillating laser or a pulse oscillating laser, said continuously oscillating laser or said pulse oscillating laser being a YAG laser, a $YVO_4$ laser, a YLF laser, a $YAlO_3$ laser, a glass laser, a ruby laser, an alexandrite laser, or a Ti:sapphire laser; or the laser beam is a laser beam emitted from one type of laser or a plurality of types selected from among;

a continuously oscillating or a pulse oscillating, said continuously oscillating or said pulse oscillating being an excimer laser, an Ar laser, or a Kr laser.

The process of setting an EL material in a film formation chamber before carrying out vapor deposition or the process of vapor deposition may be considered as the process that allows potentially impurities such as oxygen and moisture to penetrate into the EL material or a metal material that will be vapor deposited.

Also, a container for preserving an EL material is generally a brown-capped glass bottle using a plastic cap. It can be thought that the bottle is not properly capped.

Conventionally, a predetermined quantity of an evaporation material is displaced from the container (the glass bottle) to another container (typically, a crucible or an evaporation boat) set opposed to a substrate in a vapor deposition system when film formation is performed by vapor deposition. There is a risk of impurities being mixed into the evaporation materials during the materials are displaced to another container. That is, there is a danger that oxygen, moisture, or another impurities are mixed into the materials, which are a cause of deterioration of an EL device.

The materials may be, for example, manually transferred from a glass bottle to a container in a pretreatment chamber using gloves, or the like provided in a vapor deposition system. However, if gloves are set in the pretreatment chamber, the chamber cannot be vacuumized. Owing to this, the materials should be transferred to another chamber in an atmospheric pressure. It is difficult to reduce moisture or oxygen as much as possible in the pretreatment chamber even in a nitride atmosphere. Using a robot can be considered, however, it is difficult to manufacture a robot that can treat powdery materials. Accordingly, it is difficult to make a fabrication system a continuous closed system capable of preventing impurities being mixed into EL materials, in which complete automation is made from the step of forming an EL layer on a lower portion electrode to the step of forming an upper portion electrode.

In accordance with the foregoing, the present invention provides a fabrication system, in which an EL material or metal material is directly stored and hermetically sealed in the container that will set in a vapor depositing system without using the brown bottle glass typically or the like that is used conventionally and carries out vapor deposition after transporting the materials, to prevent impurities from being mixed into high purity evaporation materials. For storing directly EL evaporation materials into a container, sublimation purification of the EL evaporation materials may be conducted directly into a container (crucible), which will be set in a vapor deposition system, without distributing obtained EL materials into separate containers. According to the present invention, superpurification of evaporation materials can be possible in the future. In addition, a metal material can be stored directly into a container, which will be set in a vapor deposition system, to be vapor deposited by resistance heating.

The form of the container will be described with reference to FIG. 8A. A second container has two portions of an upper portion (721a) used for transporting and a lower portion (721b) and comprises fixing means 706 for fixing a first container over top of the second container; a spring 705 for applying pressure to the fixing means; a gas introduction port 708 at the lower portion of the second container, which serves as a gas pathway for maintaining a reduced pressure in the second container; an O-ring that fixes the upper portion container 721a and the lower portion container 721b; and a fastener 702. A first container 701, in which a purified evaporation material is filled, is set in the second container. In addition, the second container is preferable to be made of a material containing stainless, and the first container is preferable to be made of a material containing titanium.

A purified material is filled in the first container 701 at the material manufacturer. The upper second container 721a and the lower second container 721b are fitted to each other using the O-ring and fixed using the fastener 702. And the first container 701 is hermetically sealed in the second container, then, the second container is reduced pressure and substituted for nitride atmosphere through the gas introduction port 708, and then, the first container 701 is fixed by adjusting the spring 705 with the fixing means 706. In addition, a desiccant can be put into the second container. Consequently, maintaining a vacuum, low pressure, or nitride atmosphere in the second container can prevent even trace amount of oxygen or moisture from adhering to an evaporation material.

The containers in this state are transferred to the light emitting apparatus manufacturer, and the first container 701 is directly transported into a film formation chamber. Thereafter, the evaporation material is sublimated by heat treatment and vapor deposited on a substrate.

It is preferable that another parts, for example, a film-thickness monitor (such as a crystal oscillator), shutter, or the like be transported without exposing to air into a vapor deposition system.

It is preferable that the light emitting apparatus manufacturer ask the material manufacturer that makes or sells evaporation materials to store an evaporation material directly into the container that will be set in the above-described described vapor deposition system. An attempt of trying to decrease the mixed impurities by the light emitting apparatus manufacturer in collaboration with the material manufacturer can maintain the extremely high purity EL materials obtained by the material manufacturer. And, it is possible to carry out vapor deposition without degrading the purity by the light emitting apparatus manufacturer.

Even if high purity EL materials are provided by the material manufacturer, there is a risk of impurities being mixed if the materials should be displaced to another container in a conventional manner by the light emitting apparatus manufacturer. Consequently, the purity of EL materials cannot be kept high, and so there is a limitation of the purity of EL materials.

In view of the foregoing, a crucible (in which an evaporation material is filled in a sealed manner) that is sealed with vacuum in a container without exposing to air is transported from the container into a film formation chamber that is connected with an installation chamber to install the crucible without exposing to air. Then, the crucible is transported from the installation chamber using a transporting robot. It is preferable that a vacuum exhausting means and a heater for heating the crucible be equipped with the installation chamber.

A mechanism of setting a first container 701 that has been transported into and vacuum sealed in the second container 721a and 721b is installed in the film formation chamber will be described with reference to FIG. 8A and FIG. 8B.

FIG. 8A shows a turntable 713 in which the second container 721a and 721b containing the first container is set on, a transport mechanism for transporting the first container, and a cross sectional view of an installation chamber having a hauling up mechanism 711.

It is possible to control the atmosphere of the installation chamber that is adjacent to the film formation chamber through the gas introduction port by a controlling atmosphere means. Note that the transport mechanism according to the present invention is not limited to the structure in which the top portion of the first container is sandwiched (picked up) as shown in FIG. 8B. The structure in which the side portion of the first container is sandwiched (picked up) may also be employed.

The second container is placed on the turntable 713 in the installation chamber in a state where the fastener 702 is released in the installation chamber. Since the inside of the installation chamber is under vacuum, the container is as it is when the fastener 702 released. The pressure inside the installation chamber is then reduced by the controlling atmosphere means. The second container can be easily opened when the pressure inside the installation chamber becomes equal to the pressure inside the second container. The upper portion 721a of the second container is then removed by using the hauling up mechanism 711, and the lower portion of the second container and the first container 701 are moved by rotating the turntable 713 with a rotation axis 712. Then, the first container 701 is transported into the film formation chamber using the transport mechanism and set in an evaporation source holder (not shown).

Thereafter, the evaporation material is sublimated by a heater equipped with the evaporation source holder and started to be deposited. When a shutter (not shown) installed with the evaporation source holder is opened, the sublimated evaporation material will scatter toward the substrate and deposit thereon, thus form a light emitting layer (including a hole transporting layer, a hole injection layer, an electron transporting layer, and an electron injection layer).

The first container is removed from the evaporation source holder after the vapor deposition is completed, and transported into the installation chamber to be placed on the lower portion of the second lower container (not shown), which is set on the turntable, and then, hermetically sealed by the upper container 721a. Here, it is preferable that the first container, the upper container 721a, and the lower container be sealed together in the second container in this transported combination. In this state, inside the installation chamber is under the atmospheric pressure and the second container is transferred from the installation chamber with being fixed by the fastener 702 to the material manufacturer.

Also, a robot is installed in a pretreatment chamber (installation chamber) connected with the film formation chamber, and an evaporation source can be moved into the pretreatment chamber and evaporation material is set in the evaporation source. Therefore a fabrication system that has a structure in which the evaporation source moves into the pretreatment chamber may be employed. Accordingly, the evaporation source can be set with keeping film formation chambers clean.

Further, the present invention may reduce the processing time per single substrate. As shown in FIG. 10, a multi-chamber fabrication system has a plurality of film formation chambers comprising a first film formation chamber for depositing onto a first substrate, and a second film formation chamber for depositing onto a second substrate. A plurality of organic compound layers are laminated in parallel in each film formation chamber, thus the processing time per single substrate is reduced. That is, the first substrate is taken out from a transport chamber and placed in the first film formation chamber, and vapor deposition on the first substrate is carried out. During this time, the second substrate is taken out from the transport chamber and placed in the second film formation chamber, and vapor deposition is also carried out on the second substrate.

Six film formation chambers are provided with a transport chamber 1004a as shown in FIG. 10, and it is therefore possible to place six substrates into the respective film formation chambers and carry out vapor deposition in order and in parallel. Further, vapor deposition can also be carried out during maintenance of one or more film formation chamber by using the other film formation chambers, without temporarily stopping the production line.

An example of the procedure of vapor deposition for forming a layer containing an organic compound according to the present invention is as follows: Firstly, a container in which a crucible is sealed with vacuum is set and the inside of an installation chamber is evacuated, then, the crucible is removed from the container. Secondly, although the crucible is heated up to temperature T, it is necessary to be careful not to start vapor deposition in the installation chamber by controlling the degree of vacuum in the installation chamber to be lower than that during a vapor deposition. Thirdly, the heated crucible is transported from the installation chamber into the film formation chamber. The crucible is set in an evaporation source holder that was heated in advance in the film formation chamber, and the degree of vacuum is increased, then, vapor deposition is started. The evaporation source holder can be moved in an X-direction or a Y-direction, and so the fixed substrate can be deposited uniformly. Heating the crucible in advance can reduce the heating time.

In accordance with the present invention, substrate rotation is not necessary, and therefore a vapor deposition system capable of handling large surface area substrates can be provided. Further, a vapor deposition system capable of obtaining a uniform film in thickness, even if the large surface area substrate is used, can be provided.

Furthermore, the distance between the substrate and the evaporation source holder can be shortened in accordance with the present invention, and miniaturization of the vapor deposition system can be achieved. The vapor deposition system becomes smaller, and therefore the amount of sublimated evaporation materials that adhere to inner walls or adherence preventive shields in film formation chambers is reduced, and the evaporation materials can be effectively utilized.

Further, the present invention can provide a fabrication system in which a plurality of film formation chambers for performing vapor deposition process are arranged in succession. Throughput of the light emitting apparatus can be enhanced if parallel processing is performed in the plurality of film formation chambers.

BRIEF DESCRIPTION OF THE DRAWINGS

In the accompanying drawings:
FIGS. 13A and 13B show a light emitting apparatus (Embodiment 3);
FIGS. 17A and 17B show a module (Embodiment 6)

DESCRIPTION OF THE PREFERRED EMBODIMENTS

Embodiment Mode 1

Figure 1:
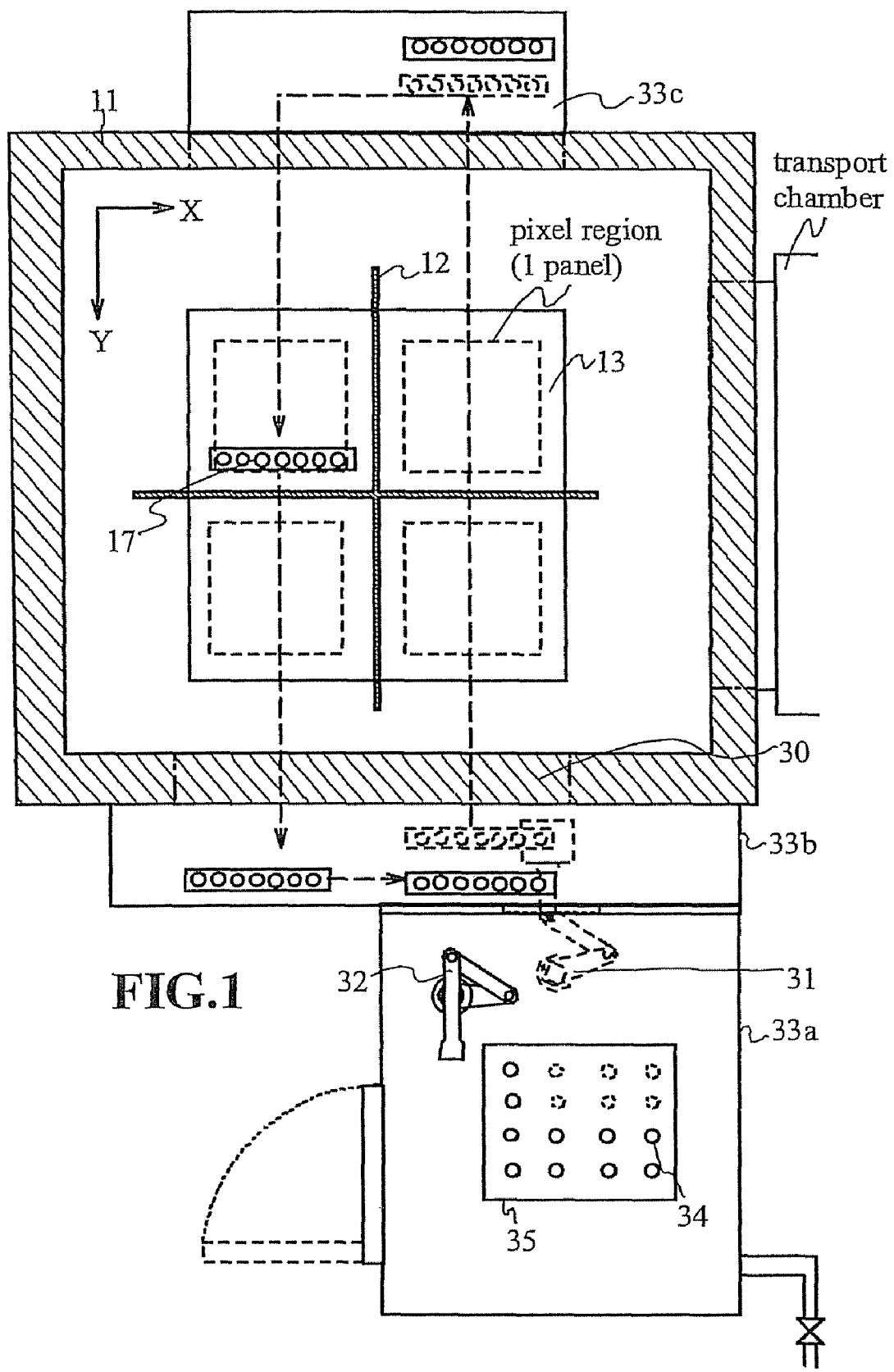
FIG. 1 is a top view of a vapor deposition system according the present invention (Embodiment Mode 1)

FIG. 1 is a top view showing a vapor deposition system according to the present invention. FIG. 1 shows the vapor deposition system in the midst of vapor deposition.

In FIG. 1, a film formation chamber 11 includes a substrate holding means 12, an evaporation source holder 17 installed with an evaporation shutter, a mechanism for moving the evaporation source holder (not shown), and means for producing a low pressure atmosphere (vacuum exhausting means). Further, a large-size substrate 13 and a deposition mask 14 (not shown) are installed in the film formation chamber 11.

Further, the substrate holding means 12 fixes by gravitation the deposition mask 14 made of a metal and therefore fixes the substrate 13 which is arranged over the deposition mask. Note that the substrate holding means 12 may be installed for a vacuum suction mechanism to fix the mask. An example of adhesion or welding of the deposition mask to the substrate holding means 12 is shown here. However, in order to prevent the deposition mask and the substrate holding means from fixing each other, an insulating substance may be provided in the intersection portion of the deposition mask and the substrate holding means each other, or a shape of the substrate holding means may be arbitrarily changed in order to be in point contact with the deposition mask. Further, although an example of installing both the substrate and the deposition mask by the substrate holding means 12 is shown here, the substrate holding means and a deposition mask holding means may be individually provided. In addition, the substrate holding means is fixed in the film formation chamber.

Further, it is preferable that the substrate holding means 12 be formed in a cutting region (a region to be scribe line) when multiface cutting is executed because deposition cannot be carried out in a region that is overlapping with the substrate holding means 12. Alternatively, the substrate holding means 12 may be formed in a manner of overlapping with a region to be a panel terminal portion. As shown in FIG. 1, the substrate holding means 12 is formed in the shape of a cross as seen from the upper surface, since FIG. 1 shows an example of forming four panels that are drawn in a dotted line within one substrate 13. However, the shape of the substrate holding means 12 is not limited to this structure, an asymmetric shape may be acceptable. Incidentally, although not is shown clearly in the figure, the substrate holding means 12 is fixed in the film formation chamber. Note that masks are not shown in FIG. 1 for simplification.

Further, alignments of the deposition mask and the substrate may be confirmed by using a CCD camera (not shown). The alignment control may be carried out by installing alignment markers to the substrate and the deposition mask respectively. A container filled with an evaporation material 18 is installed in the evaporation source holder 17. The film formation chamber 11 is vacuumed to degree of vacuum of $5 \times 10^{-3}$ Torr (0.665 Pa) or lower, preferably, $10^{-4}$ through $10^{-6}$ Pa by the means for producing the low pressure atmosphere.

Further, the evaporation material is previously sublimated (vaporized) by resistance heating in an installation chamber 33b and when the evaporation speed is stable, the shutter 30 is opened to transport the evaporation source holder 17 to the inside of a film formation chamber 11. The evaporation source holder 17 passes under the substrate 13. An evaporated evaporation material is scattered in an upward direction and is selectively deposited on the substrate 13 by passing an opening portion provided at the deposition mask. Further, preferably, the film formation speed, a movement speed of the evaporation source holder and opening and closing of the shutter are controlled by a microcomputer. The deposition rate of the evaporation source holder can be controlled by the movement speed of the evaporation source holder. In addition, a shutter may be provided in the evaporation source holder in order to control the deposition.

In FIG. 1, multiple evaporation source holders 17 can stand by in the installation chambers 33b and 33c and the evaporation source holder 17 can be moved sequentially to laminate multiple kinds of films.

Further, although not illustrated, deposition can be carried out while measuring film thickness of a vapor deposited film by a film thickness monitor provided in the evaporation source holder, e.g. a quartz oscillator. When the film thickness of the vapor deposited film is measured by using the quartz oscillator, a change in mass of a film deposited to the quartz oscillator can be measured as a change in the resonance frequency.

In the vapor deposition system shown in FIG. 1, during the vapor deposition, a distance d of an interval between the substrate 13 and the evaporation source holder 17 can be reduced to, typically, 30 cm or less, preferably, 20 cm or less, more preferably, from 5 cm to 15 cm to thereby significantly enhance throughput and an efficiency of the evaporation material.

Figure 2:
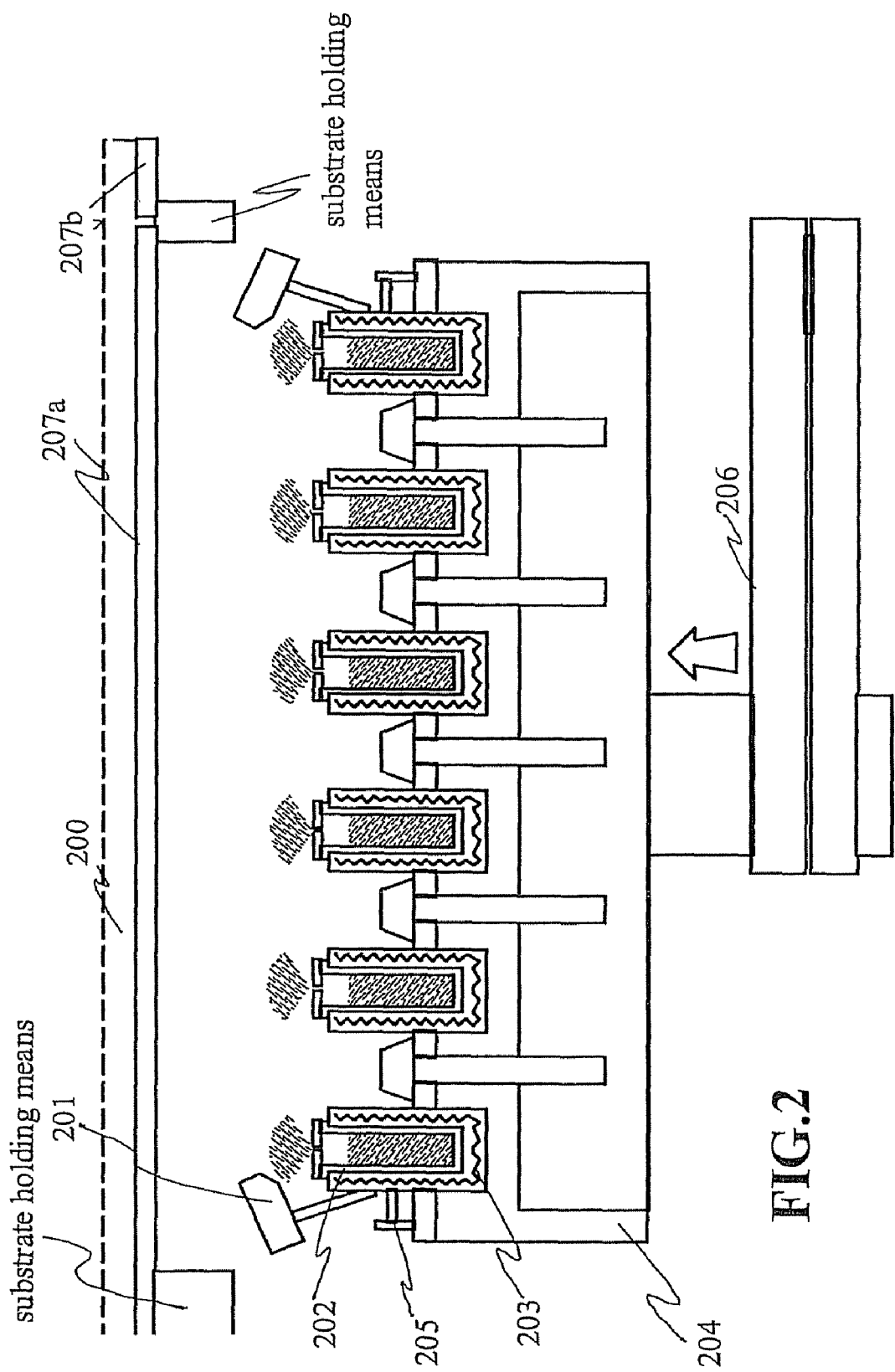
FIG. 2 is a cross sectional view in which the periphery of the substrate is enlarged (Embodiment Mode 1)

FIG. 2 is a cross sectional view showing a pattern diagram in which the periphery of the substrate is enlarged. In FIG. 2, a rectangular shape of an evaporation source holder 204 having six containers (crucibles) 202 is shown. Film thickness monitors 201 are provided as necessary for the six crucibles 202. Tilt regulating screws 205 are provided as necessary in the same way as the film thickness monitors. The tilt regulating screw can tilt a heater 203 to the substrate 200. The heater 203 is used as a heating means to carry out vapor deposition by resistance heating.

In the case of obtaining a full-color light emitting device in which layers containing an organic compound for emitting red (R), green (G) and blue (B) light are selectively laminated, three deposition masks are used to selectively deposit. FIGS. 6A to 6D show examples of various light emitting areas of a red light emitting device, a green light emitting device and a blue light emitting device having different luminous efficiency. Film thickness of a hole transporting or hole injection layer, an electron transporting layer or electron injection layer are each changed and adjusted as necessary. Here is shown an example: red light emitting area>blue light emitting area>green light emitting area. However, the present invention is not limited thereto.

Figure 6A:
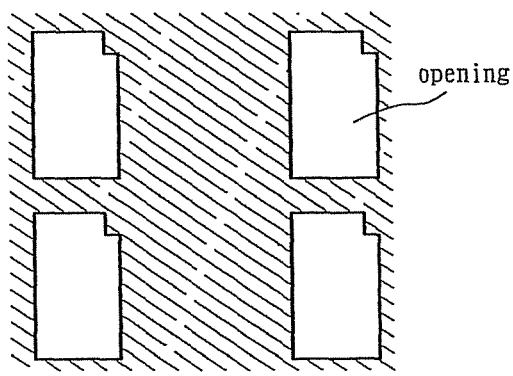
FIGS. 6A to 6D show deposition masks (Embodiment Mode 1)
Figure 6B:
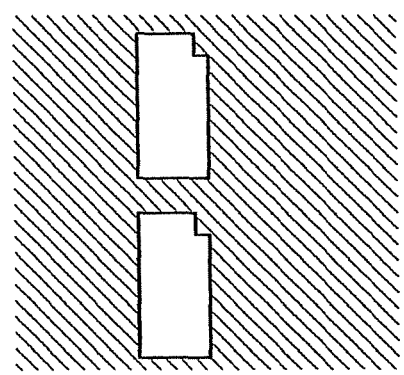
Figure 6C:
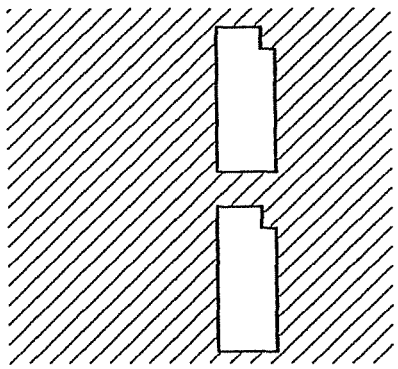

FIGS. 6A, 6B and 6C show a deposition mask for R, a deposition mask for B and a deposition mask for G, respectively.

Figure 6D:
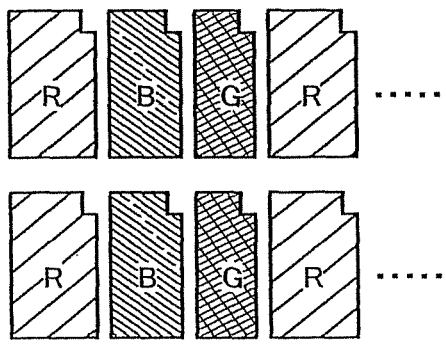

In a first film formation chamber, a hole transporting or hole injection layer, a light emitting layer (R), an electron transporting layer or electron injection layer are sequentially laminated by using the deposition mask for R (FIG. 6A). In a second film formation chamber, a hole transporting or hole injection layer, a light emitting layer (G), an electron transporting layer or electron injection layer are sequentially laminated by using the deposition mask for G (FIG. 6C). In a third film formation chamber, a hole transporting or hole injection layer, a light emitting layer (B), an electron transporting layer or electron injection layer are sequentially laminated by using the deposition mask for B (FIG. 6B). After that, a cathode is formed to obtain a full-color light emitting device. A part of the thus obtained light emitting area, that is, the light emitting area for eight pixels, is shown in FIG. 6D.

Figure 7A:
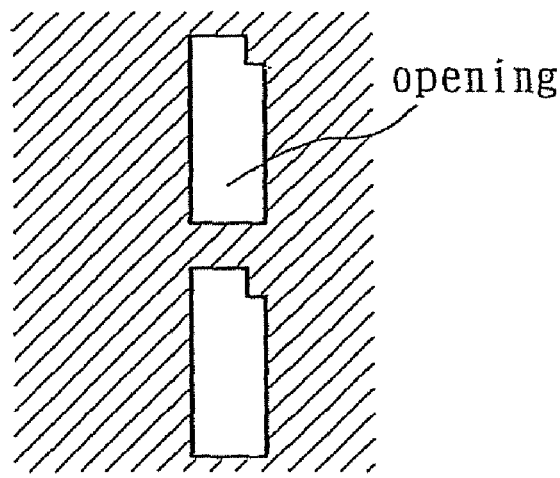
FIGS. 7A to 7C show deposition masks (Embodiment Mode 1)
Figure 7B:
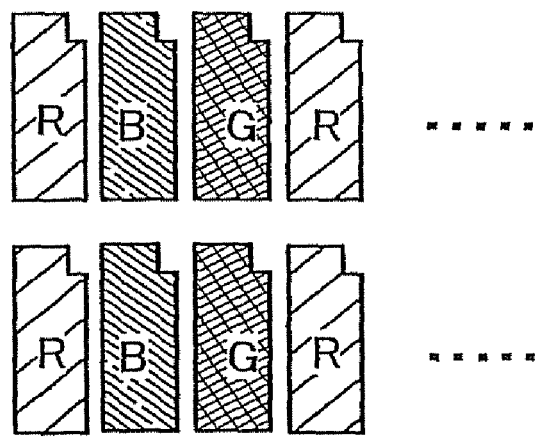
Figure 7C:
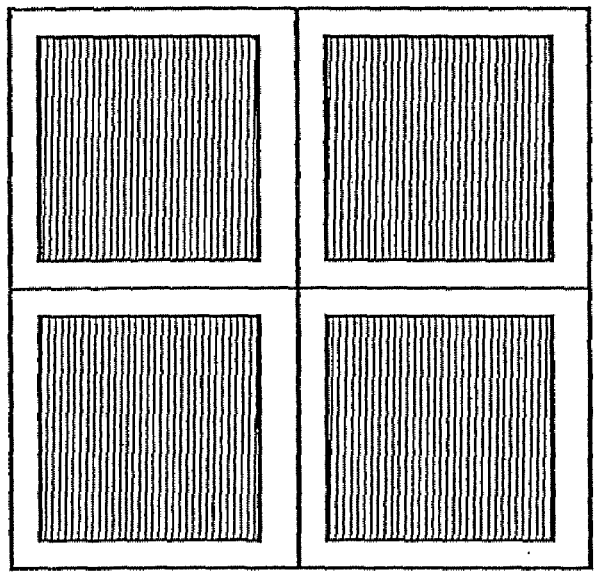

FIGS. 7A to 7C show an example in which light emitting areas of a red light emitting area, green light emitting area and blue light emitting area are made equal to one another. When the light emitting areas are the same, each of the shapes of the opening portions in the respective masks is the same but only alignment is different. Accordingly, it is possible to form a deposition mask for R, a deposition mask for G and a deposition mask for B from one glass mask, and thus cost reduction can be achieved. In particular, cost reduction for designing a deposition mask for a large-sized substrate is achieved. Further, as shown in FIG. 7C, one mask is made by arranging four masks with alignment accuracy to reduce the cost considerably.

Three deposition masks for R, G and B shown in FIG. 7A are prepared. Only positions of the opening portions of the deposition masks are different from each other. A part of the light emitting area that is sequentially laminated by using the masks, in other words, the light emitting area for eight pixels is shown in FIG. 7B.

The substrate 200 is aligned with masks 207a and 207b and a substrate holding means by CCD or the like. Here is shown an example of multiface cutting and the mask to be used in the present invention is a mask into which multiple small masks are unified into one mask with accuracy because a large-sized mask for a large-sized substrate is very expensive. For example, in the case of forming four masks in a large-sized substrate (600 cm×720 cm), the mask into which four masks (300 cm×360 cm per a mask) are unified as shown in FIG. 7C can be used. Cost reduction for designing a mask is achieved by aligning the four masks and adhering the four masks to each other. In order to unify plural masks into one mask, multiple masks are welded or adhered to a substrate holding means and then fixed. Further, a slide shutter (not shown) may be provided to control vapor deposition. For example, when an evaporation source holder is not under a substrate 200 since the evaporation source holder was moved, the shutter is closed to stop vapor deposition. The evaporation source holder 204 is moved with a moving mechanism 206 (typically, two-axis stage) in an X-direction or a Y-direction on a two-dimensional surface in a film formation chamber. In addition, an example of an evaporation source holder having six containers is shown in FIG. 2. However, the present invention is not limited thereto and an evaporation source holder having 6 or more containers may be applicable.

As described above, by using the film formation chamber that has a mechanism for transporting an evaporation source holder, it is not required to increase the distance between a substrate and the evaporation source holder, and so a vapor deposited film can be uniformly formed.

According to the present invention, the distance between a substrate and an evaporation source holder can be reduced, and miniaturization of a vapor deposition system can be achieved. Further, the vapor deposition system becomes small, and therefore the adhesion of sublimated evaporation materials on interior walls within the film formation chambers, or on adherence preventive shields can be reduced. The evaporation materials can thus be utilized without waste. In addition, it is not necessary to rotate the substrates in the vapor deposition method of the present invention, and therefore a vapor deposition system capable of handling large surface area substrates can be provided.

By reducing the distance between a substrate and an evaporation source holder, a vapor deposited film can be formed to be a thin film under well-controlled.

A crucible installed on a turntable 35 provided in the installation chamber 33a is transported into the installation chamber 33b by transport mechanism 31 in order to install the crucible in an evaporation source holder. According to the present invention, a crucible (a crucible filled with evaporation material in a sealed manner) sealed with vacuum in an container without being exposed to air is taken out of the container and can be transported from the installation chamber by a transporting robot without being exposed to air, since the installation chamber for installing a crucible to an evaporation source holder is connected with a film formation chamber. There is provided a vacuum exhausting means for each of installation chambers. Preferably, a heating means for heating a crucible is also provided for each of the installation chambers.

A mechanism for installing a first container 701 which is hermetically sealed in second containers 721a and 721b to be transformed into a film formation chamber is described with reference to FIGS. 8A and 8B.

Figure 8A:
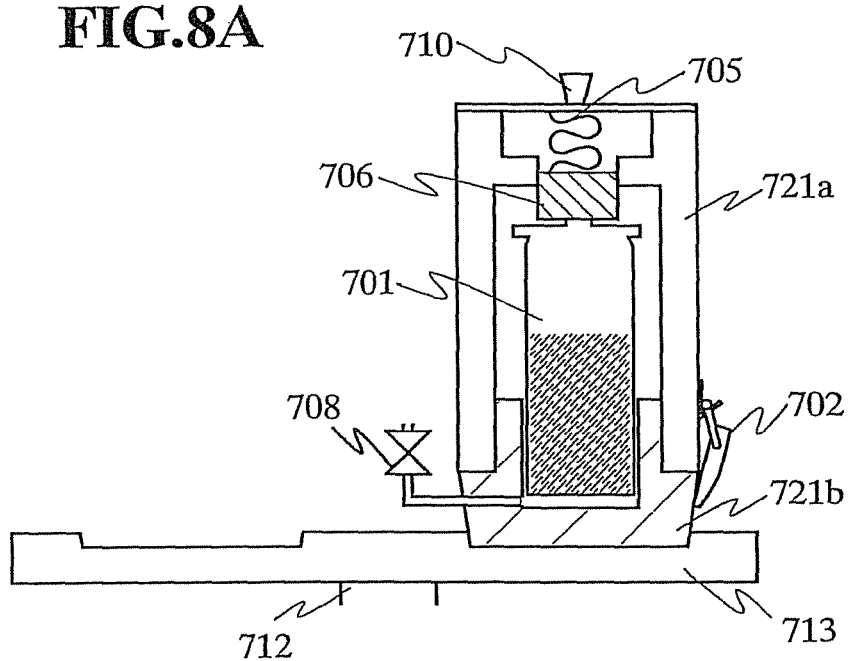
FIGS. 8A and 8B show modes of a container to be transported.
Figure 8B:
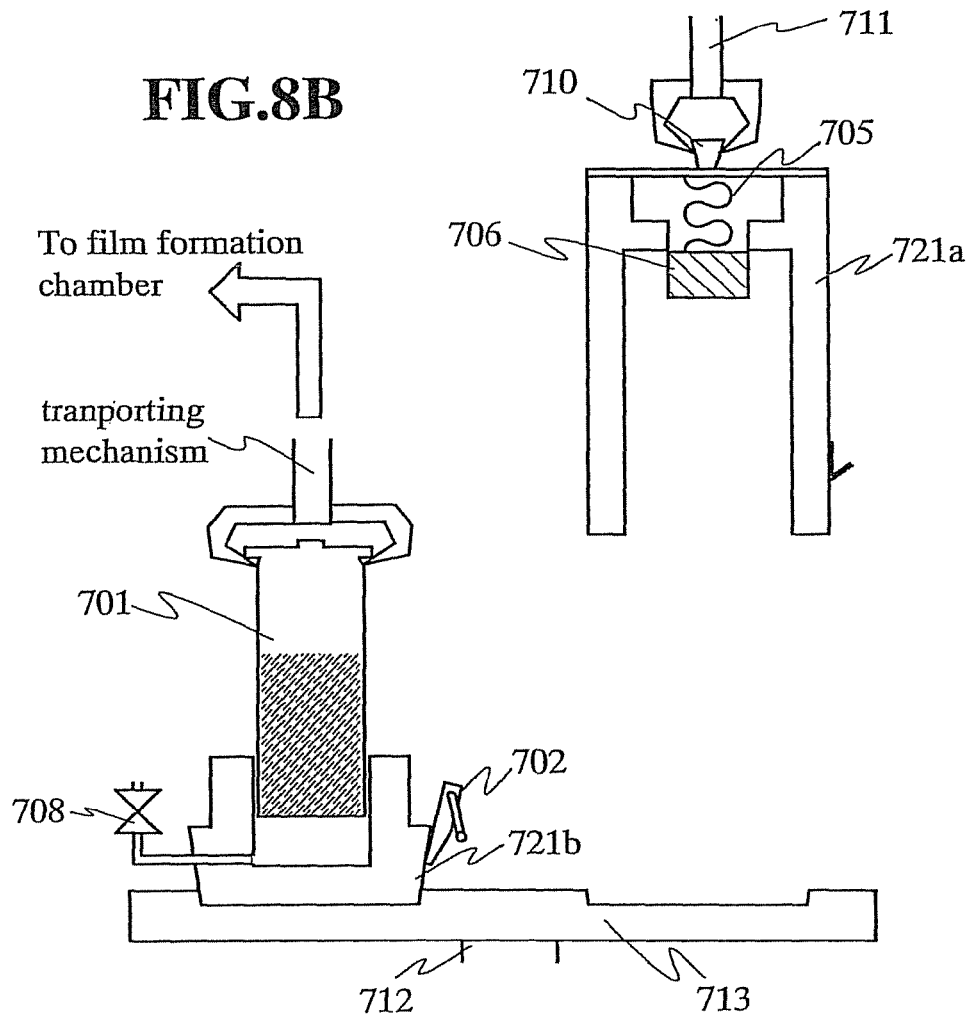
Figure 9:
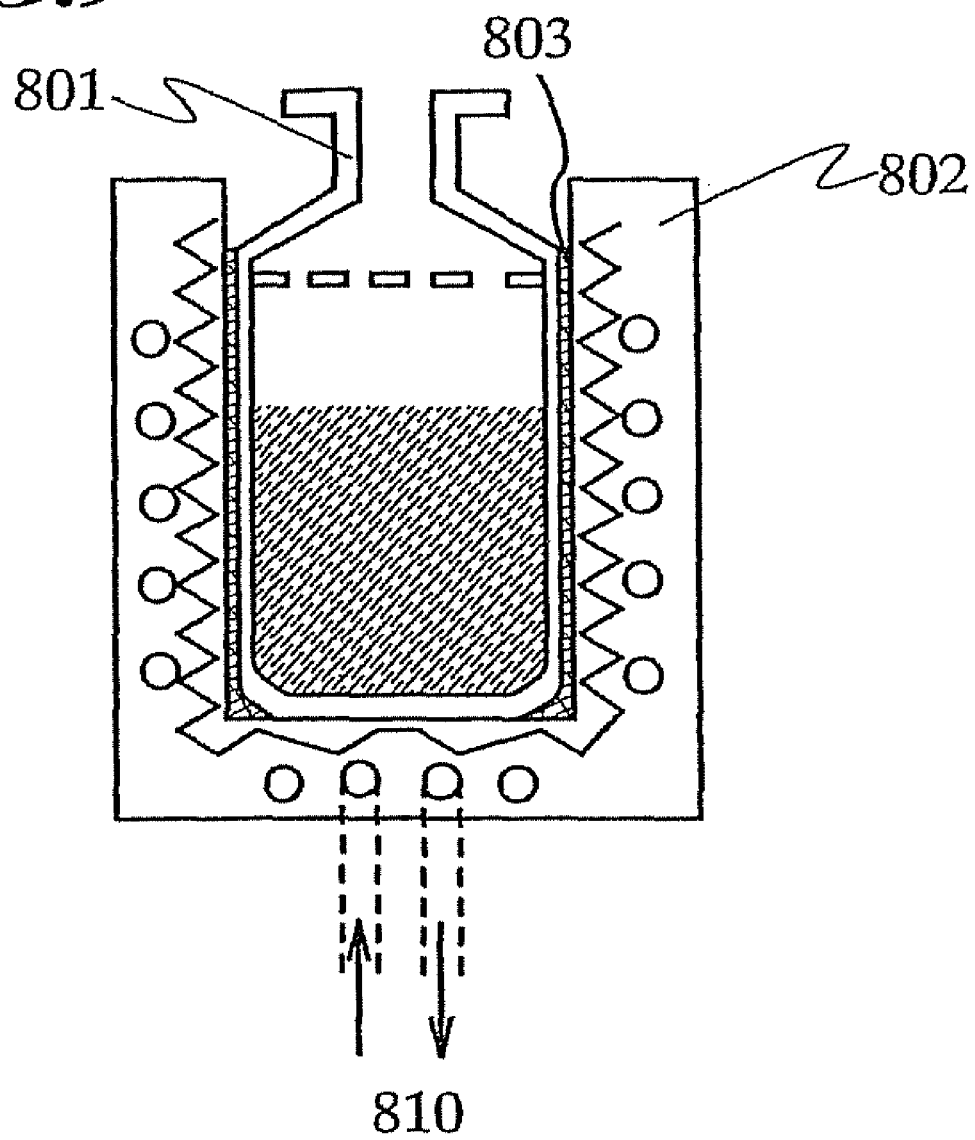
FIG. 9 shows an evaporation source holder.

FIG. 8A shows a turntable 713 in which the second container 721a and 721b containing the first container is set on, a transport mechanism for transporting the first container, and a cross sectional view of an installation chamber having a hauling up mechanism 711.

It is possible to control the atmosphere of the installation chamber that is adjacent to the film formation chamber through the gas introduction port by a controlling atmosphere means. Note that the transport mechanism according to the present invention is not limited to the structure in which the top portion of the first container is sandwiched (picked up) as shown in FIG. 8B. The structure in which the side portion of the first container is sandwiched (picked up) may also be employed.

The second container is placed on the turntable 713 in the installation chamber in a state where the fastener 702 is released in the installation chamber. Since the inside of the installation chamber is under vacuum, the container is as it is when the fastener 702 released. The pressure inside the installation chamber is then reduced by the controlling atmosphere means. The second container can be easily opened when the pressure inside the installation chamber becomes equal to the pressure inside the second container. The upper portion 721a of the second container is then removed by using the hauling up mechanism 711, and the lower portion of the second container and the first container 701 are moved by rotating the turntable 713 with a rotation axis 712. Then, the first container 701 is transported into the film formation chamber using the transport mechanism and set in an evaporation source holder (not shown).

Thereafter, the evaporation material is sublimated by a heater equipped with the evaporation source holder and started to be deposited.

The first container is removed from the evaporation source holder after the vapor deposition is completed, and transported into the installation chamber to be placed on the lower portion of the second container (not shown), which is set on the turntable, and then, hermetically sealed by the upper container 721a. Here, it is preferable that the first container, the upper container 721a, and the lower container be sealed together in the second container in this transported combination. In this state, inside the installation chamber is under the atmospheric pressure and the second container is transferred from the installation chamber with being fixed by the fastener 702 to the material manufacturer.

Embodiment Mode 2

Next, a detailed description will be given of a structure of a substrate holding means according to the invention in reference to FIGS. 3A to 3H.

Figure 3A:
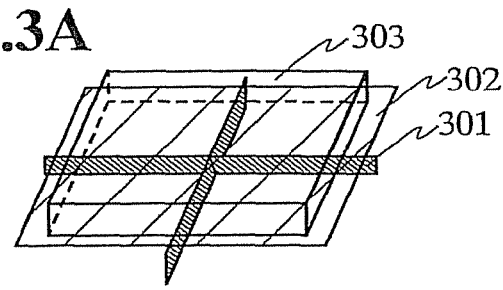
FIGS. 3A to 3H show a structure of a substrate holding means (Embodiment Mode 2)
Figure 3B:
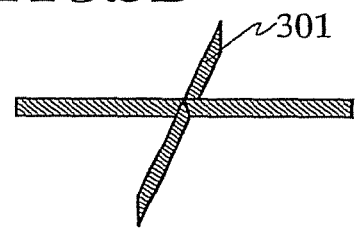

FIG. 3A shows a perspective view of a substrate holding means 301 mounted with a substrate 303 and a mask 302 and FIG. 3B shows only the substrate holding means 301.

Figure 3C:
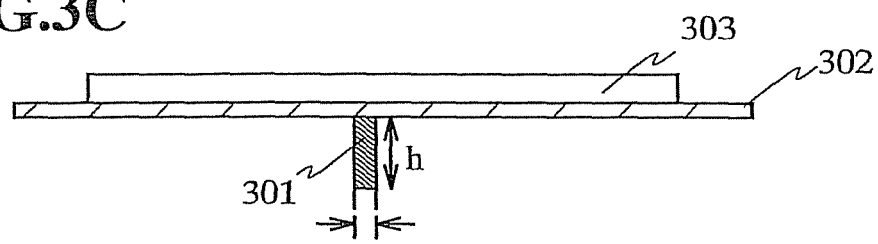

Further, FIG. 3C shows a cross sectional view of the substrate holding means mounted with the substrate 303 and the mask 302 which is constituted by a metal plate (representatively, Ti) having a height h of 10 mm through 50 mm and a width w of 1 mm through 5 mm.

By the substrate holding means 301, bending of the substrate or bending of the mask can be restrained.

Further, the shape of the substrate holding means 301 is not limited to that shown by FIGS. 3A through 3C but may be constituted by a shape as shown in, for example, 3E.

Figure 3D:
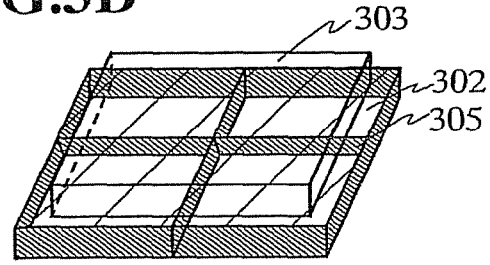
Figure 3E:
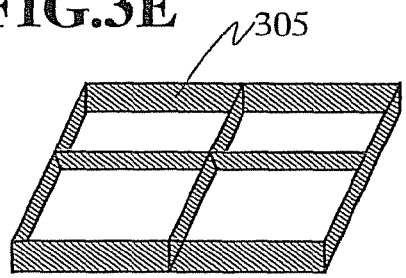

FIG. 3E shows an example of providing portions that support end portions of the substrate and by a substrate holding means 305, bending of the substrate 303 or bending of the mask 302 is restrained. Further, FIG. 3E shows only the substrate holding means 305. Further, FIG. 3D shows a perspective view of the substrate holding means 305 mounted with the substrate 303 and the mask 302.

Figure 3F:
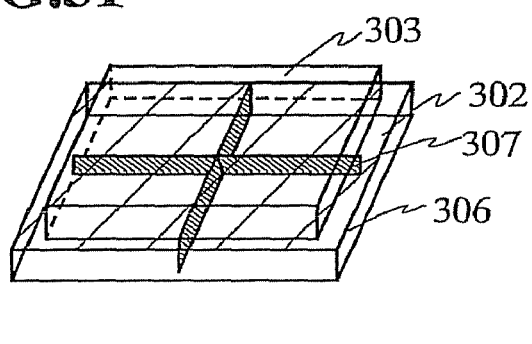
Figure 3G:
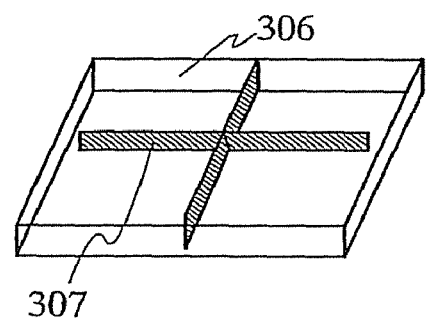
Figure 3H:
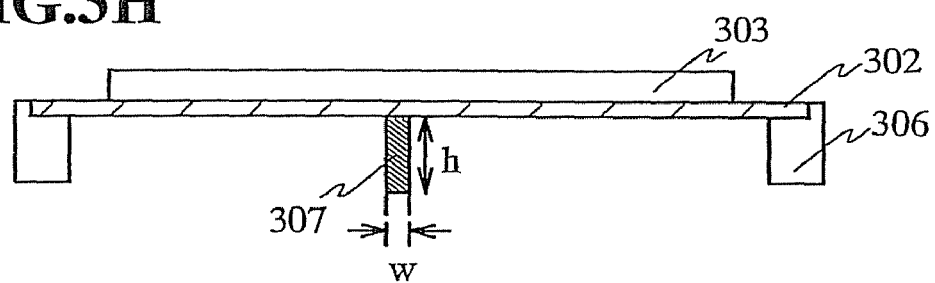

Further, in place of the shape of the substrate holding means, a shape as shown in FIG. 3G may be employed. FIG. 3G shows an example of providing a mask frame 306 that supports end portions of the substrate and by the substrate holding means 307 and the mask frame 306, bending of the substrate 303 or bending of the mask 302 is restrained. In this case, the substrate holding means 307 and the mask frame 306 may be formed by materials different from each other. Further, the mask frame 306 is provided with a recess for fixing a position of the mask 302 as shown in FIG. 3H. The substrate holding means 307 may be integrated with the mask frame 306.

Further, FIG. 3G shows the mask frame 306 and the substrate holding means 307. Further, FIG. 3F shows a perspective view of the substrate holding means 305 and the mask frame 306 mounted with the substrate 303 and the mask 302.

The present embodiment mode can freely be implemented with Embodiment Mode 1.

Embodiment Mode 3

An example of the film formation chamber having multiple evaporation source holders is given in Embodiment Mode 1. In the other hand, in Embodiment Mode 3, an example of a film formation chamber having one evaporation source holder in FIGS. 4A-B.

Figure 4A:
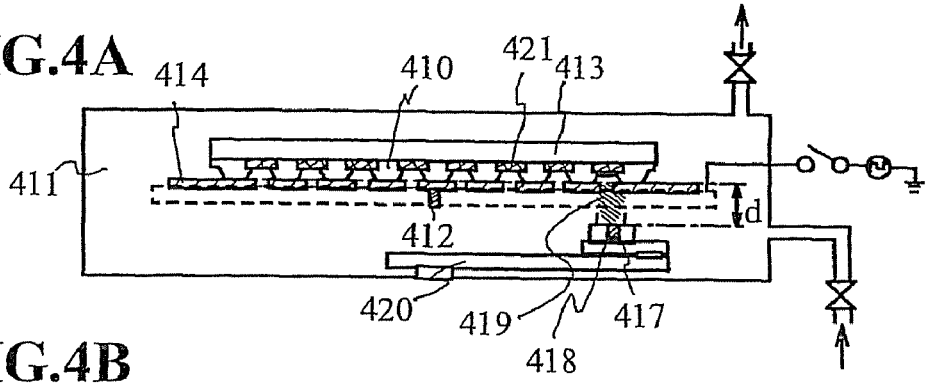
FIGS. 4A and 4B are a cross sectional view and a top view of a vapor deposition system according to the present invention (Embodiment Mode 3)
Figure 4B:
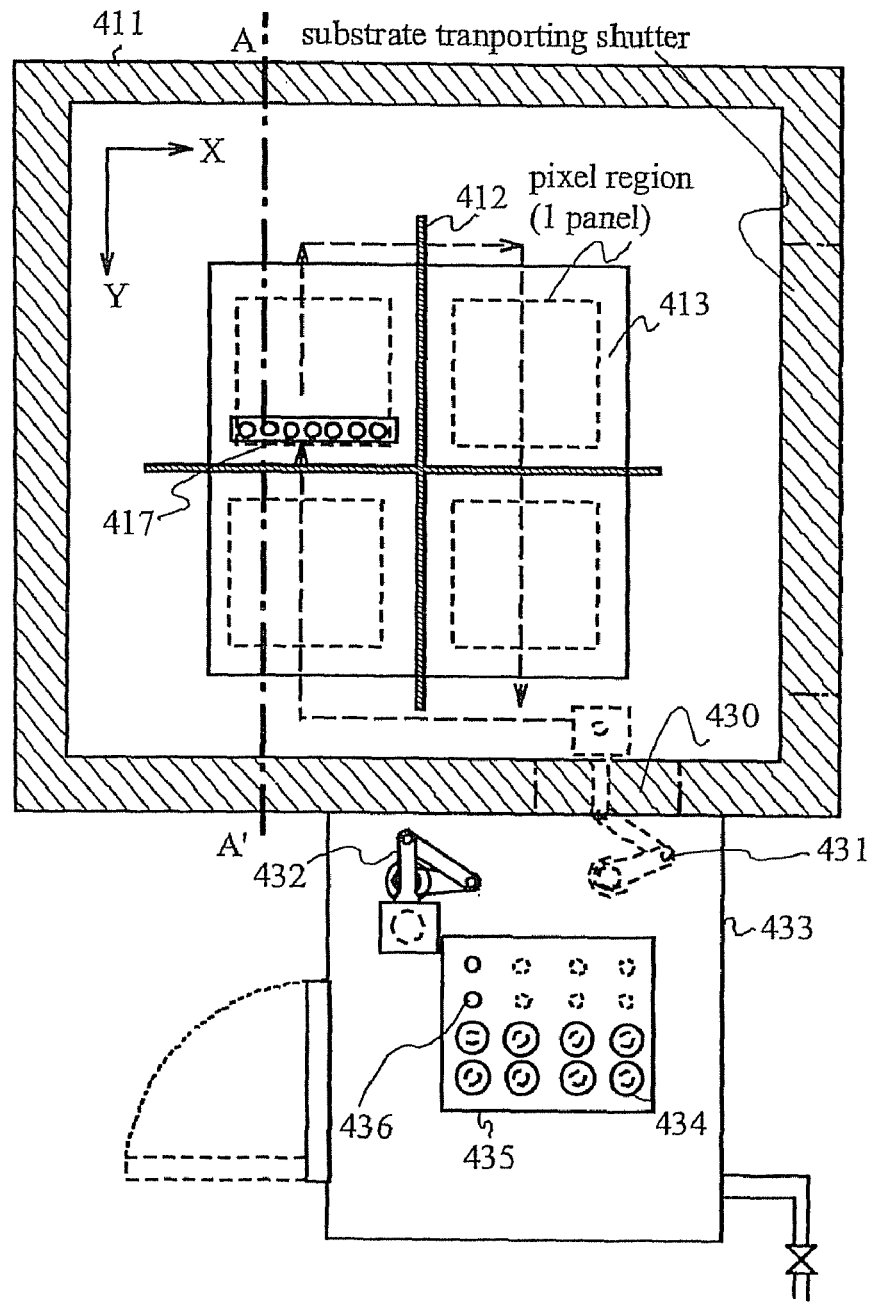

FIGS. 4A and 4B show a vapor deposition system according to the present invention. FIG. 4A is a cross sectional view in a Y-direction (taken along a dotted line A-A') and FIG. 4B is a top view. FIGS. 4A and 4B show the vapor deposition system in the midst of vapor deposition.

In FIG. 4A, a film formation chamber 411 has a substrate holding means 412, an evaporation source holder 417 provided with an evaporation shutter, a moving mechanism 420 for moving the evaporation source holder, and a means for producing the low pressure atomsphere. A large-sized substrate 413 and a deposition mask 414 are also installed in the film formation chamber 411. In addition, the deposition mask 414 made of metal is fixed in the substrate holding means 412 by gravitation and the substrate 413 is also fixed over the mask 414. Note that a vacuum suction mechanism may be provided for the substrate holding means 412 in order to perform vacuum suction to fix the mask It is preferable that deposits attached to the mask be vaporized to be evacuated to outside of a film formation chamber for cleaning the deposits attached to the mask by generating plasma in the film formation chamber by a plasma generating means. For the purpose, a high frequency power source is connected to the substrate holding means 412. Thus, it is preferable that the substrate holding means 412 be made from a conductive material (such as Ti). In the case of generating plasma, it is preferable to space a metal mask from the substrate holding means 412 electrically for preventing electric field concentration.

Further, a moving pitch of the evaporation source holder 417 may be appropriately matched to an interval between insulating substances 410 (it is also called bank or partition wall). Note that the insulating substance 410 is arranged to cover end portions of a first electrode 421.

An example of procedure for vapor deposition using a system shown in FIGS. 4A and 4B will be described below.

Firstly, a substrate transport shutter is opened to allow the large-sized substrate 413 to pass the substrate transport shutter and the substrate is transported in the film formation chamber 411. The substrate is installed over the substrate holding means 412 and the deposition mask 414 by an alignment means. In the large-sized substrate, there have been provided a TFT, a first electrode 421 or the insulating substance 410 in advance. The substrate 413 is transported in by face down method. In addition, it is preferable that the film formation chamber be always under reduced pressure, e.g. its degree of vacuum is $10^{-5}$ to $10^{-6}$ Pa, preferably.

Next, a second container 434 inside which a first container 436 is sealed with vacuum is transported through a door of an installation chamber 433 and mounted on a turntable 435.

Thereafter, the pressure inside the installation chamber 433 is reduced to equal degree of vacuum or more to that inside the second container 434 by a vacuum exhausting means. Then, only the second container 434 is lifted up by a hauling up mechanism 432 to expose the first container 436. The degree of vacuum of the film formation chamber is made equal to that of the installation chamber 433. After opening a shutter 430, the first container 436 is transported by a transport mechanism 431 to be installed in the evaporation source holder 417. Note that the first container may be heated in the installation chamber 433 in advance, before the first container is transported by the transport mechanism 431. The required number of the first containers is prepared in the evaporation source holder 417 and the shutter 430 is closed to start vapor deposition by resistance heating.

During the vapor deposition, the evaporation source holder 417 is moved in an X-direction or a Y-direction by the moving mechanism 420.

In the case of laminating different materials, the first container in which a material is finished being evaporated is transported back to the turntable and then another first container in which different material is filled is installed in the evaporation source holder and the container is moved in the X-direction or the Y-direction by moving mechanism 420.

After the vapor deposition is finished, the substrate transport shutter is opened in order that the substrate 413 is allowed to pass through the shutter and is transported out. Then, the first container is transported back to the evaporation source holder by the transport mechanism 431. Next, if necessary, in order to clean the deposition mask or the substrate holding means, multiple types of gases or one type of gas selected from the group consisting of Ar, H, $NF_3$, or O can be introduced, voltage is applied to the deposition mask with high frequency power source, and plasma is generated.

The present embodiment mode can freely be combined with Embodiment Mode 1 or Embodiment Mode 2.

Embodiment Mode 4

In this embodiment mode, an example in which a longitudinal direction of an evaporation source holder is set obliquely to aside of a substrate and another example in which a direction of a substrate is set obliquely to a movement direction of an evaporation source holder are described with reference to FIG. 5A and FIG. 5B.

In a case of the evaporation source holder in which a plurality of crucibles are aligned, since a frame (having a built-in heater, or a built-in cooling unit) in which a crucible is fit and fixed, a shutter, a film thickness monitor and the like are provided in a space between any two adjacent crucibles, there is a limit to narrowness of the space between any two adjacent crucibles even when crucibles are disposed as closely as possible to one another. Depending on an evaporation speed, a movement speed of the evaporation source holder, a size of a space between the evaporation source holder and the substrate, and the like, when the holder is moved perpendicularly to a longitudinal direction of the holder, film forming is not sufficiently performed on a portion corresponding to the space on the substrate, thereby being likely to generate an uneven film thickness. Particularly when the movement speed of the evaporation source holder is fast and the space between the substrate and the evaporation source is narrow, the uneven film thickness tends to be conspicuously generated. Further, a light-emission region becomes uneven due to the uneven film thickness, thereby being likely to generate a vertical or transversal streak.

Figure 5A:
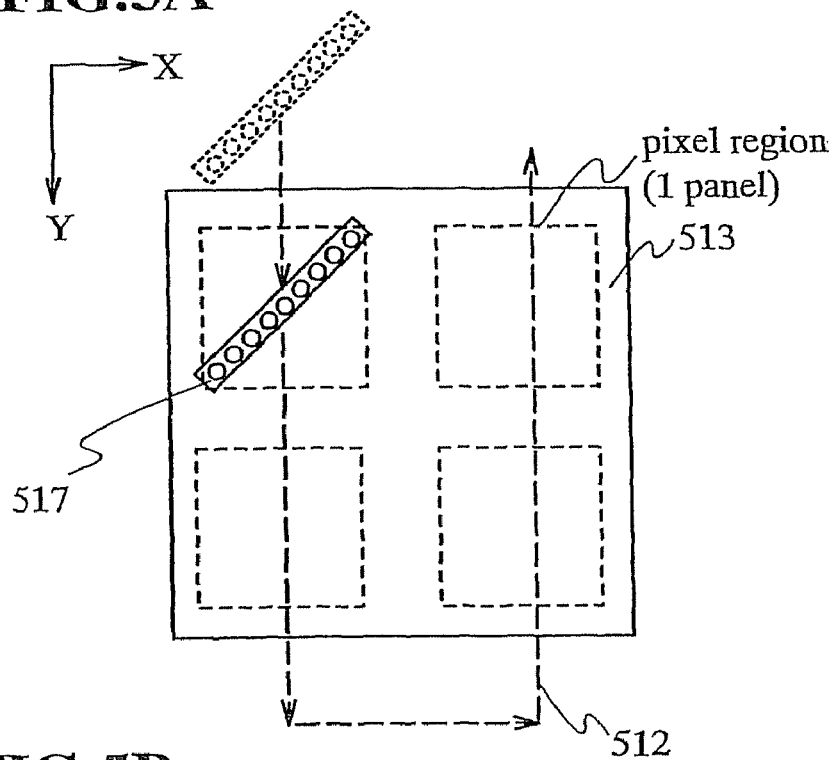
FIGS. 5A and 5B show a movement direction of an evaporation source holder, respectively (Embodiment Mode 4)

Under these circumstances, according to the present invention, as shown in FIG. 5A as an example, vapor deposition is performed while the evaporation source holder is moved in a Y direction by keeping a state in which a longitudinal direction of the evaporation source holder 517 is set to a direction at a given angle $Z(0°<Z<90°)$ with an X direction (or Y direction) of the substrate 513. For example, in a case in which the longitudinal direction of the evaporation source holder is set at $Z=45°$ with the X direction of the substrate and, then, the vapor deposition is performed while the evaporation source holder is moved in the Y direction, assuming that the space between any two adjacent crucibles is 1, the vapor-deposition is performed with the space of $1/\sqrt{2}$ to the X direction of the substrate. Therefore, the space (that in the X direction) between portions to be vapor-deposited becomes narrow whereupon film thickness in a pixel region is allowed to be uniform. However, in this case, since width of the region to be vapor deposited becomes narrow, the length of the evaporation source holder in a longitudinal direction and a number of crucibles may appropriately be determined such that a size of the evaporation source holder in the longitudinal direction is allowed to be longer in correspondence to that of the region to be vapor deposited.

Figure 5B:
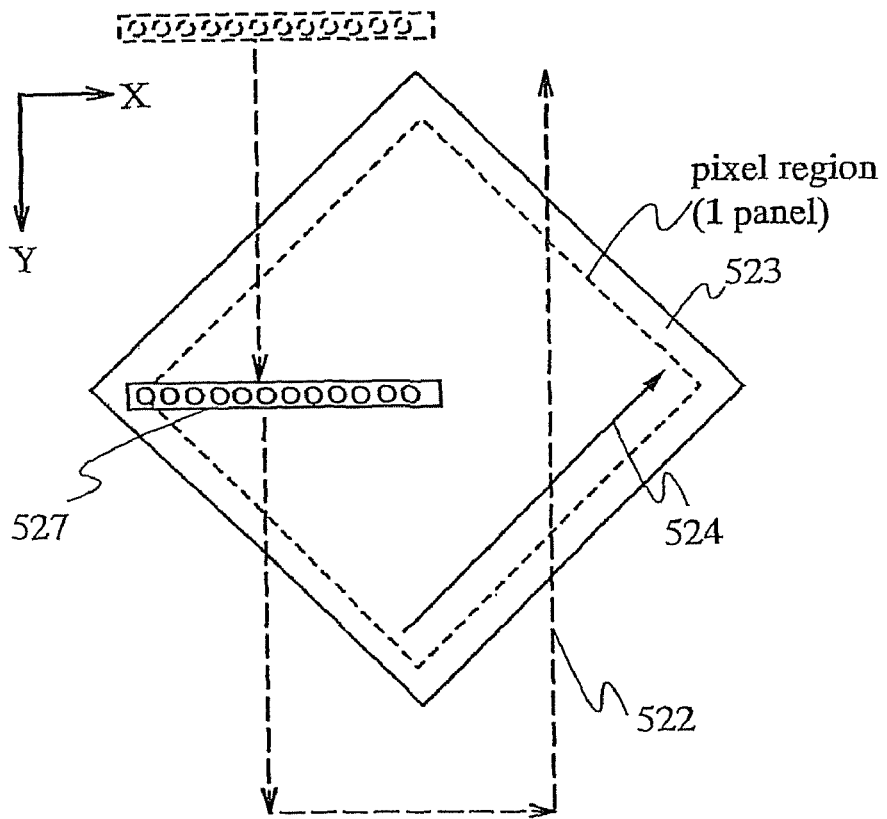

On the other hand, an evaporation source holder 527 may be moved along a path 522 while, as shown in FIG. 5B as an example, a substrate 523 itself is obliquely set, instead of setting the longitudinal direction of the evaporation source holder to be oblique to the X direction (or Y direction) of the substrate. In this case, film forming can be performed on an entire surface of the substrate as a whole by allowing the length in the longitudinal direction of the evaporation source holder to be longer than the length of a diagonal line of the substrate. When the length in the longitudinal direction of the evaporation source holder is shorter than that of a side of the substrate, film forming may be performed by repeating scanning several times. Further, a plurality of same thin films may be laminated by repeatedly moving the evaporation source holder along a same path.

Furthermore, at the time of forming a TFT, in a case in which a linear laser beam (pulse oscillation type) is used, scanning is performed with the laser beam in parallel with the X direction or the Y direction whereupon, when an energy of the laser beam is fluctuated, a state of crystallization differs from one irradiation region to another and, as a result, there is a risk of generating a streaked pattern (streaked pattern to be formed along a direction perpendicular to a scanning direction 524 of the laser beam) in a light-emission region.

For example, a laser beam (XeCl: wavelength is 308 nm) is irradiated on a silicon film having an amorphous constitution or a silicon film having a crystalline constitution in air or in an oxygen atmosphere and then, the semiconductor film having a crystalline structure obtained is allowed to be an active layer of a TFT. In this case, a pulse laser beam having a repetition frequency of approximately from 10 Hz to 1000 Hz may be used such that it is first condensed to from 100 mJ/cm$^2$ to 500 mJ/cm$^2$ by an optical system and, then, irradiated with an overlap ratio of from 90% to 95% to scan a surface of the silicon film.

In order to obtain a crystal having a large grain diameter at the time when an amorphous semiconductor film is crystallized, it is preferable to apply any one of from a second harmonic to a fourth harmonic of a fundamental wave by using a solid laser capable of continuously oscillating. As a representative example, a second harmonic (532 nm) or a third harmonic (355 nm) of Nd: YVO$_4$ laser (fundamental wave being 1064 nm) may be applied. When a continuously oscillating laser is used, a laser beam emitted from the continuously oscillating YVO$_4$ laser having an output power of 10 W is converted to a harmonic by a nonlinear optical device. There is also a method in which a YVO$_4$ crystal and the nonlinear optical device are contained in a resonator to emit a harmonic. Preferably, the laser beam is formed by using an optical system such that it becomes in a rectangular shape or an elliptical shape when irradiated on an irradiating face and then, irradiated on a processing object. On this occasion, an energy density of approximately from 0.01 MW/cm$^2$ to 100 MW/cm$^2$ (preferably from 0.1 MW/cm$^2$ to 10 MW/cm$^2$) is necessary and a semiconductor film may be irradiated while it is moved relatively to the laser beam at a speed of approximately from 10 cm/s to 2000 cm/s.

When the laser beam (continuously oscillating type) is used at the time of forming a TFT likewise, there is a risk of generating a streak (to be formed along a direction parallel to a scanning direction 524 of the laser beam) in the light-emission region. Therefore, it is preferable that a movement direction of the evaporation source holder in an elongated rectangular shape and a scanning direction of the laser beam are allowed to differ from each other and an angle between these directions is set to be in the range of more than 0° to less than 90°. In this manner, it becomes possible that a streaked pattern to be formed by the laser beam is less conspicuous and, also a streak to be generated by a space between any two adjacent containers provided on the evaporation source holder or a streak to be generated by a difference of the movement speed of the evaporation source holder is less conspicuous.

In this embodiment mode, a case in which the evaporation source holder is moved while the substrate is fixed is illustrated. However, another case in which the substrate is moved while the evaporation source holder is fixed is permissible.

This embodiment mode can freely be combined with any one of Embodiment Modes 1 to 3.

Further, in the above description, a case in which three layers of a hole transporting layer, a light emitting layer, and an electron transporting layer are laminated with one another that composes a layer containing an organic compound to be provided between a cathode and an anode has been explained as a representative example; however, the layer structure is not limited to a specific type and a structure in which a hole injection layer/a hole transporting layer/a light emitting layer/ an electron transporting layer, or a hole injection layer/a hole transporting layer/a light emitting layer/an electron transporting layer/an electron injection layer are laminated with one another on the anode in the above-stated order, a double-layer structure or a monolayer structure is permissible. In any of the above-described structures, a fluorescent dye or the like may be doped in the light emitting layer. Further, examples of such light emitting layers include a light emitting layer having a hole transport property and a light emitting layer having an electron transport property. All of these layers may be formed by using a low molecular-type material, or one layer or some layers thereof may be formed by using a polymer-type material. Still further, in this specification of the present invention, all layers to be provided between the cathode and anode are generically referred to as a layer containing an organic compound (EL layer). Therefore, all of the above-described hole injection layer, hole transporting layer, light emitting layer, electron transporting layer and electron injection layer are included in the EL layer. Furthermore, the layer containing the organic compound (EL layer) may contain an inorganic material such as silicon.

The light emitting device (EL device) comprises a layer (hereinafter referred to as "EL layer") containing an organic compound that can obtain luminescence (Electro Luminescence) to be generated by being applied with an electric field, an anode, and a cathode. There are two types of luminescence to be obtained by the organic compound, that is, one type of luminescence (fluorescence) is generated at the time a singlet excited state undergoes a transmission to a ground state and the other type of luminescence (phosphorescence) is generated at the time a triplet excited state undergoes a transmission to the ground state. A light emitting apparatus to be prepared according to the invention can be applied to a case in which any one type of these luminescences is used.

Further, in the light emitting apparatus according to the present invention, a drive method for a screen display is not particularly limited and, for example, any one of a point sequential drive method, a line sequential drive method and a face sequential drive method may be used. As a representative example, the line sequential drive method is adopted and a time division gradation drive method or an area gradation drive method may appropriately be used. A video signal to be inputted to a source line of the light emitting apparatus may either be an analog signal or a digital signal whereupon a driver circuit or the like may appropriately be designed in accordance with the video signal.

Herein, a light emitting device comprising a cathode, an EL layer and an anode is denoted as the EL device whereupon there are two types of systems in such EL devices, that is, one system (simple matrix system) in which an EL layer is formed between two types of electrodes each in a stripe state which are orthogonally provided to each other and the other system (active matrix system) in which an EL layer is formed between a pixel electrode and a counter electrode which are connected to the TFT and are arrayed in a matrix state.

Further, not only the TFT in which a semiconductor film having a crystalline structure is allowed to bean active layer, but also an n channel-type TFT in which an amorphous silicon is allowed to be an active layer or the TFT in which a semi-amorphous semiconductor (hereinafter referred to also as "SAS") is allowed to be an active layer may be used. By allowing the amorphous silicon film or the semi-amorphous silicon film to be the active layer of the TFT, a number of process steps at the time of producing the TFT can be reduced compared with the TFT which uses a polycrystalline semiconductor film whereupon a yield rate of the light emitting apparatus is enhanced and, also, a production cost is suppressed.

The present invention which provides the above-described structure will be described in detail with reference to embodiments to be illustrated below.

Embodiment 1

In the present embodiment, an example of a multi-chamber fabrication system in which an entire process from vapor deposition over a first electrode to sealing is automated is described with reference to FIG. 10.

Figure 10:
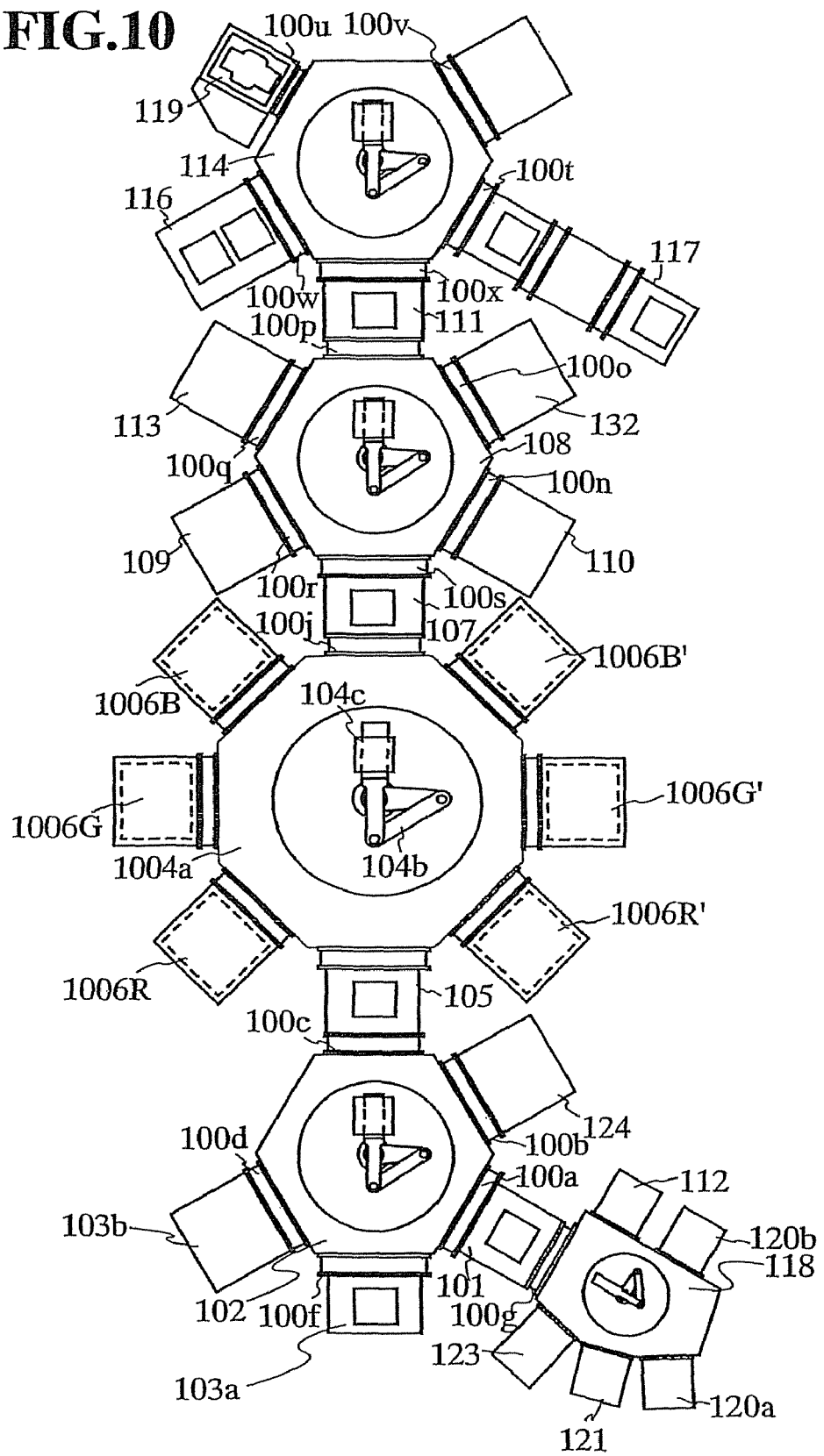
FIG. 10 shows a fabrication system (Embodiment 1)

FIG. 10 is a multi-chamber fabrication system that includes: gates 100a to 100x; transport chambers 102, 1004a, 108, 114, and 118; delivery chambers 105, 107, and 111; a load chamber 101; a first film formation chamber 1006R; a second film formation chamber 1006G; a third film formation chamber 1006B; a fourth film formation chamber 1006R'; a fifth film formation chamber 1006G'; a sixth film formation chamber 1006B'; other film formation chambers 109, 110, 112, 113, and 132; installation chambers in each of which evaporation source is set; pretreatment chambers 103a and 103b; a sealing chamber 116; a mask stock chamber 124; a sealed substrate stock chamber 130; a cassette chambers 120a and 120b, a tray loading stage 121; and a extraction chamber 119. In the transport chamber 1004a, a transport mechanism 104b is provided for transporting a substrate 104c and in a similar way, respective transport mechanisms are also provided for other transport chambers.

Hereinafter, a process comprising a step of transporting a substrate over which an anode (first electrode), and an insulator (partition wall) covering an end portion of the anode have previously been provided, into a fabrication system as shown in FIG. 10 and a step of fabricating a light emitting apparatus is described. When an active matrix type light emitting apparatus is manufactured, a thin film transistor (current-controlling TFT) which is connected to the anode, a plurality of other thin film transistors (for example, switching TFT) and a driver circuit comprising a thin film transistor have previously been provided for a substrate. Even when a passive matrix type light emitting apparatus is manufactured, the apparatus can be manufactured by using the fabrication system as shown in FIG. 10.

Firstly, the above-described substrate is set in the cassette chamber 120a or the cassette chamber 120b. When the substrate is large in size (for example, 300 mm×360 mm), the substrate is set in the cassette chamber 120b. When the substrate is of a normal size (for example, 127 mm×127 mm), the substrate is set in the cassette chamber 120a. Then, the thus-set substrate is transported into the tray loading stage 121 where a plurality of substrates are set on a tray (for example, 300 mm×360 mm).

The substrate (over which an anode and an insulator that covers an end portion of the anode are formed) which is set in either of the cassette chambers is transported into the transport chamber 118.

Before the substrate is set in either of the cassette chambers, in order to reduce a spot defect, it is preferable that a surface of the first electrode (anode) be cleaned by using a porous sponge (for example, being made of polyvinyl alcohol (PVA), or nylon) impregnated with a surfactant (being alkalescent), thereby removing dust from the surface thereof. As for a cleaning mechanism, a cleaning apparatus having a roll brush (for example, made of PVA) which rotates around an axis line parallel to a face of a substrate to contact the face of the substrate may be used, or another cleaning apparatus having a disk brush (for example, made of PVA) which rotates around an axis line vertical to a face of a substrate to contact the face of the substrate may be used. Further, before a film containing an organic compound is formed, in order to remove moisture or other gases contained in the substrate, it is preferable that annealing for degasification be performed on the substrate under vacuum. The substrate is transported into a bake chamber 123 connected to the transport chamber 118, and then, such annealing may be performed in the bake chamber 123.

Subsequently, the resultant substrate is transported from the transport chamber 118, which is provided with a substrate transport mechanism, into the load chamber 101. In the fabrication system according to the present embodiment, the load chamber 101 is provided with a substrate reversal mechanism which can appropriately reverse the substrate. The load chamber 101 is connected to a vacuum exhaust treatment chamber. It is preferable that, after the load chamber 101 is evacuated to a vacuum state, the load chamber 101 allows an inert gas to introduce thereinto, thereby the load chamber 101 is under an atmospheric pressure.

Subsequently, the substrate is transported into the transport chamber 102 connected to the load chamber 101. It is preferable that, in order to allow an inside of the transport chamber 102 to be free from moisture or oxygen as much as possible, the inside thereof have previously been evacuated to a vacuum state so that the vacuum state is maintained.

Further, the vacuum exhaust treatment chamber is provided with a magnetically floating type turbo-molecular pump, a cryopump, or a drypump. In such structure, an ultimate vacuum degree in the transport chamber 102 connected to the load chamber 101 is allowed to be in the range of from $10^{-5}$ Pa to $10^{-6}$ Pa, and further, back diffusion of impurities from a pump side and an exhaust system can be controlled. In order to prevent the impurities from being introduced into the inside of the system, as for a gas to be introduced, an inert gas, for example, a nitrogen gas, or a noble gas is used. Any one of these gases to be introduced inside the system is highly purified by a gas purifier before it is introduced into inside the system, and then, used. Accordingly, it is necessary to provide the gas purifier so that the gas is firstly highly purified and then, introduced into inside the vapor deposition system. Under such structure, since oxygen, moisture, or any other impurities contained in the gas can be removed in advance, these impurities can be prevented from being introduced into inside the apparatus.

Further, when a film containing an organic compound formed in an unnecessary part is required to be removed, the resultant substrate is transported into the pretreatment chamber 103a where a laminated layer of films containing the organic compound, then, may selectively be removed. The pretreatment chamber 103a is provided with a plasma generator in which a gas or a plurality of gases of at least one element selected from the group consisting of Ar, H, F, and O are excited to generate plasma, and then, dry etching is performed by the thus-generated plasma. Further, a UV irradiation mechanism may be provided in the pretreatment chamber 103a in order that an ultraviolet ray irradiation can be executed to perform an anode surface treatment.

In order to be free from shrinkage, it is preferable that vacuum heating be performed immediately before a film containing an organic compound is formed by vapor deposition. The resultant substrate is transported into the pretreatment chamber 103b where, in order to thoroughly remove moisture, or any other gases contained in the substrate, annealing for degasification is performed on the substrate under vacuum (a degree thereof being $5\times10^{-3}$ Torr (0.665 Pa) or less and, preferably, in the range of from $10^{-4}$ Torr to $10^{-6}$ Torr). In the pretreatment chamber 103b, a plate heater (sheath heater as a typical example) is used to uniformly heat a plurality of substrates. Particularly, when an organic resin film is used as a material of an interlayer insulating film or a partition wall, an organic resin material tends to absorb moisture depending on a type thereof. Since there is a risk of degasification, it is effective that, before a layer containing an organic compound is formed, the organic resin material is heated at a temperature in the range of from 100° C. to 250° C., preferably in the range of from 150° C. to 200° C., for example, for 30 minutes or more and then, the thus-heated organic resin material is left to stand in air for spontaneous cooling for 30 minutes to perform vacuum heating for removing absorbed moisture.

Subsequently, after the above-described vacuum heating, the resultant substrate is transported from the transport chamber 102 to the delivery chamber 105 and then, the substrate is transported without being exposed to air from the delivery chamber 105 to the transport chamber 1004a.

Thereafter, the substrate is appropriately transported into each of the film formation chambers 1006R, 1006G, and 1006B each of which is connected to the transport chamber 1004a. Over the thus-transported substrate, a low molecular weight organic compound layer which includes a hole injection layer, a hole transporting layer, a light emitting layer, an electron transporting layer, or an electron injection layer is appropriately formed.

Further, in the film formation chamber 112, the hole injection layer comprising a polymer material may be formed by ink-jetting or spin coating method. Still further, the substrate is vertically placed and, then, film-forming is performed on the substrate under vacuum by inkjetting. An aqueous solution of poly(ethylene dioxythiophene)/poly (styrenesulfonic acid) (referred to also as PEDOT/PSS), an aqueous solution of polyaniline/camphor sulfonic acid (referred to also as PANI/CSA), PTPDES, Et-PTPDEK, PPBA or the like which acts as the hole injection layer (anode buffer layer) may be applied over an entire surface of the first electrode (anode) and baked. It is preferable that such baking is performed in the bake chamber 123. When the hole injection layer comprising a polymer material is formed by coating such as spin coating, a degree of flatness is improved whereby coverage and uniformity in thickness of a film to be formed thereon are allowed to be favorable. Particularly, since film thickness of the light emitting layer becomes uniform, a uniform luminescence can be obtained. In this case, it is preferable that, after the hole injection layer is formed by coating, vacuum heating (100° C. to 200° C.) is performed on the thus-formed hole injection layer immediately before film-forming is performed by vapor deposition. The vacuum heating may be performed in the pretreatment chamber 103b. For example, after a surface of the first electrode (anode) is cleaned by using a sponge, the substrate is transported into a cassette chamber, and then, the film formation chamber 112. After the aqueous solution of poly(ethylene dioxythiophene)/poly(styrene sulfonic acid) (PEDOT/PSS) is applied on an entire surface of the first electrode (anode) with a film thickness of 60 nm by spin coating, the resultant substrate is transported into the bake chamber 123, pre-baked at 80° C. for 10 minutes, baked in a full scale at 200° C. for one hour and, thereafter, transported into the pretreatment chamber 103b. Furthermore, after vacuum heating (heating at 170° C. for 30 minutes followed by cooling for 30 minutes) is performed immediately before vapor deposition is performed, the resultant substrate transported sequentially into the film formation chambers 1006R, 1006G, and 1006B where respective light emitting layers may be formed by vapor deposition without exposing the substrate to air. Particularly, in a case in which, when an ITO film is used as a material for the anode, a surface thereof is not uniform or a minute particle is present on the surface thereof, such detrimental influences can be decreased by allowing a film thickness of PEDOT/PSS to be 30 nm or more.

Further, when PEDOT/PSS is applied on the ITO film, wettability thereof is not favorable; therefore, it is preferable that, after a PEDOT/PSS solution is applied at a first time by using spin coating, the resultant PEDOT/PSS is rinsed with pure water, thereby enhancing the wettability thereof, and then, the PEDOT/PSS solution is applied at a second time by using spin coating, and thereafter, baked to form a film favorable in uniformity. By rinsing the surface with pure water after a first application is performed, effects not only of improving a quality of the surface but also removing a minute particle or the like from the surface can be achieved.

Further, when a film of PEDOT/PSS is formed by using spin coating, the film is formed on an entire surface of the substrate. Therefore, the film formed on each of an end portion, a peripheral portion, a terminal portion, a connecting region between the cathode, a lower wiring and the like are preferably removed and, in this case, such removal is preferably performed in the pretreatment chamber 103a by means of $O_2$ ashing or the like.

Next, the film formation chambers 1006R, 1006G, and 1006B will be described below.

Each of the film formation chambers 1006R, 1006G, and 1006B is provided with a movable evaporation source holder. A plurality of such holders are prepared, appropriately provided with a plurality of containers (crucibles) which have appropriately been filled with an EL material in a sealed manner, and set in the film formation chambers each. The substrate is set in a face down manner, a position alignment of a deposition mask is performed by CCD or the like. Then, film-forming can selectively be performed by executing vapor deposition by resistance heating. Further, the deposition mask is stored in a mask stock chamber 124 and it is properly transported from there to a film formation chamber. Still further, the film formation chamber 132 is a vapor film formation chamber in reserve for forming a layer containing an organic compound or a metal material layer.

Setting the EL material in these film formation chambers is preferably performed by using a manufacturing system as described below. Namely, it is preferable that the film-forming is performed by using the EL material which has previously been put in a container (crucible as a typical example) by a material manufacturer. Further, the setting is preferably executed without exposing the EL material to air; therefore, it is preferable that, when the container, namely, crucible, is delivered from the material manufacturer, the crucible is put in a second container in a sealed manner and then introduced into the film formation chamber as it is. Desirably, each installation chamber (not shown in the figure) which is provided by a vacuum exhausting means, connected to respective film formation chambers 1006R, 1006G, 1006B, 1006R', 1006G', and 1006B' are allowed to be in a vacuum state or an inert gas atmosphere, and under these circumstances the crucible is taken out of the second container to set the crucible in any one of the film formation chambers. Note that, examples of an installation chamber are shown in FIG. 1 and FIG. 4. In such manner, not only the crucible but also the EL material put in the crucible are prevented from being contaminated. It is, also, possible that the metal mask is stored in such installation chamber.

By appropriately selecting the EL material to be set in respective film-forming chambers 1006R, 1006G, 1006B, 1006R', 1006G' and 1006B', the light emitting device which emits either mono-color (specifically white color) or full-color (specifically red, green, and blue colors) light as a whole body of the light emitting device can be manufactured. For example, when a green-color light emitting device is fabricated, a hole transporting layer or a hole injection layer, a light emitting layer (G), and an electron transporting layer or an electron injection layer are laminated in this sequence in the film formation chamber 1006G and then, a cathode is formed on the resultant laminated layer to obtain the green-color light emitting device. For example, when a full-color light emitting device is fabricated, a hole transporting layer or a hole injection layer, a light emitting layer (R), and an electron transporting layer or an electron injection layer are laminated in this sequence in the film formation chamber 1006R by using a deposition mask prepared exclusively for R, and then, a hole transporting layer or a hole injection layer, a light emitting layer (G), and an electron transporting layer or an electron injection layer are laminated in this sequence over the above-described-formed laminated layer in the film formation chamber 1006G by using a deposition mask prepared exclusively for G and, thereafter, a hole transporting layer or a hole injection layer, a light emitting layer (B), and an electron transporting layer or an electron injection layer are laminated in this sequence over the above-described-formed laminated layer in the film formation chamber 1006B by using a deposition mask prepared exclusively for B and, subsequently, a cathode is formed over the resultant laminated layer to obtain the full-color light emitting device.

Further, in a case of laminating light emitting layers having different luminescent colors from one another, an organic compound layer which shows a white-color luminescence is roughly classified into two types, namely, a 3 wavelength type which contains 3 primary colors of red, green and blue and a 2 wavelength type which utilizes a relationship of complimentary colors of blue/yellow or bluish green/orange. It is also possible to fabricate a white-color light emitting device in one film formation chamber. For example, when the white-color light emitting device is fabricated by using the 3 wavelength type, a plurality of evaporation source holders are prepared in one film formation chamber and therein, an aromatic diamine (TPD) is filled in a first evaporation source holder in a sealed manner, p-EtTAZ is similarly filled in a second evaporation source holder, Alq3 is similarly filled in a third evaporation source holder, an EL material in which Alq3 is added with Nile Red that is a red luminescent pigment is similarly filled in a fourth evaporation source holder, and Alq3 is similarly filled in a fifth evaporation source holder. Then, the first to fifth evaporation source holders are set in respective film formation chambers. Thereafter, the first to fifth evaporation source holders start to move in sequence, and then vapor deposition is performed on the substrate in a lamination manner. Specifically, TPD is sublimated from the first evaporation source holder by heating, thereby being deposited on an entire surface of the substrate. Thereafter, p-EtTAZ is sublimated from the second evaporation source holder, Alq3 is sublimated from the third evaporation source holder, Alq3:Nile Red is sublimated from the fourth evaporation source holder, and Alq3 is sublimated from the fifth evaporation source holder whereupon all these sublimated materials are deposited on an entire surface of the substrate in order. Subsequently, when a cathode is formed on the resultant substrate, a white-color light emitting device can be fabricated.

After the layers each containing the organic compound are appropriately laminated in accordance with the above-described process, the substrate is transported from the transport chamber 104a to the delivery chamber 107 and, further, from the delivery chamber 107 to the transport chamber 108 without exposing the substrate to air.

Next, the substrate is transported into the film formation chamber 110 by a transport mechanism provided in the transport chamber 108, and then, a cathode is formed over the substrate in the film formation chamber 110. As for the cathode, a metal film (a film of an alloy of, for example, MgAg, MgIn, $CaF_2$, LiF, or CaN, a film formed by using an element belonging to group I or II in the periodic table and aluminum by means of co-vapor deposition, or a laminate thereof) formed by utilizing resistance heating by means of vapor deposition is used. Further, the cathode may also be formed by sputtering.

When a top emission type light emitting apparatus is manufactured, it is preferable that a cathode is transparent or translucent. It is also preferable that a thin film (1 nm to 10 nm) of the above-described metal film, or a laminate of the thin film (1 nm to 10 nm) of the above-described metal film and a conductive transparent film is allowed to be the cathode. In this case, a film comprising the transparent conductive film (for example, indium oxide-tin oxide alloy (ITO), indium oxide-zinc oxide alloy (In2O3-ZnO), or zinc oxide (ZnO)) may be formed in the film formation chamber 109 by sputtering method.

A light emitting device having a laminated layer is manufactured by the process described above.

Further, the substrate is transported into the film formation chamber 113 connected to the transport chamber 108, and then, in the film formation chamber 113, a protective film comprising a silicon nitride film or a silicon oxynitride film may be formed to seal it. A target comprising silicon or a target comprising silicon oxide, or a target comprising silicon nitride is provided in the film formation chamber 113. For example, a silicon nitride film can be formed over the cathode by using a target comprising silicon and by allowing the inside of the film formation chamber to be in a nitrogen gas atmosphere or an atmosphere containing nitrogen and argon gases. Further, a thin film (for example, DLC film, CN film, or amorphous carbon film) containing carbon as a primary component may be formed as a protective film, and separately, a film formation chamber using chemical vapor deposition (CVD) may be provided. A diamond-like carbon film (referred to also as DLC film) can be formed by at least one method selected from among plasma CVD (as a typical example, RF plasma CVD, microwave CVD, electron cyclotron resonance (ECR) CVD, or hot-filament CVD), combustion-flame, sputtering, ion beam vapor deposition, and laser vapor deposition. As for reaction gases to be used in film-forming, a hydrogen gas, and at least one of hydrocarbon-type gases (for example, $CH_4$, $C_2H_2$, and $C_6H_6$) are used. These gases are ionized by glow discharge, and after being accelerated in velocity, the resultant ions collides with a cathode which is applied with negative self-bias, thereby forming a film. Further, the CN film may be formed by using $C_2H_4$ gas and $N_2$ gas as reaction gas. Still further, the DLC film or the CN film is a transparent or translucent insulating film against visible light. The term "transparent against visible light" used herein is intended to mean that a transmission factor of the visible light is in the range of from 80% to 100% while the term "translucent against visible light" used herein is intended to mean that a transmission factor of the visible light is in the range of from 50% to 80%.

In the present embodiment, a protective film that is a laminate comprising a first inorganic insulating film, a stress relaxing film, and a second inorganic insulating film is formed over a cathode. For example, it is permissible that, after the cathode is formed, the substrate is transported into the film formation chamber 113 where the first inorganic insulating film is formed and, then, the resultant substrate is transported into the film formation chamber 132 where the stress relaxation layer (for example, a layer containing an organic compound) having a hygroscopic property and transparency is formed thereon and, thereafter, the resultant substrate is transported back to the film formation chamber 113 where the second inorganic insulating film is formed thereon.

Next, the substrate over which a light emitting device is thus formed is transported from the transport chamber 108 to the delivery chamber 111 without exposing the substrate to air, and then, from the delivery chamber 111 to the transport chamber 114. Subsequently, the substrate over which the light emitting device is formed is transported from the transport chamber 114 to the sealing chamber 116.

A sealed substrate is set in a load chamber 117 from outside and ready to be processed. Further, it is preferable that, in order to remove impurities such as moisture, the substrate has previously been subjected to annealing under vacuum. When a sealing material is formed for bonding the sealed substrate with the substrate over which the light emitting device is formed, the sealing material is formed in the sealing chamber and the sealed substrate over which the sealing material was formed is transported into the sealed substrate stock chamber 130. Further, a desiccant may be attached to the sealed substrate in the sealing chamber. Still further, in the present embodiment, an example in which the sealing material is formed over the sealed substrate is described; however, the present invention is by no means limited to the example and the sealing material may be formed over the substrate over which the light emitting device has previously been formed.

Next, the substrate and the sealed substrate are bonded to each other in the sealing chamber 116, and then, the thus-bonded pair of substrates is irradiated with ultraviolet light by using an ultraviolet ray irradiation mechanism provided in the sealing chamber 116 to cure the sealing material. Further, in the present embodiment, an ultraviolet ray-curing type resin is used as the sealing material; however, no particular limitation is put on the sealing material so long as it is an adhesive.

Subsequently, the thus-bonded pair of substrates is transported from the sealing chamber 116 to the transport chamber 114, and then, from the transport chamber 114 to the extraction chamber 119 where the resultant substrate is taken out.

As described above, since the light emitting device is not exposed to air at all until it is sealed in a sealed space by using the fabrication system as shown in FIG. 10, a light emitting apparatus having high reliability can be manufactured. Further, although a vacuum state and a nitrogen atmosphere under an atmospheric pressure are alternately repeated in the transport chambers 114 and 118, it is preferable that the transport chambers 102, 1004a, and 108 are consistently maintained in a vacuum state.

Although not shown, a control device, which realizes automation by controlling a pathway along which the substrate is moved into each treatment chamber, is provided.

Further, in the fabrication system as shown in FIG. 10, it is also possible that a substrate, over which a transparent conductive film (or metal film (TiN)) is provided as an anode is transported in, and after a layer containing an organic compound is formed over the substrate, a transparent or translucent cathode (for example, a laminate of a thin metal film (for example, Al, or Ag) and a transparent conductive film) is formed over the resultant substrate to fabricate an top emission type (or top-bottom emission type) of light emitting device. The term "top emission type light emitting device" used herein is intended to mean an device which takes out luminescence that is generated in the organic compound layer by allowing it to pass through the cathode.

Further, in the fabrication system as shown in FIG. 10, it is also possible that a substrate, over which a transparent conductive film is provided as an anode, is transported in, and, after a layer containing an organic compound is formed over the substrate, a cathode comprising a metal film (for example, Al, or Ag) is formed over the substrate to fabricate a bottom emission type light emitting device. The term "bottom emission type light emitting device" used herein is intended to mean an device which takes out luminescence that is generated in the organic compound layer from a transparent electrode, namely, an anode, in the direction of TFT, and further, allows the luminescence to pass through the substrate.

An example of a system capable of manufacturing full color light emitting devices in parallel is shown in FIG. 10. For example, vacuum heating is performed on substrates in the pretreatment chamber 103b, and the substrates are then transported from the transport chamber 102 to the transport chamber 1004a via the delivery chamber 105. Films are laminated on a first substrate through a pathway via the film formation chambers 1006R, 1006G, and 1006B, and films are laminated on a second substrate through a pathway via the film formation chambers 1006R', 1006G', and 1006B'. Throughput can thus be improved by carrying out vapor deposition on a plurality of substrates in parallel. A light emitting apparatus can be completed by sealing after cathode formation.

Moreover, the first to third film formation chambers 1006R, 1006G and 1006B can be used to sequentially perform vapor deposition, even when the fourth to sixth film formation chambers 1006R', 1006G' and 1006B' are under maintenance, although the number of substrates to be processed is reduced.

Further, hole transporting layers, light emitting layers, and electron transporting layers of R, G and B colors each may also be laminated in three different film formation chambers. Note that mask alignment is performed respectively before carrying out vapor deposition, so that the films are only formed in predetermined regions. It is preferable to use different masks for each of the different colors in order to prevent color mixing, and three masks are necessary in this case. In the case of processing plural substrates, for example, the following procedures may be performed. A first substrate is placed in the first film formation chamber, and a layer that contains a red color light emitting organic compound is formed. The first substrate is then removed, and placed next in the second film formation chamber. A second substrate is placed in the first film formation chamber while a layer that contains a green color light emitting organic compound is formed on the first substrate, and a layer that contains the red color light emitting organic compound is formed on the second substrate. The first substrate is lastly placed in the third film formation chamber. The second substrate is placed in the second film formation chamber, and a third substrate is placed in the first film formation chamber, while a layer that contains a blue color light emitting organic compound is formed on the first substrate. Laminations may thus be performed sequentially.

Further, the hole transporting layers, the light emitting layers, and the electron transporting layers of R, and B colors each may also be laminated in one film formation chamber. Three type of material layers, corresponding to R, G and B, may be formed selectively by performing mask positioning through shifting the mask during mask alignment, if the hole transporting layers, the light emitting layers, and the electron transporting layers of R, G, and B colors each are laminated consecutively in the one film formation chamber. The mask is shared in this case, and only one mask is used.

The present embodiment can freely combined with any one of Embodiment Modes 1 to 4.

Embodiment 2

In this embodiment, described is an example of a device having respective functions of a plurality of various types of materials as well as a function of performing division of functions of a laminated structure, in addition to a function of enhancing mobility of a carrier by relaxing an energy barrier in a film containing an organic compound.

In regard to relaxation of the energy barrier in the laminated structure, a technique of inserting a carrier injection layer is well referred to. That is, by inserting a material that relaxes the energy barrier present in an interface of the laminated structure having a large energy barrier into the interface, a design for setting the energy barrier in a stepwise patter can be made. By making such design, a property of a carrier injection from an electrode can be enhanced to surely reduce a drive voltage to certain extent. However, there is a problem in that, by increasing the number of layers, the number of organic interfaces is increased as well. It is considered that such feature is the reason why a single layer structure rather holds top data of drive voltage/power efficiency. In other words, by overcoming the problem, the laminated structure can reach the drive voltage/power efficiency of the single layer structure, while maintaining a merit (capability of combinations of various types of materials free from necessity of a complicated design of molecules) of the laminated structure.

In this embodiment, when a film containing an organic compound comprising a plurality of functional regions is formed between a cathode and an anode of a light emitting device, a structure having a mixed region, which is different from a conventional laminated structure in which a distinct interface is present, comprising both a material which constitutes a first functional region and another material which constitutes a second functional region is formed between the first functional region and the second functional region.

This embodiment also includes the case where a material that is capable of converting triplet excitation energy into luminescence is added to the mixed region as a dopant. In the formation of the mixed region, the mixed region may be formed to have a concentration gradient.

It is considered that, by applying such structure as described above, the energy barrier which is present between functional regions is reduced compared with the conventional structure, thereby enhancing the carrier injection property. That is, the energy barrier between functional regions is relaxed by forming the mixed region and, accordingly, prevention of reduction of drive voltage and luminance can be realized.

Therefore, in this embodiment, when a light emitting device comprising at least a region (referred to as a first functional region) in which a first organic compound can exhibit a function thereof and another region (referred to as a second functional region) in which a second organic compound, being made from substance different from a substance which constitutes the first functional region, can exhibit a function thereof, and a light emitting apparatus comprising such light emitting device are manufactured, a mixed region, containing the organic compound which constitutes the first functional region and another organic compound which constitutes the second functional region, is prepared between the first functional region and the second functional region.

In the film formation system shown in FIG. 1, a plurality of rectangular evaporation source holders can be used. Accordingly, a film containing an organic compound having a plurality of functional regions can be formed in one film formation chamber, and a plurality of evaporation source holders are provided in correspondence with the plurality of functional regions in the film formation system.

Firstly, a first organic compound is vapor deposited by using a first evaporation source holder. The first organic compound, which has previously been vaporized by resistance heating, is scattered in the direction of a substrate by opening a first shutter at the time of vapor deposition. A first functional region 610 shown in FIG. 11B can be formed by repeatedly moving the first evaporation source holder.

Next, during a state in which the first organic compound is being vapor deposited, a second evaporation source holder is made to move to vapor deposit a second organic compound. Further, the second organic compound which has also previously been vaporized by resistance heating is scattered in the direction of the substrate by opening a second shutter at the time of vapor deposition. A first mixed region 611 made with the first organic compound and the second organic compound can be formed.

The first evaporation source holder is stopped and the second organic compound is vapor deposited on the substrate by repeatedly moving the second evaporation source holder. Thereby, a second functional region 612 can also be formed.

Further, in this embodiment, a case in which the mixed region is formed by simultaneously moving multiple evaporation source holders in order to vapor deposit is described. However, it is also possible that the first organic compound is firstly vapor deposited and, then, it is also possible that a mixed region is formed between the first functional region and the second functional region by allowing the second organic compound to be vapor deposited in the atmosphere in which the first organic compound is vapor deposited.

Subsequently, during a state in which the second organic compound is being vapor deposited, a third evaporation source holder is moved to vapor deposit a third organic compound. Further, the third organic compound, which has also previously been vaporized by resistance heating, is scattered in the direction of the substrate by opening a third shutter at the time of vapor deposition. A second mixed region 613 made with the second organic compound and the third organic compound can be formed.

Then, the second evaporation source holder is stopped and the third evaporation source holder is moved repeatedly to allow the third organic compound to be vapor deposited and thus, a third functional region 614 can also be formed.

Finally, a light emitting device is completed by forming a cathode on the resultant substrate.

Figure 11A:
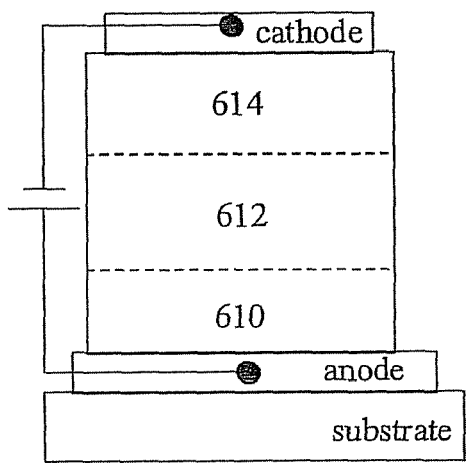
FIGS. 11A to 11D show structures of devices (Embodiment 2)
Figure 11B:
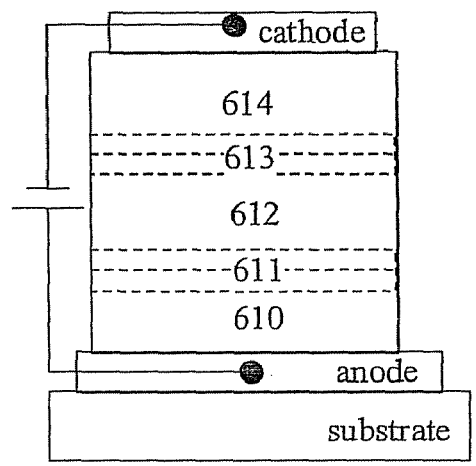

Furthermore, FIG. 11A shows an example of a light emitting device in which no mixed region is provided. The first functional region 610, the second functional region 612, and the third functional region 614 are vapor deposited sequentially and formed by using the system shown in FIGS. 4A and 4B, and then a cathode is formed to complete the light emitting device.

Figure 11C:
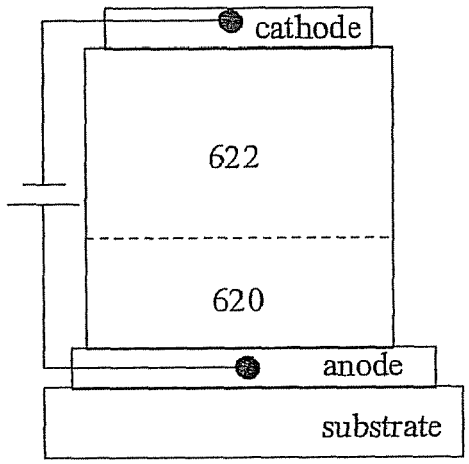

FIG. 11C is an example of a light emitting device in which no mixed region is provided. A first functional region 620 and a second functional region 622 are vapor deposited sequentially and formed by using the system shown in FIGS. 4A and 4B, and then a cathode is formed to complete the light emitting device.

Figure 11D:
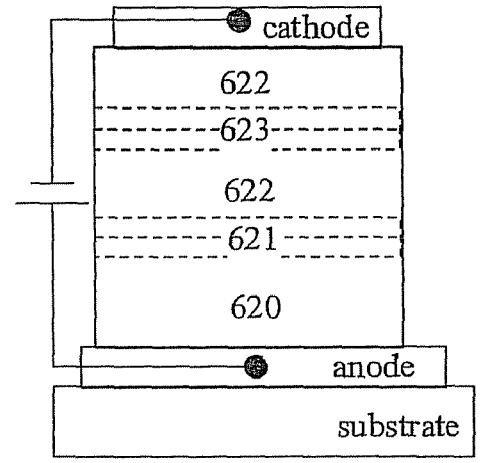

Further, as for another light emitting device having a mixed region, as shown in FIG. 11D, after a first functional region 620 is formed by using a first organic compound, a first mixed region 621 made with the first organic compound and a second organic compound is formed and then, the second functional region 622 is formed by using the second organic compound. Thereafter, in the process of forming the second functional region 622, a third evaporation source holder is temporarily moved to simultaneously vapor deposit a third organic compound, and thereby a second mixed region 623 is formed.

Then, the third evaporation source holder is stopped and the second evaporation source holder is repeatedly moved again to form the second functional region 622. Thereafter, a cathode is formed on the resultant substrate, thereby fabricating a light emitting device.

Since a film containing an organic compound having a plurality of functional regions can be formed in one film formation chamber, a functional region interface is not contaminated by impurities and, also, a mixed region can be formed in a functional region interface. Therefore, a light emitting device having a plurality of functions can be fabricated without having distinct laminated structure (namely, without a distinct organic interface).

Further, when the film formation system which can perform vacuum annealing before, while, or after a film-forming operation is executed is employed, a more fitting intermolecular state in the mixed region can be established by performing vacuum annealing while the film-forming operation is executed. Accordingly, it becomes possible to prevent the drive voltage and luminance from being reduced. Further, impurities, such as oxygen and moisture, in the organic compound layer that has been formed on the substrate are further removed by performing such annealing (evacuation) operation after the film is formed, and thereby the organic compound layer having high density and high purity can be formed.

Further, this embodiment can freely be combined with any one of Embodiment Modes 1 to 4 and Embodiments 1.

Embodiment 3

Figures 12A, 12B:
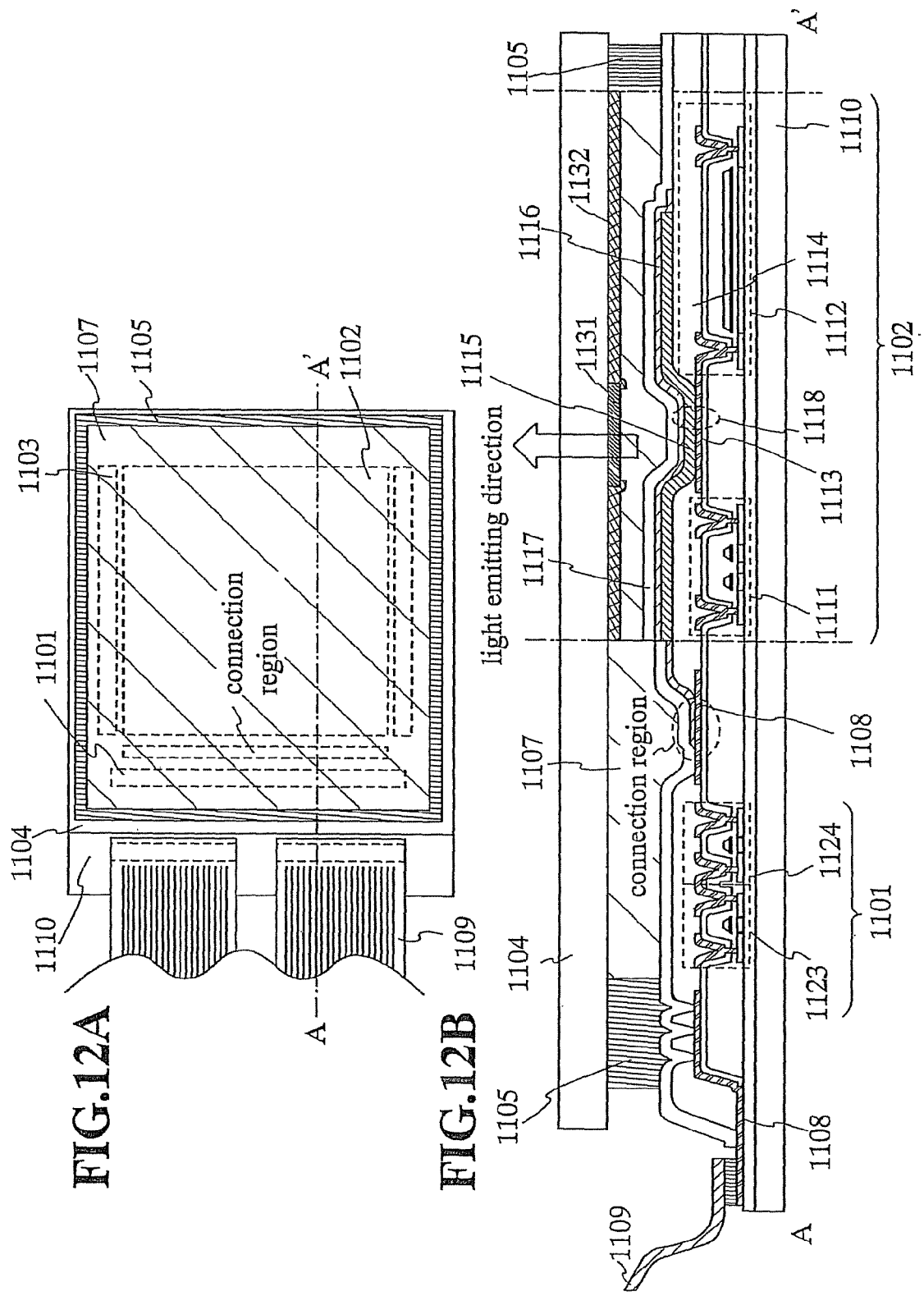
FIGS. 12A and 12B show a light emitting apparatus (Embodiment 3)

In FIG. 12A, shown is an example of fabricating a light emitting apparatus (having an top emission structure) provided on a substrate having an insulating surface with a light emitting device in which an organic compound layer is allowed to be a light emitting layer.

FIG. 12A is a top view of the light emitting apparatus, while FIG. 12B is a cross-sectional view taken along a line A-A' in FIG. 12A. Reference numeral 1101 indicated by a dotted line denotes a source signal line driver circuit; reference numeral 1102 denotes a pixel portion; and reference numeral 1103 denotes a gate signal line driver circuit. Further, reference numeral 1104 denotes a transparent sealed substrate; reference numeral 1105 denotes a first sealing material; and reference numeral 1107 denotes a transparent second sealing material which fills an inside of an area surrounded by the first sealing material 1105. The first sealing material 1105 contains a gap material for securing a space between substrates.

Reference number 1108 denotes a wiring for transmitting a signal to be inputted to the source signal line driver circuit 1101 and the gate signal line driver circuit 1103. The wiring 1108 receives a video signal or a clock signal from a flexible print circuit (FPC) 1109 which becomes an external input terminal. Although only the FPC 1109 is shown, a printed wiring board (PWB) may be attached to the FPC 1109.

Subsequently, a cross sectional structure will be described with reference to FIG. 12B. A driver circuit and a pixel portion are formed on a substrate 1110, but the source signal line driver circuit 1101 as the driver circuit and the pixel portion 1102 are shown in FIG. 12B.

In the source signal line driver circuit 1101, a CMOS circuit in which an n-channel type TFT 1123 and a p-channel type TFT 1124 are combined is formed. The TFT that constitutes the driver circuit may be formed by CMOS circuit, a PMOS circuit or an NMOS circuit that are known in the art. In this embodiment, a driver-integrated type in which the driver circuit is formed on the substrate is shown, but the driver-integrated type may not necessarily be adopted. The driver circuit can also be formed outside instead of being formed on the substrate. A structure of the TFT using a polysilicon film as an active layer is not particularly limited, therefore the structure may be either a structure of a top gate type TFT or a structure of a bottom gate type TFT.

The pixel portion 1102 is formed with a plurality of pixels including a switching TFT 1111, a current-controlling TFT 1112 and a first electrode (anode) 1113 that is electrically connected to a drain of the current-controlling TFT 1112. The current-controlling TFT 1112 may either be an n-channel type TFT or a p-channel type TFT, but when it is connected to the anode, it is preferably the p-channel type TFT. It is also preferable that a storage capacitor (not shown) is appropriately provided. An example in which only a cross-cross sectional structure of one pixel is shown whereupon two TFTs are used in the pixel is illustrated, but three or more TFTs may appropriately be used per pixel.

Since it is constituted such that the first electrode 1113 is directly connected to the drain of the TFT, it is preferable that a lower layer of the first electrode 1113 is allowed to be a material layer which can have an ohmic contact with the drain comprising silicon while an uppermost layer thereof which contacts a layer containing an organic compound is allowed to be a material layer which has a large work function. For example, a three-layer structure made of a titanium nitride film, a film containing aluminum as a primary component, and a titanium nitride film, can have a low resistance of wiring, and a favorable ohmic contact and, also, can function as an anode. Further, as the first electrode 1113, a single layer of a titanium nitride film, a chromium film, a tungsten film, a zinc film, a platinum film or the like, or a laminated layer of three layers or more may be used.

An insulating substance 1114 (referred to as a bank, a partition wall, a barrier, a mound or the like) is formed on each end of the first electrode (anode) 1113. The insulating substance 1114 may be formed by either an organic resin film or an insulating film comprising silicon. In this embodiment, as for the insulating substance 1114, an insulating substance is formed in a shape as shown in FIG. 12B by using a positive type photosensitive acrylic resin film.

For the purpose of enhancing a coverage effect, a curved surface having a curvature is formed in an upper end portion or a lower end portion of the insulating substance 1114. For example, when the positive type photosensitive acrylic resin is used as a material for the insulating substance 1114, it is preferable that a curved surface having a curvature radius (0.2 μm to 3 μm) is provided only to the upper end portion of the insulating substance 1114. As for the insulating substance 1114, either one of a negative type which becomes insoluble to an etchant by photosensitive light, and a positive type which becomes soluble to the etchant by light can be used.

Further, the insulating substance 1114 may be covered with a protective film comprising an aluminum nitride film, an aluminum oxynitride film, a thin film containing carbon as a primary component or a silicon nitride film.

A layer 1115 containing an organic compound is selectively formed on the first electrode (anode) 1113 by a vapor deposition method using a deposition mask or an inkjet method. Further, a second electrode (cathode) 1116 is formed on the layer containing the organic compound 1115. As the cathode, a material having a small work function (for example Al, Ag, Li, Ca, alloys of thereof, that is, MgAg, MgIn, AlLi, CaF2, or CaN) may be used. In this embodiment, a laminated layer of a metal thin film that is thin in thickness and a transparent conductive film (for example, an indium oxide-tin oxide alloy (ITO), an indium oxide-zinc oxide alloy ($In_2O_3$—ZnO), or zinc oxide (ZnO)) is used as the second electrode (cathode) 1116 so that luminescence can pass through the layer. A light emitting device 1118 comprising the first electrode (anode) 1113, the layer containing the organic compound 1115, and the second electrode (cathode) 1116 is thus fabricated. In this embodiment, the light emitting device 1118 is an example of emitting white light whereupon a color filter (for the purpose of simplicity, an overcoat layer is not shown) comprising a colored layer 1131 and a light blocking layer (BM) 1132 is provided.

Further, when layers each containing an organic compound which can obtain R, and B luminescence, respectively, are selectively formed, a full-color display can be obtained without using a color filter.

A transparent protective layer 1117 is formed in order to seal the light emitting device 1118. As for the transparent protective layer 1117, the transparent protective laminated layer shown in Embodiment Mode 1 can be adopted. The transparent protective laminated layer comprises a laminated layer comprising a first inorganic insulating film, a stress relaxation film and a second inorganic insulating film. As the first inorganic insulating films and the second inorganic insulating film, a silicon nitride film, silicon oxide film, a silicon oxynitride film (SiNO film (component ratio: N>O), or SiON film (component ratio: N<O)), or a thin film containing carbon as a primary component (e.g., DLC film, or CN film) which are obtained by a sputtering method or a CVD method can be used. These inorganic insulating films each have a high blocking effect against moisture; however, as film thickness thereof is increased, a film stress is increased, as a result, a partial of the film is easily peeled off or a whole thereof is easily removed. Nevertheless, stress can be relaxed and, also, moisture can be absorbed by sandwiching the stress relaxation film between the first inorganic insulating film and the second inorganic insulating film. Even when a minute hole (pinhole or the like) is formed in the first inorganic insulating film by an undefined reason, the minute hole can be filled by the stress relaxation film and, further, by providing the second inorganic insulating film thereover, an extremely high blocking effect against moisture or oxygen can be attained. As for materials for the stress relaxation film, a material which has smaller stress than the inorganic insulating films and has a hygroscopic property is preferable. Further, it is desired that the material have a translucent property in addition to the above-described-described properties is desirable. Further, as for the stress relaxation film, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino)triphenylamine, and $Alq_3$ (a tris-8-quinolinolate aluminum complex) may be used. These material films each have a hygroscopic property whereupon, when the material films become thin in thickness, they become nearly transparent. Since MgO, $SrO_2$, and SrO each have a hygroscopic property and translucency and can be made into a thin film by a vapor deposition method, any one of these oxides can be used as the stress relaxation film. In this embodiment, using a silicon target, a film formed in an atmosphere containing a nitrogen gas and an argon gas, that is, a silicon nitride film having a high blocking effect against impurities such as moisture and an alkali metal is used as the first inorganic insulating film or the second inorganic insulating film, and a thin film of $Alq_3$ formed by a vapor deposition method is used as the stress relaxation film. Further, in order to allow luminescence to penetrate the transparent protective laminated layer, it is preferable that an entire film thickness of the transparent protective laminated layer is formed as thin as possible.

Further, in order to seal the light emitting device 1118, the sealed substrate 1104 is bonded thereto by using the first sealing material 1105 and the second sealing material 1107 in an inert gas atmosphere. As for the first sealing material 1105 and the second sealing material 1107, it is preferable that an epoxy type resin is used. It is also preferable that the first sealing material 1105 and the second sealing material 1107 be a material which allows moisture or oxygen to penetrate thereinto as little as possible.

Further, in this embodiment, a plastic substrate made of fiberglass-reinforced plastics (FRP), polyvinylfluoride (PVF), Mylar, polyester, an acrylic resin, or the like, in addition to a glass substrate or a quartz substrate can be used as a material which constitutes the sealed substrate 1104. After the sealed substrate 1104 was bonded by using the first sealing material 1105 and the second sealing material 1107, it is possible to perform sealing by a third sealing material so that a side face (exposed face) is covered.

By sealing the light emitting device by the transparent protective layer 1117, the first sealing material 1105, and the second sealing material 1107 in a manner as described above, the light emitting device can thoroughly be shielded from outside, and thereby a substance, such as moisture and oxygen, which deteriorates the organic compound layer can be prevented from entering from outside. Accordingly, a light emitting apparatus having high reliability can be obtained.

Further, as for the first electrode 1113, a both top and bottom emission type light emitting apparatus can be prepared by using a transparent conductive film.

In this embodiment, an example of a structure (hereinafter referred to as "top emission structure") in which a layer containing an organic compound is formed on an anode and a cathode that is a transparent electrode is formed on the layer containing an organic compound, is described above. On the other hand, a structure having a light emitting apparatus (hereinafter referred to as "bottom emission structure") in which a layer containing an organic compound is formed on an anode and a cathode is formed on the organic compound layer and allowing luminescence generated in a layer containing the organic compound to emit from the anode, which is the transparent electrode, toward TFT may also be adopted.

An example of a light emitting apparatus having a bottom emission structure is shown in FIG. 13A and FIG. 13B.

FIG. 13A is a top view of the light emitting apparatus, while FIG. 13B is a cross-sectional view taken along a line A-A' in FIG. 13A. Reference numeral 1201 indicated by a dotted line denotes a source signal line driver circuit; reference numeral 1202 denotes a pixel portion; and reference numeral 1203 denotes a gate signal line driver circuit. Further, reference numeral 1204 denotes a sealed substrate; reference numeral 1205 denotes a sealing material in which a gap material for securing a sealed space is contained; and an inside of an area surrounded by the sealing material 1205 is filled with an inert gas (typically, a nitrogen gas). A trace quantity of moisture present in the space inside the area surrounded by the sealing material 1205 is removed by a desiccant 1207 and, accordingly, the space is sufficiently dry.

Reference number 1208 denotes a wiring for transmitting a signal to be inputted to the source signal line driver circuit 1201 and the gate signal line driver circuit 1203. The wiring 1208 receives a video signal or a clock signal from a flexible print circuit (FPC) 1209 which becomes an external input terminal.

Subsequently, a cross sectional structure will be described with reference to FIG. 13B. A driver circuit and a pixel portion are formed over a substrate 1210, but the pixel portion 1202 and the source signal line driver circuit 1201 as the driver circuit are shown in FIG. 13B. In the source signal line driver circuit 1201, a CMOS circuit in which an n-channel type TFT 1223 and a p-channel type TFT 1224 are combined is formed.

The pixel portion 1202 is formed with a plurality of pixels including a switching TFT 1211, a current-controlling TFT 1212 and a first electrode (anode) 1213, comprising a transparent conductive film, that is electrically connected to a drain of the current-controlling TFT 1212.

In this embodiment, arranged is a structure in which the first electrode 1213 is formed in a manner that a part thereof is overlapped with a connecting electrode and the first electrode 1213 is electrically connected to a drain region of TFT via a connecting electrode. It is preferable that the first electrode 1213 have transparency and comprise an electrically conductive film having a large work function (for example, an indium oxide-tin oxide alloy (ITO), an indium oxide-zinc oxide alloy ($In_2O_3$—ZnO), or zinc oxide (ZnO)).

An insulating substance 1214 (referred to as a bank, a partition wall, a barrier, a mound or the like) is formed on each end of the first electrode (anode) 1213. For the purpose of enhancing a coverage effect, a curved surface having a curvature is formed in an upper end portion or a lower end portion of the insulating substance 1214. Further, the insulating substance 1214 may be covered with a protective film comprising an aluminum nitride film, an aluminum oxynitride film, a thin film containing carbon as a primary component or a silicon nitride film.

A layer containing an organic compound 1215 is selectively formed on the first electrode (anode) 1213 by a vapor deposition method using a deposition mask or an inkjet method. Further, a second electrode (cathode) 1216 is formed on the layer containing the organic compound 1215. As for the cathode, a material having a small work function (for example Al, Ag, Li, Ca, alloys of thereof, that is, MgAg, Men, AlLi, $CaF_2$, or CaN) may be used. In such a manner as described above, a light emitting device 1218 comprising the first electrode (anode) 1213, the layer containing the organic compound 1215, and the second electrode (cathode) 1216 is fabricated. The light emitting device 1218 emits light in a direction which an arrow in FIG. 13A and FIG. 13B indicates. The light emitting device 1218 in this embodiment is one type of light emitting apparatuses which can obtain mono-color luminescence of R, G, or B. Three light emitting devices in which layers containing an organic compound that is capable of obtaining R, G, or B luminescence are selectively formed are made to a full-color light emitting device.

Further, a protective layer 1217 is formed in order to seal the light emitting device 1218. As for the protective layer 1217, the protective laminate shown in Embodiment Mode 2 can be adopted. The protective laminate comprises a laminated layer that includes a first inorganic insulating film, a stress relaxation film and a second inorganic insulating film.

Further, in order to seal the light emitting device 1218, the sealed substrate 1204 is bonded thereto by using the sealing material 1205 in an inert gas atmosphere. A recess portion has previously been formed on the sealed substrate 1204 by a sand-blast method or the like and then, a desiccant 1207 is bonded to the thus-formed recess portion. As for the sealing material 1205, it is preferable that an epoxy type resin is used. It is also preferable that the sealing material 1205 is a material that allows moisture or oxygen to penetrate thereinto as little as possible.

Further, in this embodiment, a plastic substrate made of fiberglass-reinforced plastics (FRP), polyvinyl fluoride (PVF), Mylar, polyester, an acrylic resin or the like, in addition to a metal substrate, a glass substrate or a quartz substrate can be used as a material which constitutes the sealed substrate 1204 having the recess portion. It is also possible to perform sealing by using a metal can in which a desiccant is bonded to the inside thereof.

Further, this embodiment can freely be combined with any one of Embodiment Modes 1 to 4 and Embodiments 1 and 2.

Embodiment 4

In this embodiment, a cross sectional structure of one pixel, particularly states and manners of connections in regard to a light emitting device and a TFT, and a shape of a partition wall to be provided between pixels will be described.

Figure 14A:
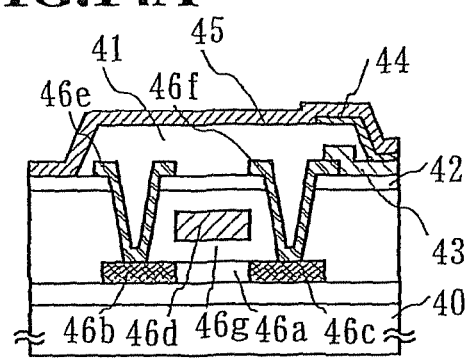
FIGS. 14A to 14F show a connection between a TFT and a first electrode and a shape of a partition wall (Embodiment 4)

In FIG. 14A, reference numeral 40 denotes a substrate, 41 denotes a partition wall (referred to also as "mound"), 42 denotes an insulating film, 43 denotes a first electrode (anode), 44 denotes a layer containing an organic compound, 45 denotes a second electrode (cathode), and 46 denotes a TFT.

In the TFT reference numerals 46, 46a denotes a channel forming region, 46b and 46c each denote a source region or a drain region, 46d denotes a gate electrode, 46e and 46f each denote a source electrode or a drain electrode. Although a top-gate type TFT is described in this embodiment, the TFT is not limited to a particular type and a reverse stagger type TFT or a regular stagger type TFT is permissible. Further, 46f denotes the electrode which is connected with TFT 46 by allowing 46f to be in partial, contact with the first electrode 43 in an overlapping manner.

Figure 14B:
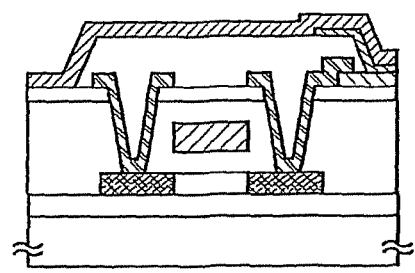

In FIG. 14B, a cross sectional structure which is partially different from that shown in FIG. 14A is shown.

In FIG. 14B, the overlapping manner between the first electrode 43 and the electrode 46f is different from that as shown in FIG. 14A; namely, the first electrode 43 is patterned and, then, the electrode 46f is formed such that it is partially lapped over the thus-patterned first electrode 43 to allow the electrode 46f to be connected with the TFT.

Figure 14C:
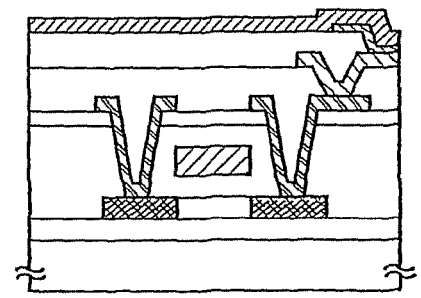

In FIG. 14C, a cross sectional structure which is partially different from that shown in FIG. 14A is shown.

In FIG. 14C, an additional interlayer insulating layer is further provided whereupon the first electrode is connected with the electrode of the TFT via a contact hole.

Figure 14D:
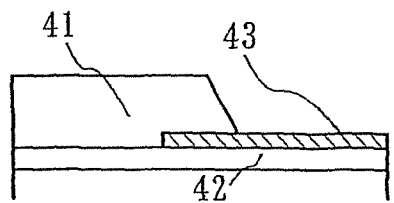

Further, a cross sectional shape of the partition wall 41 may be of a tapered one as shown in FIG. 14D. Such shape can be obtained by first exposing a resist to light by using a photolithography method and, then, etching a non-photosensitive organic resin or an inorganic insulating film.

Figure 14E:
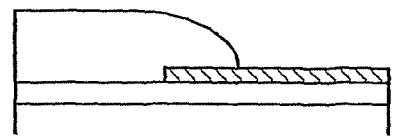

Still further, when a positive-type photosensitive organic resin is used, as shown in FIG. 14E, a shape having a curved surface on a top end thereof can be obtained.

Figure 14F:
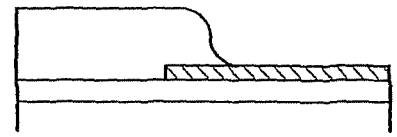

On the contrary, when a negative-type photosensitive resin is used, as shown in FIG. 14F, a shape having a curved surface on each of top and bottom ends thereof can be obtained.

This embodiment can freely be combined with any one of Embodiment Modes 1 to 4 and Embodiments 1 to 3.

Embodiment 5

Various modules (active matrix EL module) can be completed by implementing the present invention. Thus, all electronic appliances in which such modules are incorporated can be completed.

Such electronic appliances are as follows: video cameras, digital cameras, head mounted displays (goggle type displays), car navigation systems, projectors, car stereos, personal computers, portable information terminals (mobile computers, mobile phones or electronic books etc.) etc. Practical examples thereof are shown in FIGS. 15A to 16C.

Figure 15A:
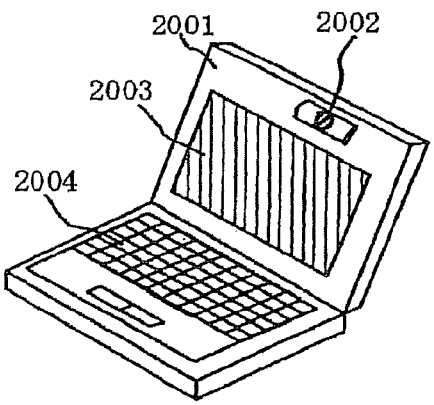
FIGS. 15A to 15E show an example of electric appliances (Embodiment 5)

FIG. 15A is a personal computer which includes a main body 2001, an image input section 2002, a display portion 2003, a keyboard 2004 and the like.

Figure 15B:
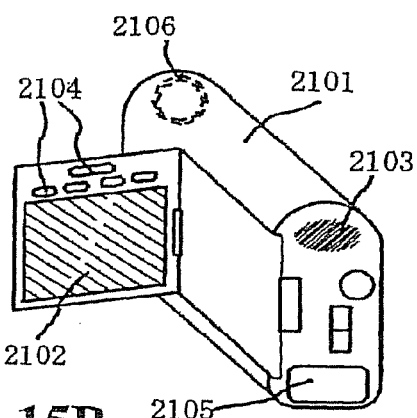

FIG. 15B is a video camera which includes a main body 2101, a display portion 2102, a voice input section 2103, operation switches 2104, a battery 2105, an image receiving section 2106 and the like.

Figure 15C:
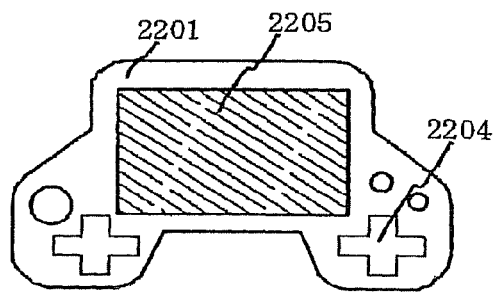

FIG. 15C is a game machine which includes a main body 2201, operation switches 2204, a display portion 2205 and the like.

Figure 15D:
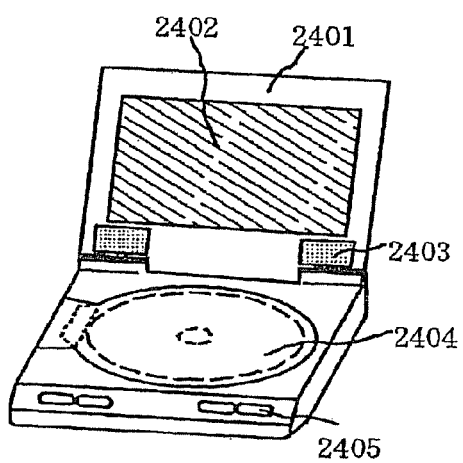

FIG. 15D is a player using a recording medium which records a program (hereinafter, referred to as a recording medium), including a main body 2401, a display portion 2402, a speaker portion 2403, a recording medium 2404, an operation switch 2405 and the like. In addition, the player using a DVD (Digital Versatile Disc), a CD or the like as a recording medium can be used for enjoying music, cinema, game, Internet or the like.

Figure 15E:
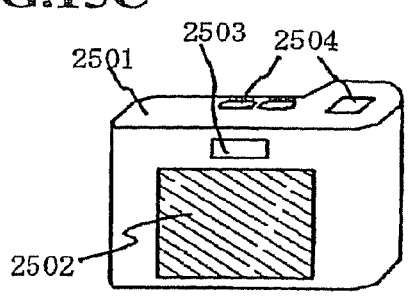

FIG. 15E is a digital camera which includes a main body 2501, a display portion 2502, a view finder 2503, operation switches 2504, and an image receiving section (not shown in the drawing) etc.

Figure 16A:
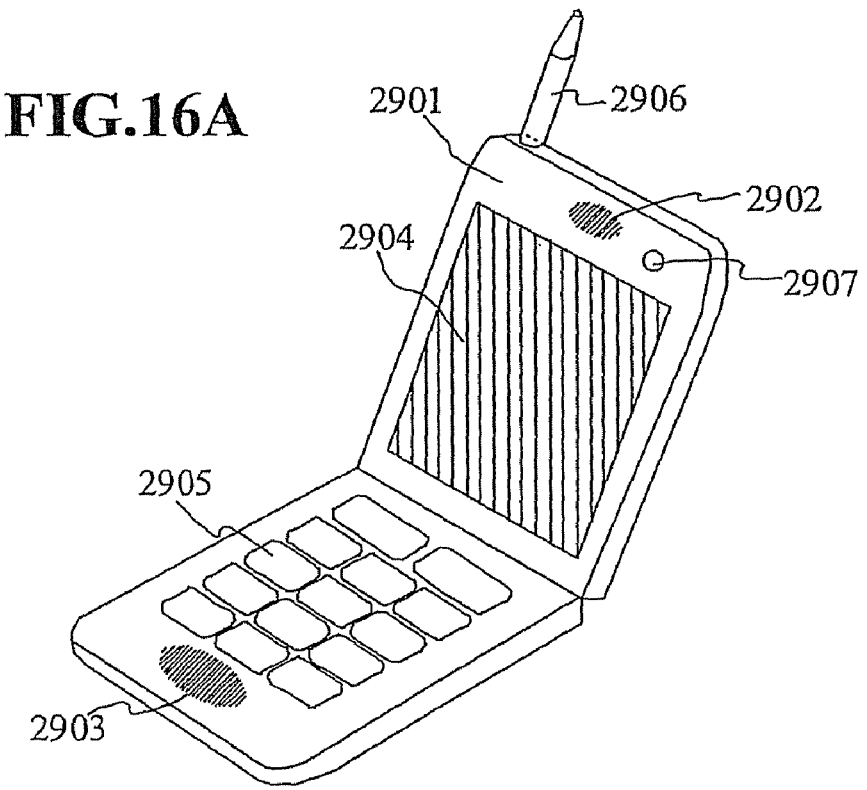
FIGS. 16A to 16C show an example of electric appliances (Embodiment 5)

FIG. 16A is a mobile phone which includes a main body 2901, a voice output section 2902, a voice input section 2903, a display portion 2904, operation switches 2905, an antenna 2906, an image input section (CCD, image sensor, etc.) 2907 and the like.

Figure 16B:
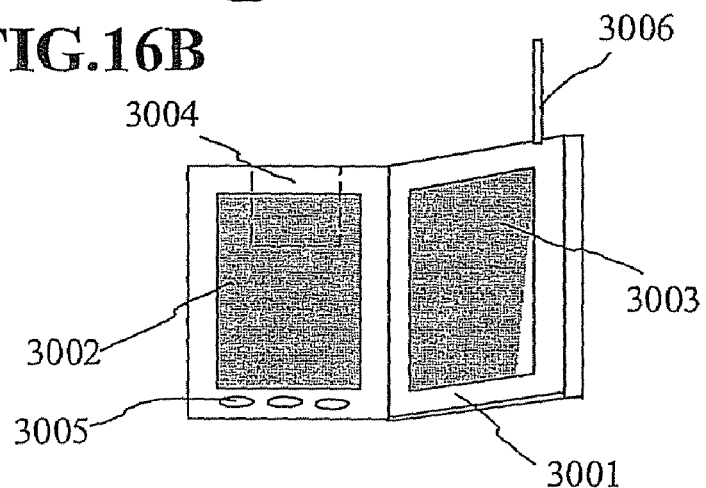

FIG. 16B is a portable book (electronic book) which includes a main body 3001, display portions 3002 and 3003, a recording medium 3004, operation switches 3005, an antenna 3006 and the like.

Figure 16C:
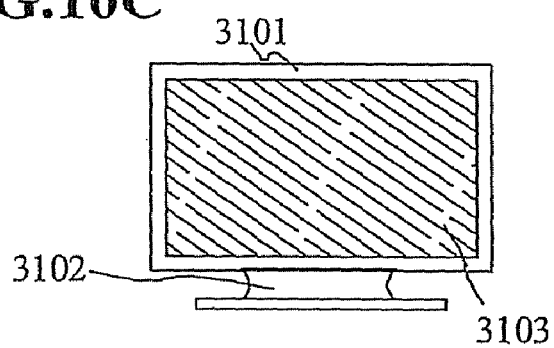

FIG. 16C is a display unit which includes a main body 3101, a supporting portion 3102, a display portion 3103 and the like.

In addition, the display shown in FIG. 16C can have a small, medium or large size display portion, for example a size of 5 to 20 inches. Further, in manufacturing the displays portion with such sizes, it is preferable to use a substrate with one meter on a side to mass-produce display portions.

As described above, the applicable range of the present invention is so wide that the invention can be applied to manufacturing of electronic appliances of various fields. Note that the electronic appliances of this embodiment can be achieved by utilizing any combination of structures in Embodiment Mode 1 to 4 and Embodiment 1 to 4.

Embodiment 6

The electronic appliances represented in Embodiment Mode 5 includes a panel in which light emitting device is sealed, a module in which the panel is provided with IC including a controller and a circuit such as a power source circuit. The module and the panel are both corresponding to one mode of the light emitting apparatus. In the present invention, a specific structure of the module will be described.

FIG. 17A shows an appearance of a module in which a panel 1800 is provided with a controller 1801 and a power source circuit 1802. The panel 1800 is provided with a pixel portion 1803 in which a light emitting device is provided in each pixel, a gate line driver circuit 1804 for selecting a pixel in the pixel portion 1803, and a source line driver circuit 1805 for supplying a video signal to the selected pixel.

The controller 1801 and the power source circuit 1802 are provided in a printed substrate 1806, various kinds of signals and power supply voltage outputted from the controller 1801 or the power source circuit 1802 are supplied via FPC 1807 to the pixel portion 1803, the gate line driver circuit 1804, and the source line driver circuit 1805 in the panel 1800.

The power supply voltage and the various kinds of signals are supplied to the printed circuit 1806 via an interface (I/F) 1808 in which a plurality of input terminals are arranged.

Although the printed substrate 1806 is mounted on the panel 1800 with FPC in this embodiment, the present invention is not limited to this structure. The controller 1801 and the power source circuit 1802 may be provided directly on the panel 1800 with COG (Chip on Class) method.

Further, in the printed circuit 1806, there is a case that a capacitance formed between leading wirings and a resistance of a wiring itself cause a noise to a power supply voltage or a signal, or make a rise of a signal dull. Therefore, various kinds of devices such as a capacitor and a buffer may be provided in order to prevent the noise from being caused to the power supply voltage or a signal and the dull rise of the signal in the printed substrate 1806.

Figure 17B:
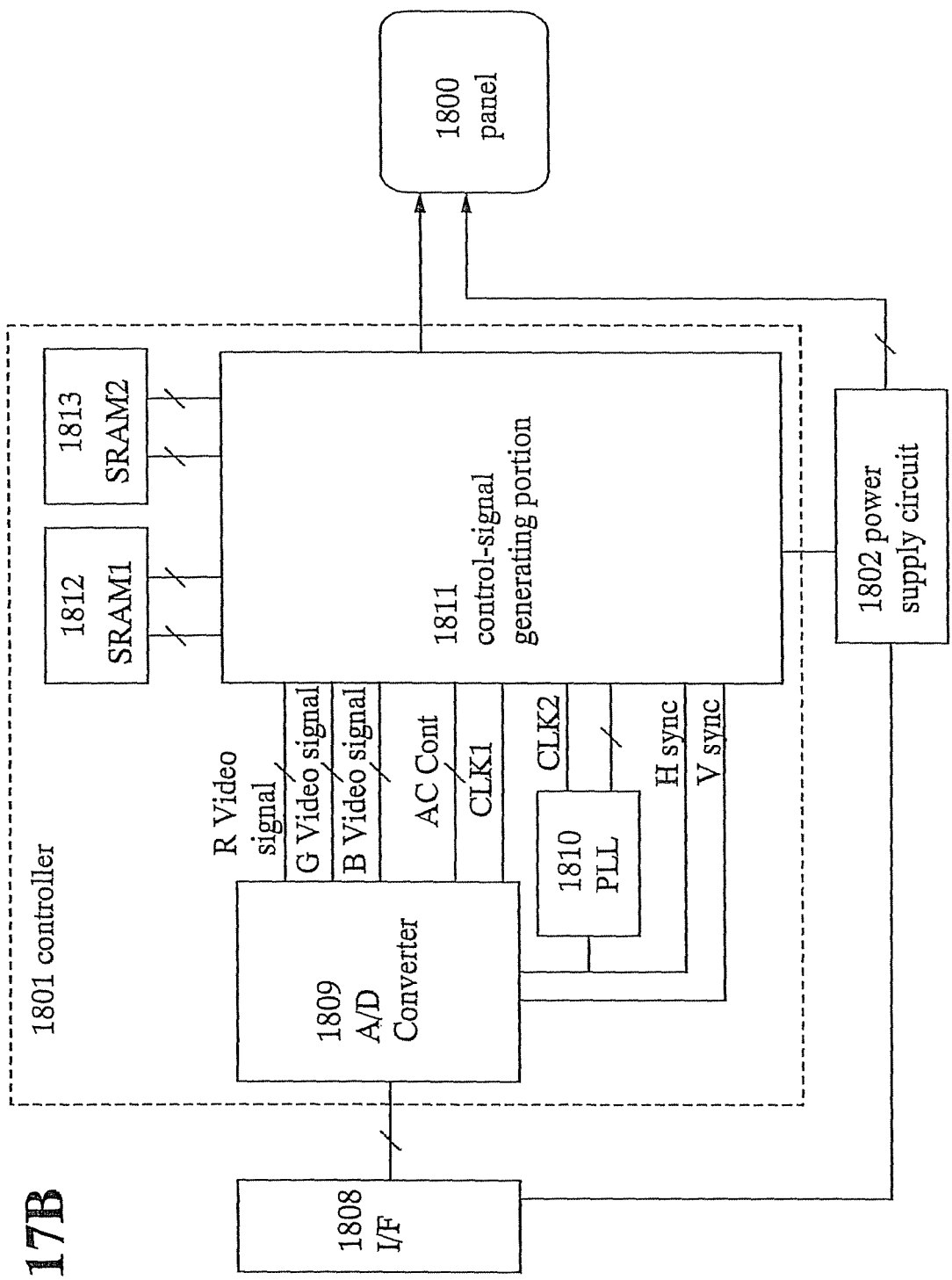

FIG. 17B is a block diagram showing a structure of the printed substrate 1806. Various kinds of signals and power supply voltage supplied to the interface 1808 are supplied to the controller 1801 and the power source circuit 1802.

The controller 1801 has an A/D converter 1809, a phase locked loop (PLL) 1810, control-signal generating portion 1811, and SRAMs (Static Random Access Memory) 1812 and 1813. Although the SRAM is used in this embodiment, instead of the SRAM, SDRAM can be used and DRAM (Dynamic Random Access Memory) can also be used if it is possible to write in and read out data at high speed.

Video signals supplied via the interface 1808 are subjected to a parallel-serial conversion in the A/D converter 1809 to be input into the control-signal generating portion 1811 as video signals corresponding to respective colors of R, G, and B. Further, based on various kinds of signals supplied via the interface 1808, Hsync signal, Vsync signal, clock signal CLK, and volts alternating current (AC cont) are generated in the A/D converter 1809 to be input into the control signal generating portion 1811.

The phase-locked loop 1810 has a function to synchronize the phase of the frequency of each signal supplied through the interface 1808 with the phase of the operating frequency of the control-signal generating portion 1811. The operating frequency of the control-signal generating portion 1811 is not necessarily the same as the frequency of each signal supplied through the interface 1808, but the operating frequency of the control-signal generating portion 1811 and the frequency of each signal supplied through the interface 1808 are adjusted in order to synchronize one another in the phase-locked loop 1810.

The video signal inputted to the control-signal generating portion 1811 is once written into and held on the SRAM 1812, 1813. The control-signal generating portion 1811 reads out the video signals corresponding to all the pixels, one bit by one bit, from among all the bits of video signals held on the SRAM 1812 and supplies them to the source line driver circuit 1805 in the panel 1800.

The control-signal generating portion 1811 supplies the information concerning a period during which the light emitting apparatus of each bit causes light emission, to the scanning-line driver circuit 1804 in the panel 1800.

The power source circuit 1802 supplies a predetermined power supply voltage to the source line driver circuit 1805, scanning-line driver circuit 1804, and pixel portion 1803 in the panel 1800.

Figure 18:
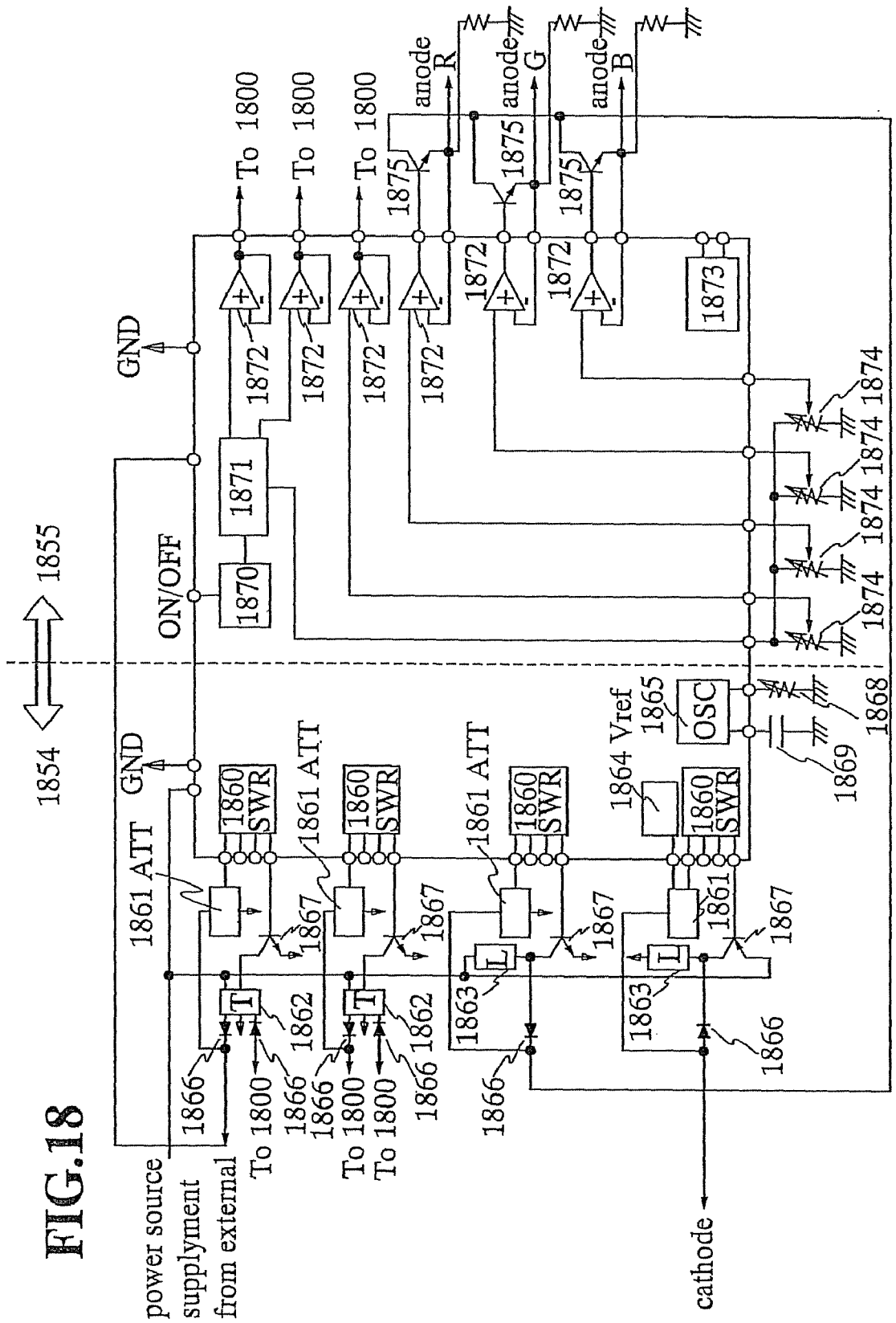
FIG. 18 shows a block diagram (Embodiment 6)

Explanation is now made on the configuration of the power source circuit 1802 with reference to FIG. 18. The power source circuit 1802 of this embodiment comprises a switching regulator 1854 using four switching regulator controls 1860 and a series regulator 1855.

Generally, the switching regulator that is small in size and light in weight as compared to the series regulator can raise voltage and invert polarities besides voltage reduction. On the other hand, the series regulator that is used only in voltage reduction has well output voltage accuracy as compared to the switching regulator, hardly causing ripples or noises. The power source circuit 1802 of this embodiment mode uses a combination of the both.

The switching regulator 1854 shown in FIG. 18 has a switching regulator control (SWR) 1860, an attenuator (ATT) 1861, a transformer (T) 1862, an inductor (L) 1863, a reference power supply (Vref) 1864, an oscillator circuit (OSC) 1865, a diode 1866, a bipolar transistor 1867, a varistor 1868 and a capacitor 1869.

When a voltage of an external Li-ion battery (3.6 V) or the like is transformed in the switching regulator 1854, generated are a power supply voltage to be supplied to a cathode and a power supply voltage to be supplied to the switching regulator 1854.

The series regulator 1855 has a band-gap circuit (BG) 1870, an amplifier 1871, operational amplifiers 1872, a current source 1873, a varistor 1874 and a bipolar transistor 1875, and is supplied with a power supply voltage generated at the switching regulator 1854.

In the series regulator 1855, a power supply voltage generated by the switching regulator 1854 is used to generate a direct current power supply voltage to be supplied to a wiring (current supply line) for supplying current to the anodes of various-color of light emitting devices according to a constant voltage generated by the band-gap circuit 1870.

Incidentally, the current source 1873 is used for a drive method to write video signal current to a pixel. In this case, the current generated by the current source 1873 is supplied to the source line driver circuit 1805 in the panel 1800. In the case of a drive method to write the video signal voltage to a pixel, the current source 1873 is not always required.

A switching regulator, an OSC, an amplifier and an operation amplifier are formed using TFT.

The structure of this embodiment may be freely combined with any of the structures of Embodiment Mode 1 to 4 and Embodiment 1 to 5.

Embodiment 7

In this embodiment, an example in which an evaporation source holder is moved perpendicular or in parallel to a side of a substrate while allowing a longitudinal direction and a movement direction of the evaporation source holder to be same with each other will be described with reference to FIGS. 19A and 19B.

Figure 19A:
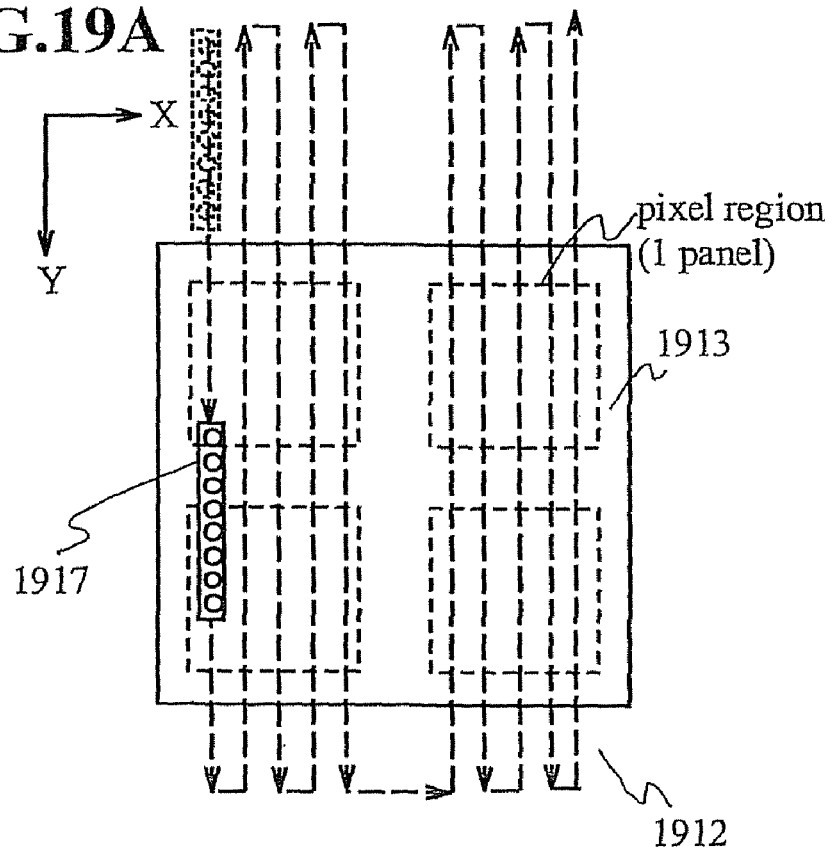
FIGS. 19A and 19B show a movement direction of an evaporation source holder (Embodiment 7)

In FIG. 19A, reference numeral 1912 denotes a holder moving path, reference numeral 1913 denotes a large-size substrate, and reference numeral 1917 denotes an evaporation source holder. By allowing the longitudinal direction and the moving direction of the evaporation source holder to be same with each other, regions (in stripes) to be vapor-deposited are finely overlapped with each other to aim for a uniform film thickness on an entire substrate. A vapor deposition method as shown in FIG. 19A is appropriate to a case in which a same material is prepared in all containers and a large film thickness is obtained in a short period of time.

Figure 19B:
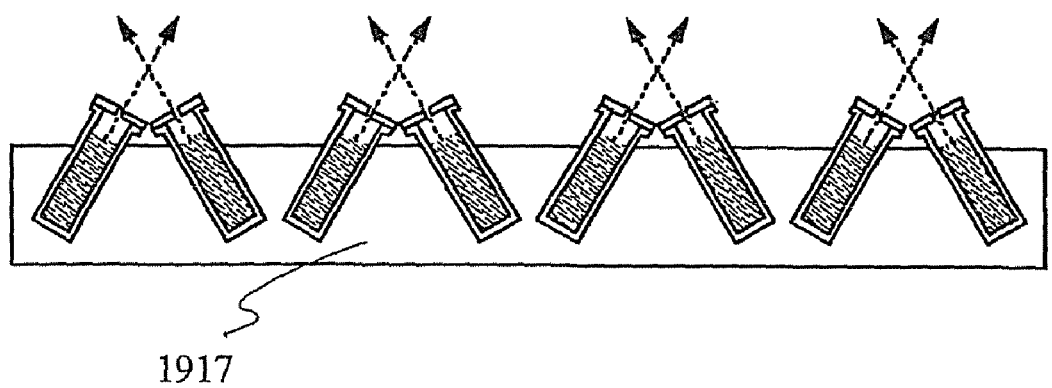

Further, an even number of crucibles is prepared and, as shown in FIG. 19B as an example, an evaporation material may be aimed for becoming fine particles by abutting with each other such that each center of the evaporation source holder 1917 is crossed over. On this occasion, a point in which such crossover is performed is situated in a space between a mask (and a substrate) and the container.

This embodiment can freely be combined with any one of Embodiment Modes 1 to 3 and Embodiments 1 to 5.

Embodiment 8

Figure 20A:
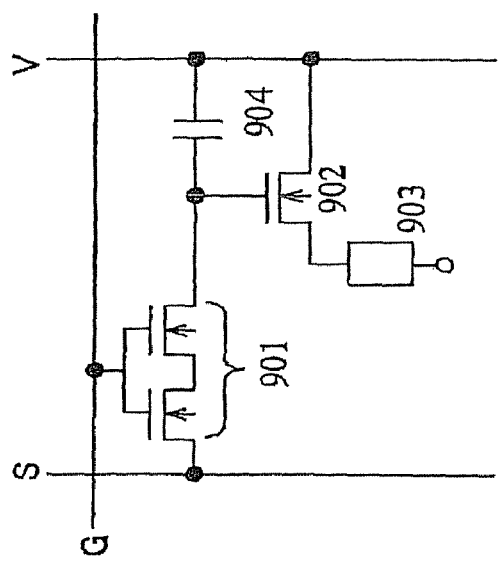
FIGS. 20A and 20B show a circuit diagram of a pixel and a cross sectional view of a light emitting apparatus, respectively (Embodiment 8).
Figure 20B:
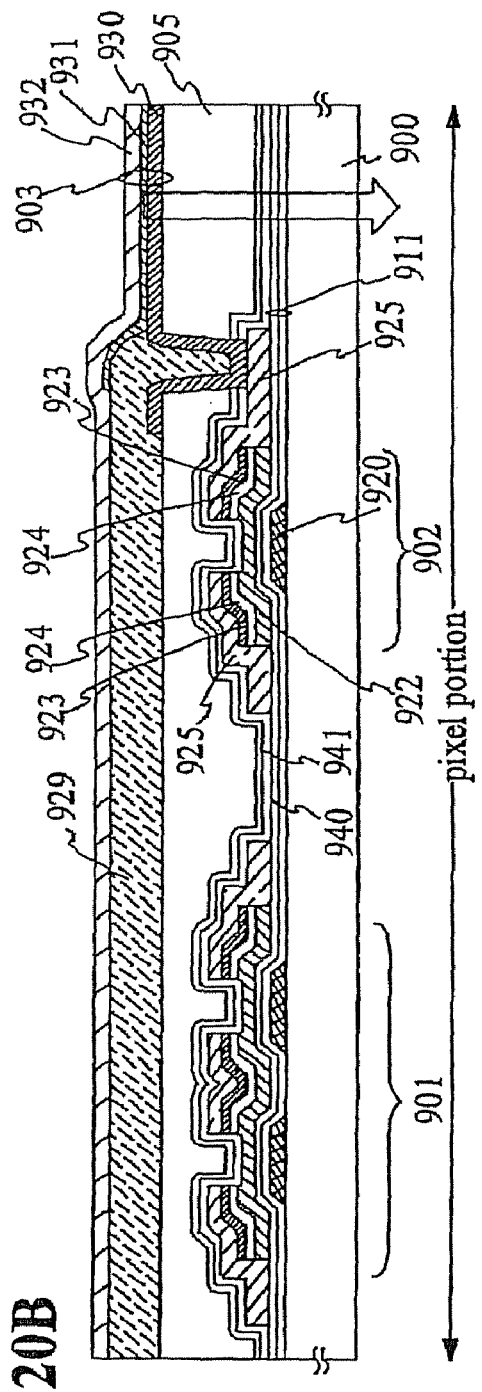

FIG. 20A shows an embodiment mode of a circuit diagram of a pixel while FIG. 20B shows a cross sectional diagram of a TFT to be used in a pixel portion. Reference numeral 901 corresponds to a switching TFT for controlling an input of a video signal to a pixel while 902 corresponds to a driving TFT for controlling a supply of electric current to alight emitting device 903. Concretely, a drain electric current of the driving TFT 902 is controlled in accordance with a potential of the video signal inputted in the pixel via the switching TFT 901 whereupon the drain electric current is supplied to the light emitting device 903. Reference numeral 904 corresponds to a capacitor element (hereinafter referred to also as "capacitor") for holding a gate-source voltage (hereinafter referred to also as "gate voltage") of the driving TFT at the time when the switching TFT 901 is in a turning-off state; however, the capacitor element 904 is not necessarily provided.

In FIG. 20A, specifically, a gate electrode of the switching TFT 901 is connected with a scanning line G, and one of the source region and the drain region is connected with a signal line S while the other is connected with a gate of the driving TFT 902. One of the source region and the drain region of the driving TFT 902 is connected with a power supply line V while the other is connected with a pixel electrode 905 of the light emitting device 903. One of two electrodes of the capacitor element 904 is connected with a gate electrode of the driving TFT 902 while the other is connected with the power supply line V.

In FIGS. 20A and 20B, formed is a multi-gate structure in which the switching TFT 901 is serially connected and a plurality of TFTs connected with the gate electrode share a first semiconductor film thereamong. By the multi-gate structure, an electric current of the switching TFT 901 in a turning-off state can be reduced. Concretely, in FIGS. 20A and 20B, although the switching TFT 901 has a structure in which two TFTs are serially connected, a multi-gate structure in which three or more of TFTs are serially connected and, further, the gate electrode is connected is also permissible. The switching TFT is not necessarily of a multi-gate structure and may be a TFT having an ordinary single-gate structure in which the gate electrode and the channel forming region are each in a singular number.

Tufts 901 and 902 are of a reverse stagger type (hereinafter referred to also as "bottom-gate type). An active layer of the TFT employs an amorphous semiconductor or a semi-amorphous semiconductor. When the active layer of the TFT is allowed to be the semi-amorphous semiconductor, not only a pixel portion but also the driver circuit can be formed on a same substrate and, since an n type is higher in mobility than a p type, the n type is appropriate for the driver circuit; however, each TFT may either be of n type or p type. Even when the TFT having either one of such polarities is employed, it is desirable that all of the TFTs formed on a same substrate have a same polarity in order to suppress production steps to a small number.

The driving TFT 902 of the pixel portion comprises a gate electrode 920 formed on a substrate 900, a gate insulating film 911 covering the gate electrode 920, and a first semiconductor film 922 formed by a semi-amorphous semiconductor film and lapped over the gate electrode 920 with the gate insulating film 911 sandwiched therebetween. The driving TFT 902 further comprises a pair of second semiconductor films 923 functioning as a source region or a drain region, and a third semiconductor film 924 provided between the first semiconductor film 922 and the second semiconductor film 923.

The second semiconductor film 923 is formed by an amorphous semiconductor film or a semi-amorphous semiconductor film and is added with an impurity which imparts the semiconductor film with one conductivity type. A pair of second semiconductor films 923 is provided on opposite sides of a channel forming region of the first semiconductor film 922 such that they face each other.

The third semiconductor film 924 is formed by an amorphous semiconductor film or a semi-amorphous semiconductor film, has a same conductivity type as that of the second semiconductor film 923 and has a property that electric conductivity thereof is lower than that of the second semiconductor film 923. Since the third semiconductor film 924 functions as an LDD region, it diffuses an electric field which concentrates on an end portion of the second semiconductor film 923 which functions as the drain region whereupon a hot-carrier effect can be prevented. Although the third semiconductor film 924 is not necessarily provided, such provision thereof enhances pressure resistance and reliability of the TFT. Further, when the driving TFT 902 is of an n type, an n-type conductivity type can be obtained without particularly adding the impurity which imparts the n-type at the time when the third semiconductor film 924 is formed. Therefore, when the TFT 902 is of the n type, the impurity of n type is not necessarily added to the third semiconductor film 924. However, an impurity which imparts electric conductivity of a p type is added to the first semiconductor film on which a channel is formed to control the conductivity type thereof so as to be as near to a I type as possible.

A wiring 925 is formed such that it is in contact with a pair of the third semiconductor films 924.

Further, a first passivation film 940 and a second passivation film 941 each comprising an insulating film are formed such that they cover the TFTs 901 and 902, and the wiring 925. Such passivation films which cover the TFTs 901 and 902 are not limited to a structure made of two layers and may either have a structure made of a monolayer or three or more layers. For example, the first passivation film 940 can be formed by using silicon nitride while the second passivation film 941 can be formed by using silicon oxynitride. By forming such passivation film by using silicon nitride or silicon oxynitride, the TFTs 901 and 902 can be prevented from being deteriorated by an influence of moisture or oxygen.

TFTs 901 and 902 and the wiring 925 are covered by a flat interlayer insulating film 905. As for the flat interlayer insulating film 905, a film which has been prepared by performing a flattening treatment on an insulating film by means of a PCVD method, or a SiOx film having an alkyl group which has been prepared by using a siloxane-type polymer by means of a coating method may be used.

Thereafter, a contact hole which reaches the wiring 925 is formed and, then, a pixel electrode 930 which is electrically connected with one end of the wiring 925 is formed.

Subsequently, an insulating substance 929 (hereinafter referred to also as "bank", "partition wall", "barrier", or "mound") which covers an end portion of the pixel electrode 930 is formed. As for the insulating substance 929, an inorganic material (for example, silicon oxide, silicon nitride, or silicon oxide nitride), a photosensitive or non-photosensitive organic material (for example, polyimide, acrylic compound, polyamide, polyimidoamide, resist, or benzocyclobutene), a laminate thereof, or the like can be used. On this occasion, the photosensitive organic resin covered with a silicon nitride film is used. For example, when a positive-type photosensitive acrylic compound is used as an organic resin material, it is preferable to allow only a top end of the insulating substance to have a curved surface having a curvature radius. As for the insulating substance, any one of a negative type which becomes insoluble to an etchant by a photosensitive light and a positive type which becomes soluble to the etchant by a light can be used. Further, a SiOx film having an alkyl group which can be obtained by using a cyclohexane-type polymer by means of a coating method may be applied also to the insulating substance 929.

Thereafter, an electric field light emitting layer 931 is formed such that it lies on top of the pixel electrode 930 of the light emitting device 903. The electric field light emitting layer 931 has a laminate structure in which at least one layer is selectively formed by using a vapor deposition system as shown in FIG. 1. By using the vapor deposition system (an example thereof being shown in FIG. 1) appropriate for a mass-production steps while using a large-area substrate, waste of the evaporation material is suppressed, thereby allowing an overall production cost of the light emitting device to be reduced.

Thereafter, a counter electrode 932 is formed such that it is in contact with the electric field light emitting layer 931. The light emitting device 903 comprises a cathode and an anode whereupon one of them is used as a pixel electrode while the other one is used as a counter electrode.

When a vapor deposition system is used as the pixel electrode 930, light emitted from the electric field light emitting layer 931 passes through the substrate 900 and emerges therefrom in a direction of an arrow as shown in FIG. 20B.

In this embodiment, since the third semiconductor film comprising a channel forming region is formed by using the semi-amorphous semiconductor, the TFT having a higher mobility than the TFT which uses an amorphous semiconductor film can be obtained; hence, the driver circuit and the pixel portion can be formed on a same substrate.

This embodiment can freely be combined with Embodiment mode 1 or Embodiment 5.

The present invention can provide a fabrication system by which a container in which a evaporation material is filled in a sealed manner or a film thickness monitor can transported from an installation chamber connected to a vapor deposition system without being exposed to air. According to the present invention, evaporation materials are treated more easily and mixing of impurities into the evaporation materials can be prevented. By using such fabrication system, it is possible to install a container that is sealed by a material manufacturer inside a vapor deposition system without exposing it to air, and thus, adhesion of moisture or oxygen to evaporation materials can be prevented. This can provide much higher degree of purity for a light emitting device from here on.

When an amorphous semiconductor film or semi amorphous semiconductor film is used as an active layer of a TFT, a uniform film thickness can be obtained on a whole face of a large area substrate. Manufacturing cost of a light emitting apparatus can be reduced and, at the same time, a vapor deposition system in which loss of evaporation material is reduced can be provided.

What is claimed is:

1. A manufacturing method for a light emitting device comprising steps of:
    forming a first electrode over a substrate;
    forming a film containing an organic compound over the first electrode in a film formation chamber by relatively moving an evaporation source holder provided with the organic compound in a longitudinal direction of the evaporation source holder; and
    forming a second electrode over the film containing the organic compound,
    wherein the evaporation source holder contains a plurality of containers being arranged in the longitudinal direction of the evaporation source holder, and
    wherein in the evaporation source holder, evaporation centers of the containers are tilted.

2. The manufacturing method for a light emitting device according to claim 1, further comprising a step of cleaning a mask in the film formation chamber by generating plasma in the film formation chamber.

3. The manufacturing method for a light emitting device according to claim 1, further comprising a step of cleaning the whole film formation chamber by generating plasma in the film formation chamber.

4. The manufacturing method for a light emitting device according to claim 1, wherein in the evaporation source holder, the evaporation centers of adjacent two containers are crossed each other.

5. A manufacturing method for a light emitting device comprising the steps of:
    forming a first electrode over a substrate;
    forming a film containing an organic compound over the first electrode in a film formation chamber by moving an evaporation source holder provided with the organic compound perpendicular to or in parallel to a side of the substrate, wherein a movement direction of the evaporation source holder is a same as a longitudinal direction of the evaporation source holder;
    forming a second electrode over the film containing the organic compound,
    wherein the evaporation source holder contains a plurality of containers being arranged in the longitudinal direction of the evaporation source holder, and
    wherein in the evaporation source holder, evaporation centers of the containers are tilted.

6. The manufacturing method for a light emitting device according to claim 5, further comprising a step of cleaning a mask in the film formation chamber by generating plasma in the film formation chamber.

7. The manufacturing method for a light emitting device according to claim 5, further comprising a step of cleaning the whole film formation chamber by generating plasma in the film formation chamber.

8. The manufacturing method for a light emitting device according to claim 5, wherein in the evaporation source holder, the evaporation centers of adjacent two containers are crossed each other.

9. A manufacturing method for a light emitting device comprising the steps of:
    forming a semiconductor film over a substrate having an insulating surface;
    irradiating the semiconductor film with a laser beam from a laser by relatively moving at least one of the substrate and the laser beam in a first direction;
    forming a thin film transistor comprising an irradiated semiconductor film;
    forming a first electrode electrically connected to the thin film transistor;
    forming a film containing an organic compound over the first electrode in a film formation chamber by relatively moving an evaporation source holder provided with the organic compound in a second direction different from the first direction; and
    forming a second electrode over the film containing the organic compound,
    wherein the evaporation source holder contains a plurality of containers being arranged in the second direction of the evaporation source holder, and
    wherein in the evaporation source holder, evaporation centers of the containers are tilted.

10. The manufacturing method for a light emitting device according to claim 9, further comprising a step of cleaning a mask in the film formation chamber by generating plasma in the film formation chamber.

11. The manufacturing method for a light emitting device according to claim 9, further comprising a step of cleaning the whole film formation chamber by generating plasma in the film formation chamber.

12. The manufacturing method for a light emitting device according to claim 9, wherein in the evaporation source holder, the evaporation centers of adjacent two containers are crossed each other.

13. The manufacturing method for a light emitting device according to claim 9, wherein an angle between the first direction and the second direction is in a range from more than 0 degree to less than 90 degrees.

14. The manufacturing method for a light emitting device according to claim 9, wherein the laser is one of a continuously oscillating laser and a pulse oscillation laser, and the laser is one or more kinds of members selected from the group consisting of YAG laser, $YVO_4$ laser, YLF laser, $YAlO_3$ laser, $Y_2O_3$ laser, glass laser, ruby laser, alexandrite laser, and Ti: sapphire laser.

15. The manufacturing method for a light emitting device according to claim 9, wherein the laser is one of a continuously oscillating laser and a pulse oscillation laser, and the laser is one or more kinds of members selected from the group consisting of excimer laser, Ar laser, and Kr laser.

* * * * *